United States Patent
Komori et al.

(10) Patent No.: US 8,710,475 B2
(45) Date of Patent: Apr. 29, 2014

(54) EXTREME ULTRAVIOLET LIGHT SOURCE DEVICE AND METHOD FOR GENERATING EXTREME ULTRAVIOLET LIGHT

(71) Applicant: Gigaphoton Inc., Oyama (JP)

(72) Inventors: Hiroshi Komori, Hiratsuka (JP); Tatsuya Yanagida, Hiratsuka (JP); Yoshifumi Ueno, Hiratsuka (JP); Akira Sumitani, Isehara (JP); Akira Endo, Tokyo (JP); Tsukasa Hori, Kanagawa (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/846,852

(22) Filed: Mar. 18, 2013

(65) Prior Publication Data

US 2013/0284949 A1    Oct. 31, 2013

Related U.S. Application Data

(62) Division of application No. 12/547,896, filed on Aug. 26, 2009, now Pat. No. 8,471,226.

(30) Foreign Application Priority Data

Aug. 29, 2008  (JP) ................................ 2008-221613
Aug. 24, 2009  (JP) ................................ 2009-193601

(51) Int. Cl.
  *A61N 5/06*    (2006.01)
(52) U.S. Cl.
  USPC .................................. 250/504 R; 250/492.1
(58) Field of Classification Search
  USPC ......... 250/504 R, 492.1, 492.3, 493.1, 494.1, 250/495.1
  See application file for complete search history.

(56) References Cited

U.S. PATENT DOCUMENTS

| | | | |
|---|---|---|---|
| 6,973,164 B2 * | 12/2005 | Hartlove et al. | ............... 378/119 |
| 6,987,279 B2 | 1/2006 | Hoshino et al. | |
| 6,987,830 B2 | 1/2006 | Kasumi | |
| 7,067,832 B2 | 6/2006 | Mizoguchi et al. | |

(Continued)

FOREIGN PATENT DOCUMENTS

| | | |
|---|---|---|
| JP | 2003-257698 A | 9/2003 |
| JP | 2004-047517 A | 2/2004 |
| JP | 2004-531861 A | 10/2004 |
| JP | 2007-207574 A | 8/2007 |

OTHER PUBLICATIONS

Stanley Humphries, Jr., "Principles of Charged Particle Acceleration", 1986, pp. 282-313, 493, John Wiley & Sons.

(Continued)

*Primary Examiner* — Thuy Vinh Tran
(74) *Attorney, Agent, or Firm* — McDermott Will & Emery LLP

(57) ABSTRACT

An EUV (Extreme Ultra Violet) light source device ionizes a target material in an ionizer, and supplies the ionized target material to a point of generating a plasma. This reduces the generation of debris. The ionizer simultaneously irradiates laser beams of plural wavelengths corresponding to the excited level of tin on a target material to ionize the target material. The ionized target material is extracted from the ionizer with a high voltage applied from an ion beam extractor, and accelerated and supplied to a plasma generation chamber. When driver laser beam is irradiated on the ionized target material, a plasma is generated, thereby emitting EUV radiation.

9 Claims, 45 Drawing Sheets

(56) References Cited

U.S. PATENT DOCUMENTS

| | | |
|---|---|---|
| 7,110,504 B2 | 9/2006 | Kasumi |
| 7,271,401 B2 | 9/2007 | Imai et al. |
| 7,339,181 B2 | 3/2008 | Taylor et al. |
| 7,626,188 B2 | 12/2009 | Shirai et al. |
| 7,732,794 B2 * | 6/2010 | Abe et al. ............ 250/504 R |
| 7,928,417 B2 * | 4/2011 | Ershov et al. ......... 250/504 R |
| 2004/0004701 A1 | 1/2004 | Kasumi |
| 2005/0207527 A1 | 9/2005 | Kasumi |
| 2006/0017023 A1 | 1/2006 | Taylor et al. |
| 2007/0278429 A9 | 12/2007 | Taylor et al. |

OTHER PUBLICATIONS

Japanese Notice of Reasons for Rejection, w/ English translation thereof, issued in Japanese Patent Application No. JP 2009-193601 dated Aug. 23, 2013.

* cited by examiner

US 8,710,475 B2

EXTREME ULTRAVIOLET LIGHT SOURCE DEVICE AND METHOD FOR GENERATING EXTREME ULTRAVIOLET LIGHT

RELATED APPLICATIONS

This application is a Divisional of U.S. application Ser. No. 12/547,896, filed on Aug. 16, 2009, which is now U.S. Pat. No. 8,471,226, which in turn claims the benefit of Japanese Application Nos. 2009-193601 filed on Aug. 24, 2009 and 2008-221613 filed on Aug. 29, 2008, the disclosures of which Applications are incorporated by reference herein.

BACKGROUND OF THE INVENTION

The present invention relates to an extreme ultraviolet light source device and a method for generating extreme ultra violet.

For example, a semiconductor chip may be created by reduction projection of a mask on which a circuit pattern is drawn onto a wafer having a resist applied thereon, and by repeatedly performing processing, such as etching and of thin film formation. The progressive reduction of the scale of semiconductor processing demands the use of radiation of further short wavelength.

Thus, research is being made on a semiconductor exposure technique which uses radiation of extremely short wavelength of 13.5 nm or so and a reduction optics system. This type of technique is termed EUVL (Extreme Ultra Violet Lithography: exposure using extreme ultra violet light). Hereinafter, extreme ultraviolet light will be abbreviated as "EUV light".

Three types of EUV light sources are known: an LPP (Laser Produced Plasma: plasma produced by a laser) type light source, a DPP (Discharge Produced Plasma) type light source, and an SR (Synchrotron Radiation) type light source. The LPP type light source is a light source which generates a plasma by irradiating laser beam on a target material, and employs EUV radiation emitted from this plasma. The DPP type light source is a light source which employs a plasma generated by an electrical discharge. The SR (synchrotron radiation) is a light source which uses orbital radiation. Of those three types of light sources, the LPP type light source is more likely to obtain high-output EUV radiation as compared to the other two types because the LPP type light source can provide an increased plasma density, and can ensure a larger solid angle over which the radiation is collected.

Since EUV radiation has a very short wavelength and can easily be absorbed by a matter, the EUVL uses a reflection type optical system. Such a reflection type optical system is built by employing a multilayer film in which, for example, molybdenum (Mo) and silicon (Si) are used. Since an Mo/Si multilayer film has a high reflectivity of near 13.5 nm, EUV radiation of a wavelength of 13.5 nm is used in the EUVL.

Since the reflectivity of the multilayer film is around 70%, however, the output gradually decreases as the reflection is repeated. Since the EUV radiation is reflected more than ten times within the exposure device, it is necessary for the EUV light source device to supply high-output EUV radiation to the exposure device. It is therefore expected that the use of an LPP type light source as an EUV light source device will become more popular (see JP-A-2006-80255).

LPP type EUV light source devices use tin (Sn), xenon (Xe), lithium (Li) or the like as a target material, and irradiate laser beam thereon. Particularly, an LPP type light source that uses a combination of tin droplets, which is a liquid metal, and a carbon dioxide ($CO_2$) pulsed laser is promising for this light source because it can reduce the masses of the targets and have a relatively high emission efficiency of EUV radiation as compared with the other LPP type light sources.

To obtain a high EUV radiation emission efficiency, the density of a target needs to be set to about $10^{17}/cm^3$ to $10^{18}/cm^3$. The density of solid or liquid tin is however $4\times10^{22}$ or so which is higher than the optimal density. It is not therefore possible to efficiently obtain EUV radiation through a single irradiation of laser beam. In this respect, there has been proposed a technique of adjusting the density of a tin target by irradiating laser beam on the tin target two times (see the specification of USP-A-2006/0255298 and the pamphlet of WO2003/096764). In this technique, a heating pulsed laser beam is irradiated on a tin target to diffuse the tin target and reduce the density thereof. Then, a main pulsed laser beam is irradiated on the tin target to turn into plasma the target, thereby efficiently generating EUV radiation.

See "Principles of Charged Particle Acceleration written by Stanley Humphries, Jr. (published by John Wiley & Sons, Inc.) too.

According to the related art, a target material is supplied in the form of droplets with a diameter of, for example, several tens of μm. However, only 1/10 of the total mass of the droplets or less actually becomes a plasma which contributes to generation of EUV radiation, while the remainder mass becomes minute particles called debris. It is a problem of the related art that the debris damages an EUV collector mirror, thereby reducing the EUV radiation output.

An EUV collector mirror, which collects EUV radiation radiated from a plasma and supplies the laser beam to the exposure device, is provided in the vicinity of the point of generating the plasma. As the debris which is electrically neutral is diffused to the EUV collector mirror, the life and reflectivity of the EUV collector mirror are reduced. For example, fast debris collides against the top surface of the EUV collector mirror, damaging the EUV collector mirror. Middle speed debris is deposited on the top surface of the EUV collector mirror, lowering the reflectivity of the EUV collector mirror.

When a metal material like tin is used as a target material, therefore, a large quantity of electrically neutral debris is produced, which significantly shortens the lifetime of the EUV collector mirror or the like. Because most of debris is electrically neutral, it is difficult to control the behavior of the debris with electromagnetic force. Accordingly, the related art does not efficiently restrain the diffusion of debris to the EUV collector mirror. When the EUV light source device is operated, therefore, the debris damages the EUV collector mirror, thus making it necessary to frequently perform a work of replacing the EUV collector mirror or the like. As a result, the operation rate of the EUV light source device drops.

Meanwhile, the related art that irradiates laser beam twice can obtain EUV light with a little higher conversion efficiency. This related art is not much different in that a wasteful material which does not contribute to a plasma is supplied into the plasma generation chamber, thereby generating electrically neutral debris.

SUMMARY OF THE INVENTION

Accordingly, the present invention addresses the above-identified problems associated with the related arts, and it is an object of the invention to provide an extreme ultraviolet light source device and a method for generating extreme ultra violet light, which can restrain uncontrollable debris from being generated in a plasma generation chamber for generating a plasma by ionizing a target material and supplying the ionized target material to an area where the plasma is to be generated. It is another object of the invention to provide an extreme ultraviolet light source device and a method for generating extreme ultra violet light, which can restrain electrically neutral debris from being generated in a plasma generation chamber by generating an ionized target material at a place apart from the plasma generation chamber and supplying the ionized target material to the plasma generation chamber at a high speed while suppressing spreading of the ionized target material. Further objects of the invention may be readily apparent from the following description of the presently preferred embodiments.

To achieve the objects, according to one aspect of the invention, there is provided an extreme ultraviolet light source device that generates extreme ultra violet light by irradiating laser beam on a target material for turning into a plasma thereof, comprising a target material supply section that supplies the target material, an ionization section that ionizes the target material supplied from the target material supply section, a plasma generation chamber that is supplied with the ionized target material and generates a plasma, and a plasma generation laser light source that irradiates laser beam on the target material supplied to a predetermined area in the plasma generation chamber to turn into plasma the target material, thereby emitting extreme ultra violet light.

The ionization section can ionize the target material by irradiating laser beam thereon.

The ionization section can include a vaporization laser light source that vaporizes the target material supplied from the target material supply section by irradiating vaporization laser beam on the target material, and an ionization laser light source that ionizes the target material vaporized by the vaporization laser beam by irradiating ionization laser beam on the target material.

The ionization section can include a vaporization electron beam device that vaporizes the target material supplied from the target material supply section by irradiating a vaporization electron beam on the target material, and an ionization laser light source that ionizes the target material vaporized by the electron beam device by irradiating ionization laser beam on the target material.

The ionization laser light source can be configured as a pulsed laser light source.

The ionization laser light source can simultaneously output laser beams of plural kinds of wavelengths prepared beforehand in association with an excited level of the target material.

The target material can be a tin or a tin compound including stannane (SnH4), and the ionization laser light source can output laser beams of three to five wavelengths in total including at least one of three wavelengths of near 286.4 nm, near 300.9 nm, and near 317.5 nm, and two wavelengths of near 811.6 nm and near 823.7 nm.

The ionization laser light source may be configured to include a base wave generator having a titanium sapphire laser, and a higher harmonics generator as a pulsed laser light source.

The ionization section may be provided with a first collection section for collecting the target material.

The target material may be a tin or a tin compound including stannane (SnH4), and the ionization section may be provided with a heater section that melts the target material deposited inside the ionization section to be collected by the first collection section.

The ionization section may be provided with a first magnetic field generating section that generates a magnetic field in such a way as to enclose the target material supplied from the target material supply section.

The extreme ultraviolet light source device can further comprise an extraction section that extracts the target material ionized by the ionization section out thereof and supplies the ionized target material to the plasma generation chamber, and a convergence section provided between the plasma generation chamber and the extraction section to converge the ionized target material traveling toward the plasma generation chamber in a direction substantially perpendicular to the traveling direction of the ionized target material.

A second magnetic field generating section that generates a magnetic field may be provided in such a way as to enclose a transit area between the extraction section and the convergence section.

An acceleration section for accelerating the ionized target material may be provided in a transit area between the extraction section and the convergence section.

A third magnetic field generating section that generates a magnetic field in the predetermined area may be provided in the plasma generation chamber.

A second collection section for collecting the target material after generation of the plasma may be provided in the plasma generation chamber.

A fourth magnetic field generating section that generates a magnetic field may be provided in such a way as to enclose a connecting section which connects the plasma generation chamber to the second collection section.

A compression section for compressing the ionized target material can be provided between the ionization section and the plasma generation chamber.

A neutralization section for electrically neutralizing the ionized target material can be provided in a transit area between the convergence section and the plasma generation chamber.

The plasma generation laser light source can be configured as a laser light source that outputs carbon dioxide gas laser light.

According to another second aspect of the invention, there is provided an extreme ultra violet light generation method of executing an ionization step of ionizing a target material supplied from a target material supply device for supplying the target material, a supply step of supplying the ionized target material to a predetermined area in a plasma generation chamber while inhibiting expansion of the ionized target material, and a step of irradiating laser beam for plasma generation on the ionized target material supplied to the predetermined area in the plasma generation chamber to turn into plasma the ionized target material, thereby emitting extreme ultra violet light.

In the ionization step, a first sub step of vaporizing the target material, and a second sub step of irradiating ionization laser beam on the vaporized target material for ionization thereof can be executed.

The ionization laser beam may include laser beams of plural kinds of wavelengths prepared beforehand in association with an excited level of the target material.

According to a further aspect of the invention, there is provided an extreme ultraviolet light source device that generates extreme ultra violet light by irradiating laser beam on a target material for turning into a plasma thereof, comprising a target material supply section that supplies the target material, an ionization section provided near and downstream of the target material supply section to irradiate predetermined laser beam on a predetermined amount of the target material supplied from the target material supply section to generate an ionized target material of a predetermined size and predetermined density, a plasma generation chamber provided apart from and downstream of the ionization section to generate a plasma, a supply section that supplies the ionized target material to the plasma generation chamber by performing convergence and transportation of the ionized target material using at least one of electric power and magnetic force, and a plasma generation laser light source that irradiates a plasma generation laser beam on the ionized target material supplied to the plasma generation chamber to turn into plasma the ionized target material, thereby emitting extreme ultra violet light.

The extreme ultraviolet light source device may further comprise a fifth magnetic field generating section that is disposed in such a way as to enclose a transit area between the extraction section and the plasma generation chamber, and generates a magnetic field in the traveling direction of the ionized target material, and an electron beam output section that irradiates an electron beam toward the magnetic field generated by the fifth magnetic field generating section.

The extreme ultraviolet light source device may be configured in such a way that an irradiation timing for the ionization laser beam is set with an irradiation timing for the vaporization laser beam as a reference, and an irradiation timing for the laser beam for turning the target material into a plasma in the plasma generation chamber is set with the irradiation timing for the ionization laser beam as a reference.

The extreme ultraviolet light source device may be configured in such a way that an irradiation timing for the vaporization laser beam is set with a timing at which the target material supply section supplies the target material as a reference, an irradiation timing for the ionization laser beam is set with the irradiation timing for the vaporization laser beam as a reference, and an irradiation timing for the laser beam for turning the target material into a plasma in the plasma generation chamber is set with the irradiation timing for the ionization laser beam being a reference.

The extreme ultraviolet light source device may be configured in such a way that an irradiation timing for the vaporization laser beam, an irradiation timing for the ionization laser beam, and an irradiation timing for the laser beam for turning the target material into a plasma in the plasma generation chamber are set with a timing at which the target material supply section supplies the target material being a reference.

The target material supply section can be configured to include a target material supply body for supplying the target material and is provided with a groove portion where laser beam is irradiated, a rotary section that rotates the target material supply body, and a replenishment section that replenishes the target material into the groove portion according to rotation of the target material supply body.

The target material supply body is formed into a disk shape from the target material or a material different therefrom, and has one surface rotatably supported by the rotary section.

The target material supply body is formed, into a cylindrical shape, of the target material or a material different therefrom, and has the groove portion provided at a peripheral surface thereof, and has a rotary shaft having both ends rotatably supported.

DESCRIPTION OF THE SPECIFIC EMBODIMENTS

Preferred embodiments of the present invention will be described below with reference to the accompanying drawings. According to the embodiments, an ionizer 20 provided at a location different from the location of a plasma generation chamber 60 generates an ionized target material 91, and supplies the ionized target material 91 to the plasma generation chamber 60. Because the ionized target material is generated in the ionizer 20, it is possible to prevent an excessive target material unnecessary for generation of a plasma from being supplied to the plasma generation chamber 60. Further, because the ionized target material can be controlled by electric force or magnetic force, the ionized target material can be supplied to the plasma generation chamber 60 while suppressing diffusion of the ionized target material.

[First Embodiment]

Figure 1:
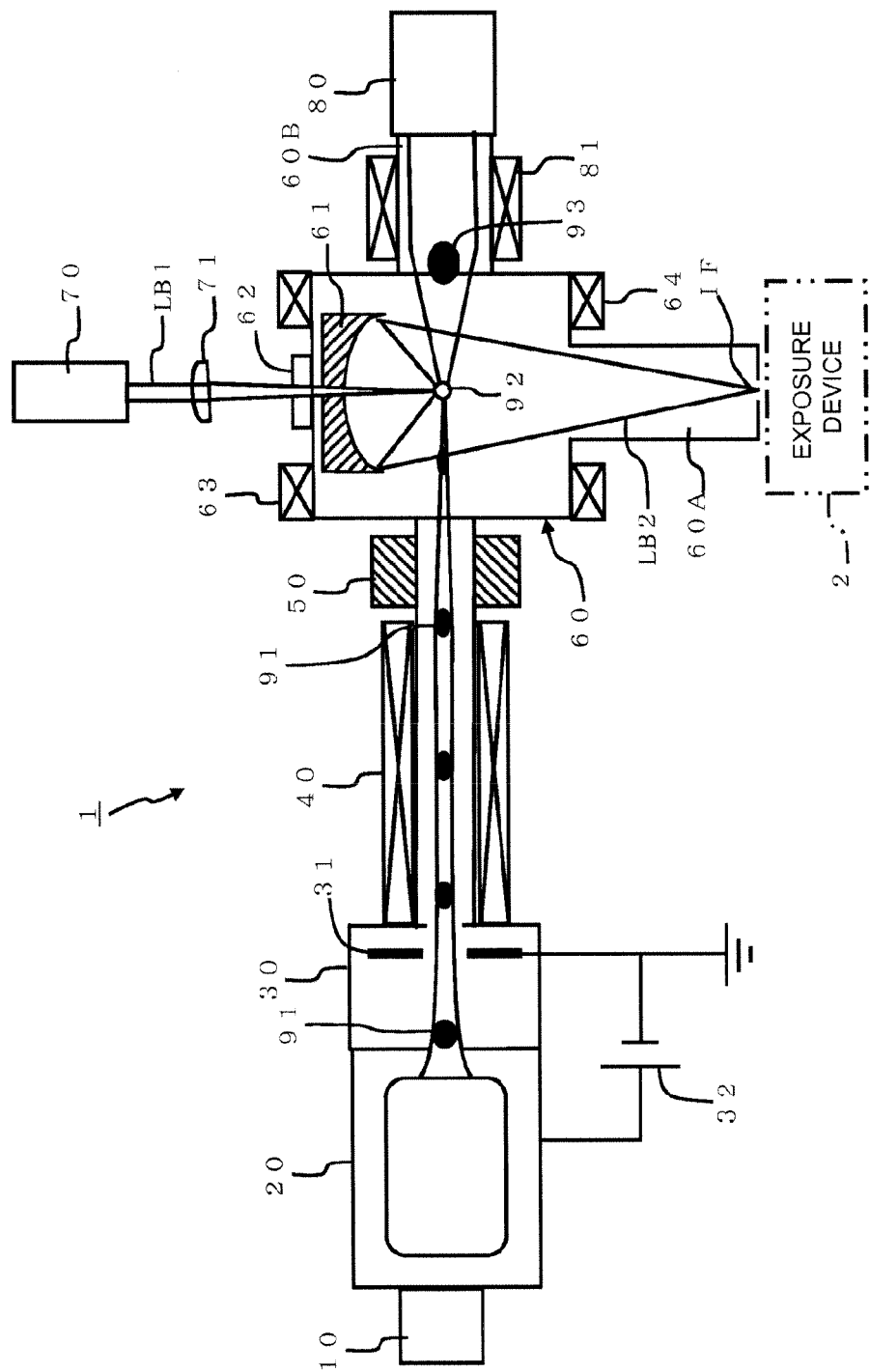
FIG. 1 is an explanatory diagram showing the general configuration of an EUV light source device according to a first embodiment of the present invention.
Figure 2:
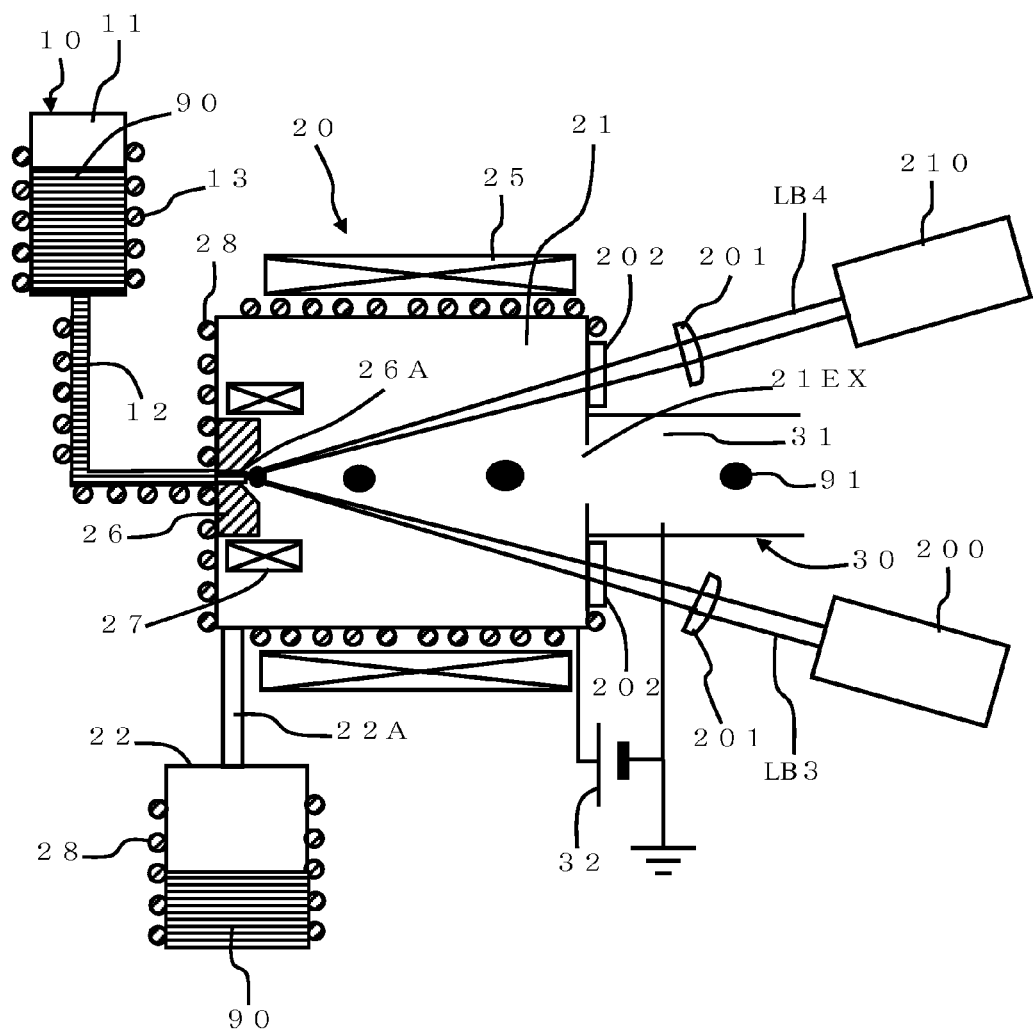
FIG. 2 is an explanatory diagram showing the configuration of an ionizer in enlargement.
Figure 3:
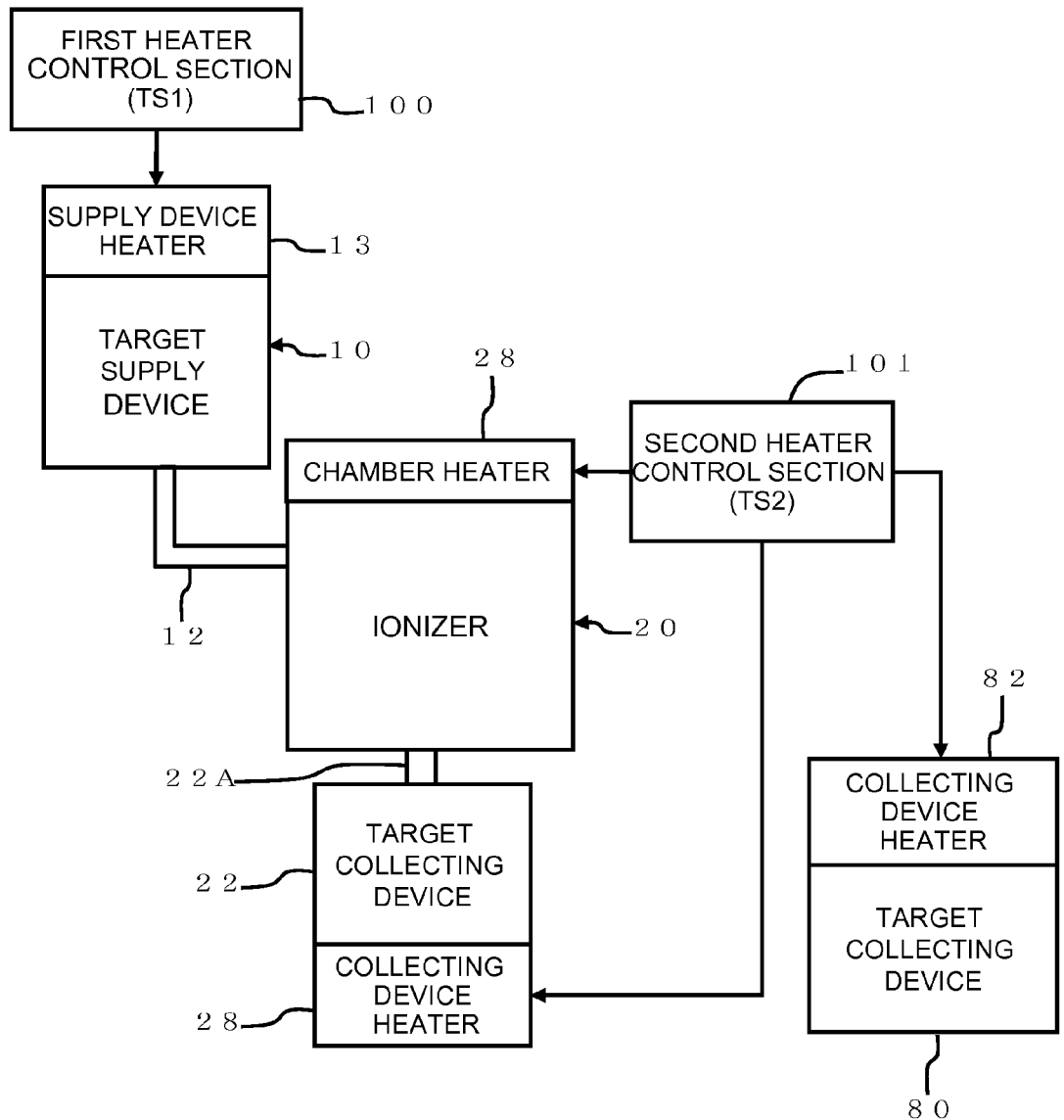
FIG. 3 is an explanatory diagram showing a heater temperature control structure.
Figure 4:
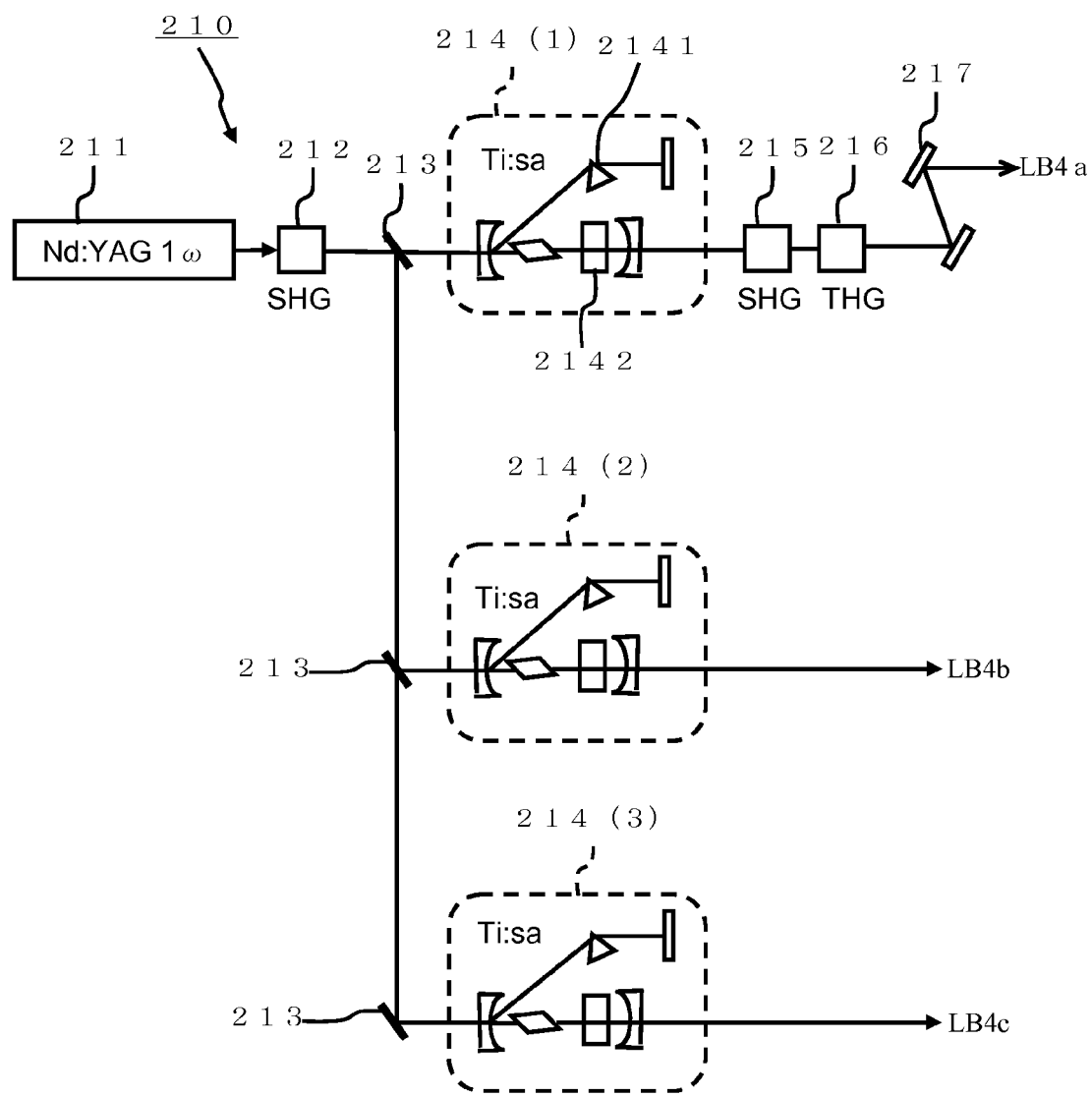
FIG. 4 is an explanatory diagram showing the configuration of a laser light source which ionizes a target material.
Figure 5:
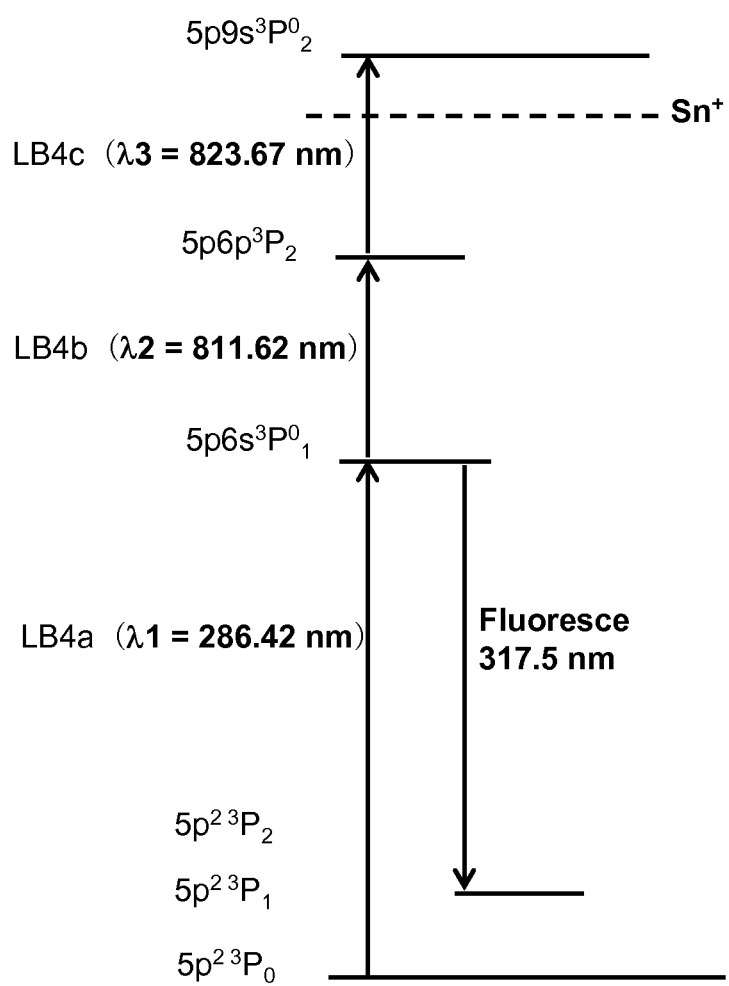
FIG. 5 is an explanatory diagram showing the energy level of tin which is a target material.

A first embodiment of the invention will be described referring to FIGS. 1 to 5. FIG. 1 is an explanatory diagram showing the general configuration of an EUV light source device 1, FIG. 2 is an explanatory diagram showing the ionizer 20, etc. in enlargement, FIG. 3 is an explanatory diagram for collecting a target material, FIG. 4 is an explanatory diagram of a laser light source 210 to be used in the ionizer 20, and FIG. 5 is an energy level diagram showing laser beams of a plurality of wavelengths which are simultaneously irradiated from the laser light source 210.

An EUV light source device 1 shown in FIG. 1 can be configured to include, for example, a target supply device 10, the ionizer 20, an ion beam extractor 30, a drift tube 40, a convergence device 50, the plasma generation chamber 60, a driver laser light source 70, and a target collecting device 80. However, the illustrated configuration merely exemplifies the embodiment of the invention, and is not limited to the illustrated configuration. It should be apparent to those skilled in the art that the additional structures, modifications and the like can be implemented without departing from the spirit or scope of the invention.

The target supply device 10 is equivalent to the "target material supply section", and supplies targets such as tin in the form of solid or liquid. Tin may be supplied as a tin compound such as stannane (SnH4). Note that when tin is supplied in the form of liquid, pure tin can be heated to the melting point to be liquefied, or can be supplied in the form of a solid or liquid or in the form of a solution containing tin or a colloidal solution containing tin or a tin compound. Although tin will be explained as a target material by way of example according to the embodiment, which is not limited to, other materials, such as lithium (Li), may be used. In addition, various methods to be described in the following descriptions of embodiments can be adopted as a method of supplying a target material.

The ionizer 20 as the "ionization section" is the device that ionizes a target material supplied from the target supply device 10. The target supply device 10 is provided adjacent to, and downstream of, the target supply device 10. The "downstream" herein indicates the moving direction of a target material, and the rightward direction in FIG. 1 is downstream while the leftward direction in FIG. 1 is upstream.

The ion beam extractor 30 as the "extraction section" is the device that extracts the ionized target material 91 generated by the ionizer 20 therefrom, and feeds out the ionized target material toward the plasma generation chamber 60. The ion beam extractor 30 is provided adjacent to, and downstream of, the ionizer 20. The ion beam extractor 30 has, for example, a ring-like electrode 31 and a power source 32 which applies a predetermined high voltage (negative voltage) to the electrode 31. A high voltage applied to the electrode 31 causes the ionized target material 91, generated in the ionizer 20, to be extracted therefrom and fed out toward the plasma generation chamber 60. For the sake of descriptive convenience, a target material and an ionized target material will be occasionally called "target" and "ion beam" herein, respectively.

The drift tube 40 is the device that transports the ion beam (ionized target material) 91 toward the plasma generation chamber 60. The drift tube 40 is provided adjacent to, and downstream of, the ion beam extractor 30. The drift tube 40 is provided in such a way as to connect the ion beam extractor 30 to the convergence device 50. The drift tube 40 is configured to have a magnetic field generator, such as a electromagnet, which generates a magnetic field to prevent the ion beam from spreading in the radial direction. The drift tube 40 corresponds to the "second magnetic field generating section". In the following description, the magnetic field generator that constitute the "first, second, third or fourth magnetic field generating sections" is a cylindrical electromagnet or the like, and the ion beam passes through the circular center opening thereof. The center axis of the magnetic flux produced by the magnetic field generator is arranged to be substantially coincide with the axis along which the ion beam passes.

The convergence device 50 as the "convergence section" is configured as an electrostatic lens such as a quadrupole lens or einzel lens, or a magnetic lens or the like, and is the device which prevents the ion beam from spreading in a direction (up and down direction in FIG. 1) orthogonal to the traveling direction of the ion beam (right and left direction in FIG. 1). The convergence device 50 is provided adjacent to, and downstream of, the drift tube 40. The convergence device 50 can be provided between the ion beam extractor 30 and the plasma generation chamber 60.

The plasma generation chamber 60 is provided adjacent to, and downstream of, the convergence device 50, and the interior of the plasma generation chamber 60 is kept in a vacuum state. The plasma generation chamber 60 is provided with, for example, an EUV collector mirror 61, an incident window 62, electromagnets 63 and 64, a connecting section 60A, and a collection passage 60B. The connecting section 60A connects the plasma generation chamber 60 to an exposure device 2. The collection passage 60B connects the plasma generation chamber 60 to a target collecting device 80.

The EUV collector mirror 61 reflects and focuses EUV radiation. The top surface of the EUV collector mirror 61 is formed as, for example, a concave surface of a rotary ellipsoid or the like, a paraboloid, a spherical surface, or a concave surface having a plurality of curvatures. A multilayer film having a molybdenum film and a silicon film, for example, is provided on the top surface of the EUV collector mirror 61 to reflect EUV radiation of a wavelength of 13 nm or so.

The incident window 62 is a window portion through which driver laser beam passes. The driver laser beam is irradiated on the ionized target material that has reached to a predetermined position in the plasma generation chamber 60. This generates a plasma 92, thus emitting EUV radiation. The EUV radiation is focused into an intermediate focus (IF) by the EUV collector mirror 61, and is connected to the exposure device 2 via the connecting section 60A.

The pair of magnetic field generators 63, 64 are provided in such a way as to sandwich the optical path of EUV radiation LB2 traveling toward the intermediate focus IF from the right and left directions in FIG. 1. The individual magnetic field generators 63, 64 correspond to the "third magnetic field generating section". Each magnetic field generator 63, 64 is configured as an electromagnet, for example.

When currents in the same direction are let to flow in the magnetic field generators 63, 64, a magnetic field is generated in the plasma generation chamber 60. This magnetic field has a high flux density in the vicinity of each magnetic field generator 63, 64, and a low flux density at a middle point between the magnetic field generators 63, 64. A target material 93 after emission of EUV radiation is caught by the magnetic fields generated by the magnetic field generators 63, 64, and moves rightward (downstream side) in FIG. 1 while making a spiral motion due to the Lorentz force. Then, the target material 93 flows into the target collecting device 80 as the "second collection section" to be collected therein. A magnetic field generator 81 as the "fourth magnetic field generating section" is provided outside the collection passage 60B. The line of magnetic force generated from the magnetic field generator 81 restrains expansion of the target material 93. As described later, the target collecting device 80 is provided with a heater 82 (see FIG. 3).

The driver laser light source 70 outputs laser beam LB1 for exciting the ionized target material 91 to generate the plasma 92. The driver laser light source 70 is configured as, for example, a carbon dioxide pulsed laser light source, and outputs a pulse of driver laser beam LB1 of a wavelength of about 10.6 μm. The laser beam LB1 is input into the plasma generation chamber 60 through a focusing lens 71 and the incident window 62 to be irradiated on the ionized target material. Although a carbon dioxide pulsed laser light source is used as an example of the driver laser light source according to the embodiment, the invention is not limited thereto.

FIG. 2 is an explanatory diagram showing the target supply device 10, the ionizer 20, etc. in enlargement. The target supply device 10 supplies a predetermined amount of a liquid target material (tin in the embodiment) to the ionizer 20 at a time.

The target supply device 10 is configured to have, for example, a tank 11, a supply tube 12 connecting the bottom of the tank 11 and the ionizer 20, and a heater 13 provided around the tank 11 and the supply tube 12.

The target supply device 10 is held at a temperature equal to or higher than the melting point of the target material by the heater 13. The heater 13 is configured as an electric heater which converts electric energy to heat energy. The tank 11 retains a liquid target material 90. The supply tube 12 has one end connected to the tank 11, and the other end connected to an inlet portion 26 provided inside the ionizer 20.

The ionizer 20 has, for example, an ion beam generation chamber 21, magnetic field generators 25, 27, the inlet portion 26 and a heater 28. A target collecting device 22 as the "first collection section" is connected to the bottom of the chamber 21 via a collection passage 22A.

The chamber 21 is the space for ionizing the target material. The inlet portion 26 for letting the target material from the target supply device 10 to enter the chamber 21 is provided at one wall of the chamber 21. An aperture 21EX for connection to the ion beam extractor 30 is provided at the other side wall of the chamber 21.

A thin-pipe or porous inlet port 26A is provided at the center portion of the inlet portion 26. The liquid target material 90 supplied from the target supply device 10 is supplied into the chamber 21 by a small amount at a time in such a way as to be percolated through the inlet port 26A.

A plurality of incident windows 202 are provided at the other side wall of the chamber 21 around the aperture 21EX. The lower incident window 202 in FIG. 2 allows vaporization laser beam LB3 to enter the chamber 21. The upper incident window 202 in FIG. 2 allows ionization laser beam LB4 to enter the chamber 21.

A plurality of laser light sources 200 and 210 are provided outside the chamber 21. One laser light source 200 is a vaporization laser light source for vaporizing the target material. The vaporization laser light source 200 irradiates the vaporization laser beam LB3 on the target material 90 to vaporize the target material 90. The vaporization laser beam LB3 enters the chamber 21 via a focusing lens 201 and the incident window 202 to be irradiated on the target material supplied into chamber 21 through the inlet port 26A.

The other one laser light source 210 is an ionization laser light source. The ionization laser light source 210 irradiates the ionization laser beam LB4 on the vaporized target material for ionization thereof, thus generating the ionized target material 91 (ion beam 91). The ionization laser beam LB4 enters the chamber 21 via the focusing lens 201 and the incident window 202 to be irradiated on the vaporized target material near the inlet port 26A for ionization thereof. The details of the ionization laser light source 210 will be given later referring to FIGS. 4 and 5.

The magnetic field generator 25 is provided outside the chamber 21 in such a way as to cover the chamber 21. The magnetic field generator 25 will be occasionally called as "external magnetic field generator 25" hereinafter. The magnetic field generator 27 is provided inside the chamber 21 in such a way as to enclose the inlet portion 26. The magnetic field generator 27 will be occasionally called as "internal magnetic field generator 27" hereinafter. Those magnetic field generators 25, 27 provided at the chamber 21 correspond to the "first magnetic field generating section"; or, the external magnetic field generator 25 corresponds to the "first magnetic field generating section".

The external magnetic field generator 25 prevents the ion beam 91 from spreading in the radial direction (planar direction perpendicular to the traveling direction of the ion beam 91) with the help of the line of magnetic force along the traveling direction of the ion beam 91. The internal magnetic field generator 27 generates a line of magnetic force in the vicinity of the inlet port 26A to prevent the vaporized and ionized target material 91 from spreading in the radial direction.

As mentioned above, the target collecting device 22 is provided at the bottom of the chamber 21 via the collection passage 22A. The target collecting device 22 is provided with the heater 28. The target material 90 deposited inside the chamber 21 flows out into the target collecting device 22 via the collection passage 22A to be collected therein.

Of the entire target material 90 supplied into the chamber 21 from the target supply device 10, the target material which has not be extracted as the ion beam 91 by the ion beam extractor 30 is stored in the target collecting device 22. That is, a minim amount of ionized target material 91 needed for plasma generation is generated in the ionizer 20, and an unnecessary target material 90 which does not contribute to generation of the plasma 92 is collected in the target collecting device 22 so that the unnecessary target material 90 does not flow into the plasma generation chamber 60.

FIG. 3 is an explanatory diagram exemplarily showing a temperature control structure for the heaters provided at the target supply device 10, the ionizer 20, etc. As mentioned above, the heaters are respectively provided at the target supply device 10, the ionizer 20 and each target collecting device 22, 80 to heat the components or keep the temperatures thereof according to the embodiment.

As shown in FIG. 3, for example, a first control section 100 controls the temperature of the heater 13 provided at the target supply device 10 (hereinafter "first set temperature TS1") to a value higher than the melting point of the target material 90 and less than the boiling point of the target material 90 (melting point of the target material<TS1<boiling point of the target material).

A second control section 101 controls the temperature of the heater 28 provided at the ionizer 20 and the target collecting device 22 and the heater 82 provided at the target collecting device 80 (hereinafter "second set temperature TS2") to, for example, the melting point of the target material (TS2 ≥melting point of the target material).

The first set temperature TS1 is greater than the second set temperature TS2 (TS1>TS2). Accordingly, the target supply device 10 is held at a relatively high temperature, so that the target material supplied into chamber 21 from the target supply device 10 is easily vaporized by the vaporization laser beam LB3.

Because the chamber 21 or the like is set to the melting point of the target material 90, it is possible to prevent the target material deposited on the inner wall or the like of the chamber 21 from being solidified and collect the target material 90 in a liquid state in the target collecting device 22. Likewise, the target collecting device 80 can collect the target material in a liquid state. The temperature control structure shown in FIG. 3 is merely one example, and is not restrictive in the invention. For example, the temperature control structure may be made to set the first set temperature TS1 of the heater 13 to the melting point of the target material 90 (TS1 ≥melting point of the target material).

FIG. 4 is an explanatory diagram showing an example of the configuration of the ionization laser light source 210. The ionization laser light source 210 includes, for example, one YAG (Yttrium Aluminum Garnet) laser 211, three titanium sapphire lasers 214(1) to 214(3), second harmonic generators (SHG: Second Harmonic Generation) 212, 215, a third harmonic generator (THG: Third Harmonic Generation) 216, and half mirrors 213.

The YAG laser 211 irradiates, for example, a pulse of laser beam of a wavelength of 1 μm every 10 μsec. The wavelength of the laser beam output from the YAG laser 211 is adjusted by the second harmonic generator 212. The YAG laser 211 and the second harmonic generator 212 constitute an excitation source. Note that another type of laser may be used instead of the YAG laser.

The laser beam from the excitation source is input to the three titanium sapphire lasers 214(1) to 214(3) via the respective half mirrors 213. Each of the titanium sapphire lasers 214(1) to 214(3) includes a prism 2141 and a Q switch 2142 in addition to a mirror, a laser medium and or the like. The prism 2141 serves to select a wavelength of the laser beam output from each of the titanium sapphire lasers 214(1) to 214(3) and narrower the band thereof. The Q switch 2142 serves to synchronize the output timing for laser beam output from each of the titanium sapphire lasers 214(1) to 214(3).

The laser beam output from the first titanium sapphire laser 214(1) is converted to laser beam LB4a of a wavelength of 286.42 nm via the second harmonic generator 215, the third harmonic generator 216 and a reflection optical system 217.

Laser beam LB4b output from the second titanium sapphire laser 214(2) has a wavelength of 811.62 nm. Laser beam LB4c output from the third titanium sapphire laser 214(3) has a wavelength of 823.67 nm. The wavelengths of the input laser beams can be set to 811.62 nm and 823.67 nm respectively by the prisms 2141 in the titanium sapphire lasers 214(2), 214(3).

FIG. 5 is an energy level diagram of tin which is the target material 90. As radiation of a first wavelength ($\lambda 1$=286.42 nm) is applied to tin with a base level $5p^{23}P_0$, a first excited level is acquired. As radiation of a second wavelength ($\lambda 2$=811.62 nm) is applied to tin with the first base level, a second excited level is acquired. As radiation of a third wavelength ($\lambda 2$=823.67 nm) is applied to tin with the second base level, a third excited level is acquired. Because the third excited level exceeds a threshold value for ionization, tin is ionized.

The description of the embodiment will be given of the case of tin with the base level $5p^{23}P_0$. $\lambda 1$=300.92 nm is used as the wavelength of laser beam for tin with the base level $5p^{23}P_1$. $\lambda 1$=317.51 nm is used as the wavelength of laser beam for tin with the base level $5p^{23}P_2$. The ratio of the three base levels $5p^{23}P_0$, $5p^{23}P_1$ and $5p^{23}P_2$ depends on the temperature of vaporized tin. The temperature of vaporization tin depends on the intensity of vaporization laser beam. Therefore, the distribute of a desirable one of the three base levels, e.g., $5p^{23}P_0$, can be maximized by optimizing the intensity of the vaporization laser beam. It is possible to take a structure of simultaneously irradiating laser beams of three wavelengths of $\lambda 1$=286.42 nm, $\lambda 1$=300.92 nm and $\lambda 1$=317.51 nm in order to excite all of the three base levels $5p^{23}P_0$, $5p^{23}P_1$ and $5p^{23}P_2$ though complex the structure of the ionization laser beam device becomes. In this case, there are five wavelengths of laser beams in total.

According to the embodiment, laser beams of three wavelengths are simultaneously output to ionize tin, which is not limited to. It is possible to take, for example, a multiphoton ionizing structure to be discussed below though the efficiency of ionization becomes lower. Laser beam (=$\lambda 4$=456.5 nm) is used as the structure of three-photon ionization based on laser beam of a single wavelength. Laser beam (=$\lambda 5$=270-318 nm) is used as the structure of two-photon ionization based on laser beam of a single wavelength. Laser beam of the first wavelength (=$\lambda 1$=286.42 nm) and laser beam of the second wavelength (=$\lambda 6$=614-618 nm) are used as the structure of three-photon ionization based on two-wavelength laser beam.

According to the embodiment, the ionization laser light source 210 simultaneously outputs and irradiates three-wavelength laser beams LB4*a* (=λ1), LB4*b* (=λ2) and LB4*c* (=λ3) on tin or the target material 90 to increase the excited level of tin to spontaneously ionize the target material 90. This method can ionize about 10% of tin supplied as the target material 90. The ionized tin is extracted by the ion beam extractor 30 and supplied to the plasma generation chamber 60. Tin which has not been ionized is collected in the target collecting device 22, and is not supplied to the plasma generation chamber 60.

As the laser beams LB4*a*, LB4*b*, LB4*c* corresponding to the respective excited levels of tin are simultaneously irradiated on tin according to the embodiment, the ionized target material 91 with a relatively low temperature can be obtained. Accordingly, the ionized target material 91 suitable for generation of EUV radiation can be supplied to the plasma generation chamber 60.

On the other hand, if the target material 90 is ionized by using a microwave or arc discharge, the ionized target material 91 becomes very hot. Before the ionized target material 91 reaches the point of plasma generation in the plasma generation chamber 60, therefore, the density of the ionized target material 91 falls down to or below the density that is appropriate for generation of EUV radiation. In the embodiment, the ionized target material 91 with a relatively low temperature and high density can be obtained by simultaneously applying the multi-wavelength laser beams LB4*a*, LB4*b*, LB4*c* corresponding to the excited levels of tin.

The operation of the EUV light source device 1 will be described referring to FIGS. 1 and 2. The ionizer 20 first irradiates the vaporization laser beam LB3 on the target material 90 supplied from the target supply device 10 to vaporize the target material 90, and then simultaneously irradiates the three types of laser beams LB4*a*, LB4*b*, LB4*c* on the vaporized target material to generate an ionized target material 91 (ion beam).

The ionized target material 91 is pulled toward a high voltage produced by the ion beam extractor 30, accelerated and supplied to the plasma generation chamber 60. The drift tube 40 and the convergence device 50 are disposed in the supply passage from the ion beam extractor 30 to the plasma generation chamber 60. The drift tube 40 and convergence device 50 suppress the ionized target material 91 from spreading in the radial direction during traveling, thus preventing the density of the ionized target material from becoming lower than the density appropriate for generation of EUV radiation. In FIG. 1, the outside diameter of the supply passage of the ionized target material 91 till the point of plasma generation in the plasma generation chamber 60 is indicated by an envelope.

Because the target material 91 is ionized, it tends to spread due to the repulsive force acting among cations. As the target material 91 spreads, the density becomes lower, thus reducing the efficiency of generating EUV radiation. When the target material 91 spreads larger than the beam size of the driver laser beam LB1, the irradiation efficiency in the case of irradiating the driver laser beam LB1 on the ionized target material becomes lower, thus reducing the generation efficiency of EUV radiation. To cope with this matter, the drift tube 40 as a magnetic field generator and the convergence device 50 including an electrostatic lens or the like are used to prevent the ionized target material 91 from spreading before reaching the point of plasma generation.

When the ionized target material 91 reaches the point of plasma generation in the plasma generation chamber 60, the driver laser beam LB1 is irradiated on the ionized target material 91, producing the plasma 92. The EUV radiation emitted from the plasma 92 is supplied to the exposure device 2 via the EUV collector mirror 61, etc.

The target material 93 after emission of the EUV radiation is retained in the target collecting device 80 via the collection passage 60B while keeping the high speed. The magnetic field generator 81 prevents the target material 93 from being deposited in the collection passage 60B. In FIG. 1, the maximum outside diameter of the target material 93 in the passage from the point of plasma generation in the plasma generation chamber 60 to the target collecting device 80 is indicated by an envelope.

According to the embodiment with the foregoing configuration, the target material 90 is supplied to the plasma generation chamber 60 after being ionized, the necessary amount of the target material 91 with a density appropriate for generation of EUV radiation can be supplied to the point of plasma generation.

According to the embodiment, the ion beam extractor 30 pulls only the ionized target material 91, and accelerates and supplies the ionized target material 91 toward the plasma generation chamber 60. The electrically neutral target material 90 which has not been ionized is collected in the target collecting device 22, and is not supplied to the plasma generation chamber 60. That is, according to the embodiment, the target material 90 which may become uncontrollable debris can be prevented from being supplied to the plasma generation chamber 60. This suppresses generation of debris, thus making it possible to prevent damaging or degradation of the EUV collector mirror 61 and improve the reliability, the lifetime and the operation time of the EUV light source device 1.

According to the embodiment, the target material 91 appropriate for generation of EUV radiation is generated in the ionizer 20 and is supplied to the plasma generation chamber 60. That is, the target material 91 appropriate for generation of EUV radiation can be adjusted beforehand using the ionizer 20 separated from the plasma generation chamber 60. For example, the necessary amount of the target material for generation of EUV radiation can be obtained by adjusting the diametric size of the inlet port 26A, the pressure in the tank 11, etc. Then, the drift tube 40 and the convergence device 50 can allow the target material 91 ionized by the ionization laser light source 210 to be transported to the point of plasma generation in such a way as not to diffuse the target material 91, thus making it possible to increase the generation efficiency of EUV radiation.

According to the embodiment, the target material 90 is ionized at once by simultaneously irradiating the multi-wavelength laser beams LB4*a*, LB4*b*, LB4*c* corresponding to the excited levels of the target material 90 on the target material. It is therefore possible to obtain the ionized target material 91 with a lower temperature than that obtained in the case of using arc discharge or the like, thus making it possible to suppress the density and shape of the ionized target material 91 from being changed. This can improve the generation efficiency of EUV radiation.

[Second Embodiment]

Figure 6:
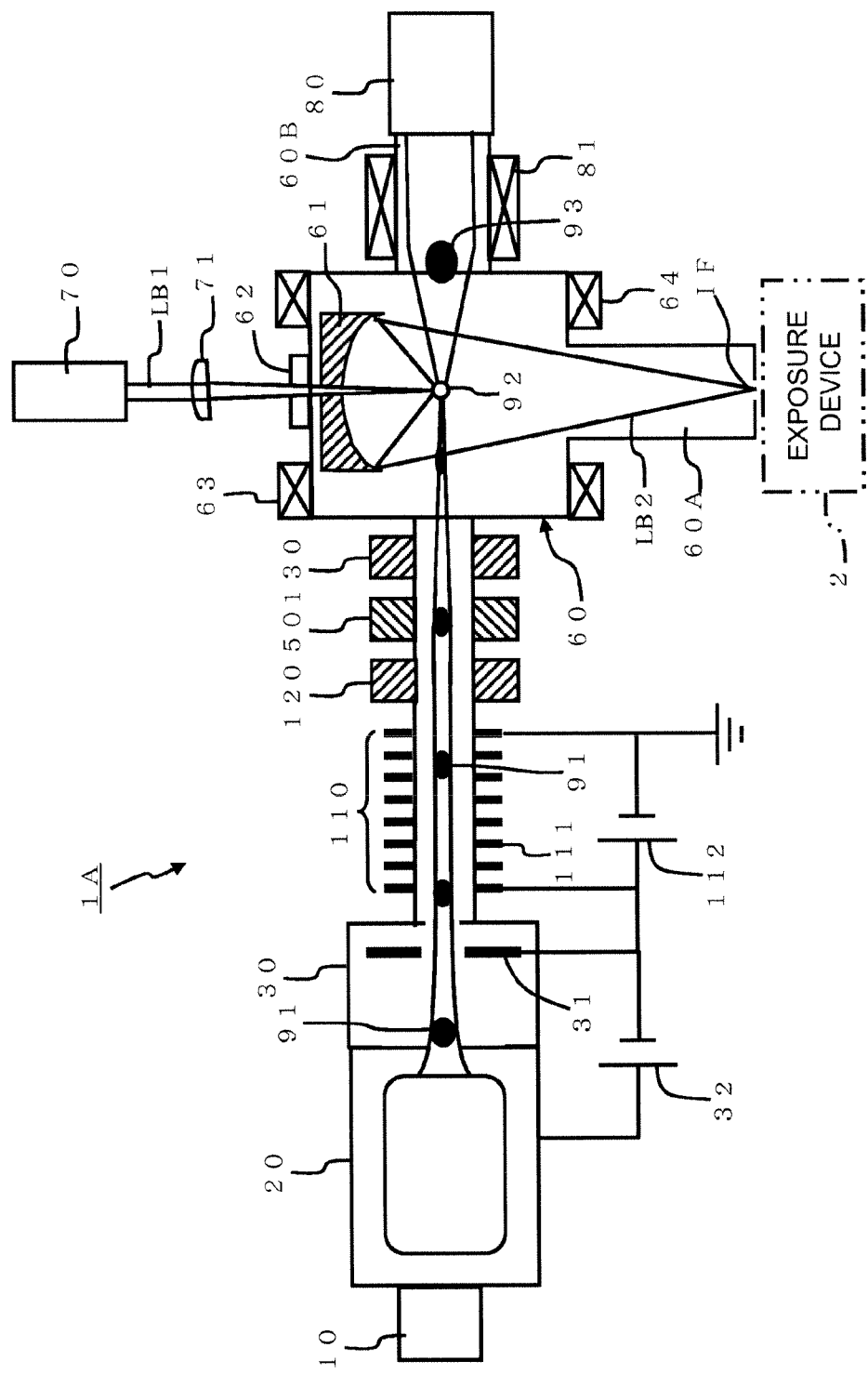
FIG. 6 is a diagram showing the general configuration of an EUV light source device according to a second embodiment.

A second embodiment will be described referring to FIG. 6. The individual embodiments to be described hereinafter are modifications of the first embodiment. Therefore, the following description is mainly about differences from the first embodiment. FIG. 6 is an explanatory diagram showing the general configuration of an EUV light source device 1A according to the second embodiment.

The EUV light source device 1A, like the EUV light source device 1 shown in FIG. 1, includes a target supply device 10, an ionizer 20, an ion beam extractor 30, a plasma generation chamber 60, a driver laser light source 70, a target collecting device 80, and so forth. The EUV light source device 1A differs from the EUV light source device 1 in FIG. 1 in that an accelerating tube 110, a compressor (buncher) 120 and a neutralizer 130 are additionally provided between the ion beam extractor 30 and the plasma generation chamber 60, and the drift tube 40 is eliminated.

The accelerating tube 110 as the "acceleration section" is provided in place of the drift tube 40. The accelerating tube 110 has a plurality of ring-like electrodes 111 among which predetermined voltages are applied. That is, a voltage is applied to each electrode 111 in such a way that the voltage between the adjoining electrodes gradually rises. This causes the ionized target material 91 which has entered the accelerating tube 110 to move toward the plasma generation chamber 60 while being accelerated.

The compressor 120 as the "compression section" is provided adjacent to, and downstream of, the accelerating tube 110. The compressor 120 compresses the ionized target material 91 in the moving direction thereof. That is, the compressor 120 compresses the ionized target material 91, which moves rightward from the left in FIG. 6, in the right and left direction. The compressor 120 has, for example, a pair of electrodes having apertures through which the ionized target material 91 passes. A pulse high voltage whose polarity changes is applied to the pair of electrodes in synchronism with the passing of the ionized target material 91 through the pair of electrodes, thus ensuring pulse compression in the traveling direction of the ionized target material 91. As mentioned in the foregoing description of the first embodiment, the convergence device 50 is provided adjacent to, and downstream of, the compressor 120 converges the ionized target material 91 in the planar direction orthogonal to the moving direction thereof.

The neutralizer 130 as the "neutralization section" is provided adjacent to, and downstream of, the convergence device 50. The neutralizer 130 irradiates an electron beam on the positively ionized target material 91 to electrically neutralize the target material 91. Alternatively, the neutralizer 130 may be configured as a plasma generator to generate a plasma through which the ionized target material 91 is let to pass to be electrically neutralized.

Even when the target material 91 becomes electrically neutral, the moving speed hardly changes, so that the electrically neutral target material 91 moves toward the point of plasma generation at a high speed. A target material 93 after generation of EUV radiation moves fast toward the target collecting device 80 to be collected therein.

The embodiment with this configuration also has advantages similar to those of the first embodiment. Further, the use of the accelerating tube 110 in place of the drift tube 40 in the embodiment can allow the ionized target material 91 to be transported at a higher speed. It is therefore possible to suppress diffusion of the ionized target material 91.

According to the embodiment, because the compressor 120 is provided downstream of the accelerating tube 110, the target material 91 which stretches in the moving direction by passing through the accelerating tube 110 can be converged in the moving direction. That is, provided that the right and left direction in FIG. 6 is called the longitudinal direction, the target material stretched in the longitudinal direction can be compressed. This can allow the target material 91 with the shape adjusted to be supplied to the point of plasma generation plasma, making it possible to increase the generation efficiency of EUV radiation.

According to the embodiment, the neutralizer 130 is provided before the plasma generation chamber 60 to electrically neutralize the target material before being supplied to the plasma generation chamber 60. Accordingly, the target material 91 can be prevented from spreading in the chamber 60 by the repulsive force acting among ions, making it possible to supply the target material 91 with the appropriate density and shape maintained to the point of plasma generation, thus increasing the generation efficiency of EUV radiation.

[Third Embodiment]

Figure 7:
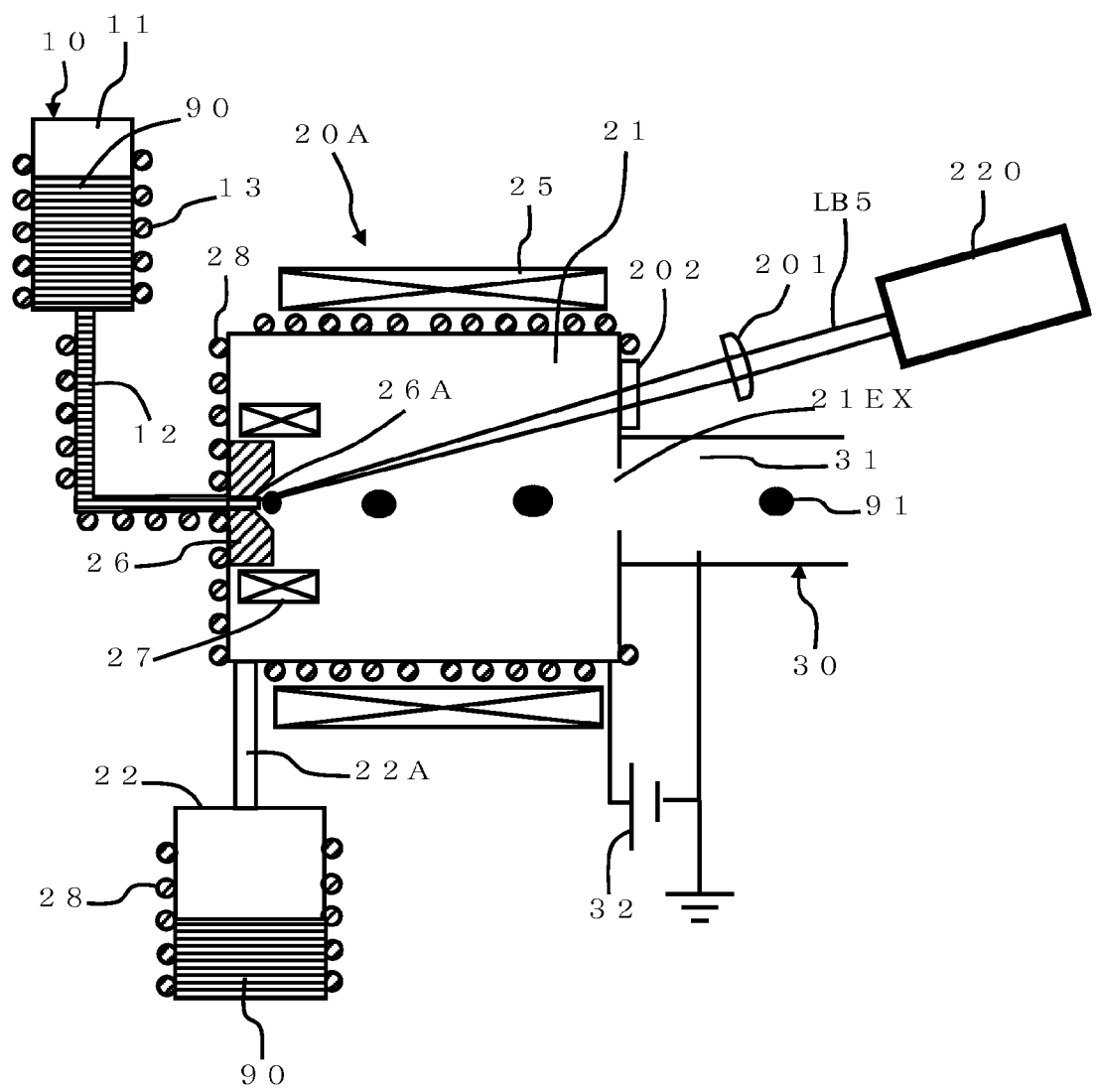
FIG. 7 is a diagram showing generation of an ionized target material according to a third embodiment.

A third embodiment will be described referring to FIG. 7. According to the embodiment, the vaporization laser light source 200 is eliminated, and an ionization laser light source 220 alone carries out both of the vaporization and ionization of a target material 90. FIG. 7 is an explanatory diagram showing the essential portions of an EUV light source device according to the embodiment in enlargement.

For example, as the temperature of the heater 13 which heats the target supply device 10 or keeps the temperature thereof is set higher than the melting point of the target material 90, both the vaporization and ionization of the target material 90 can be carried out merely by irradiating laser beam LB5 on the target material 90 supplied through the inlet port 26A. The laser light source 220 which is used for both of vaporization and ionization can simultaneously output laser beams of three types of wavelengths as described in the foregoing description of the first embodiment.

The embodiment with this configuration also has advantages similar to those of the first embodiment. Further, because the single laser light source 220 serves as an ionization laser light source and a vaporization laser light source, it is possible to reduce the number of laser light sources, thus lowering the manufacture cost and maintenance cost.

[Fourth Embodiment]

Figure 8:
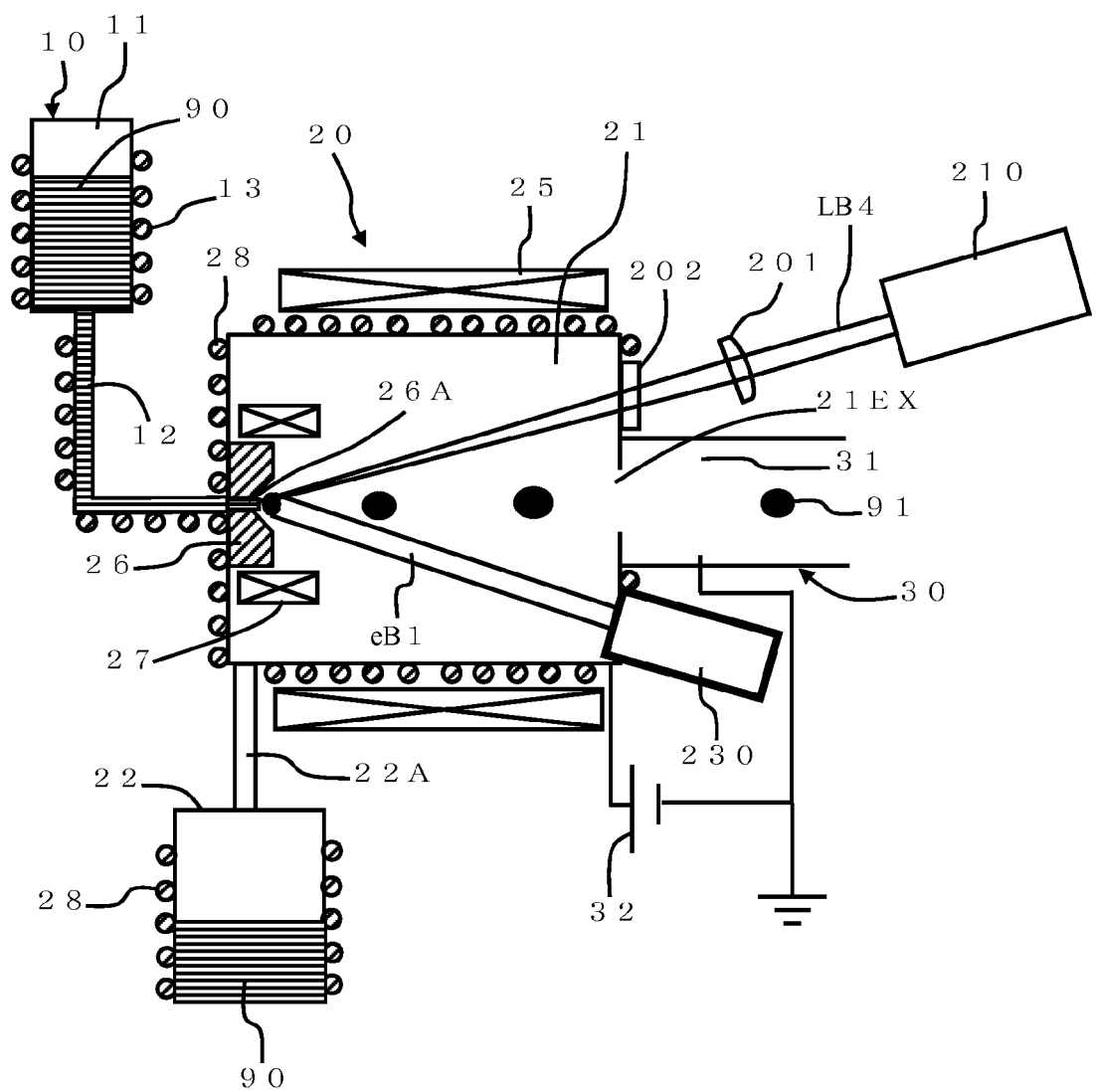
FIG. 8 is a diagram showing generation of an ionized target material according to a fourth embodiment.

A fourth embodiment will be described referring to FIG. 8. According to the embodiment, an electron beam device 230 is used in place of the vaporization laser light source 200. FIG. 8 is an explanatory diagram showing the essential portions of an EUV light source device according to the embodiment in enlargement.

According to the embodiment, an electron beam eB1 is irradiated on a target material 90 to vaporize the target material 90. Therefore, the focusing lens 201 and the incident window 202 are unnecessary. The embodiment with this configuration also has advantages similar to those of the first embodiment.

[Fifth Embodiment]

Figure 9:
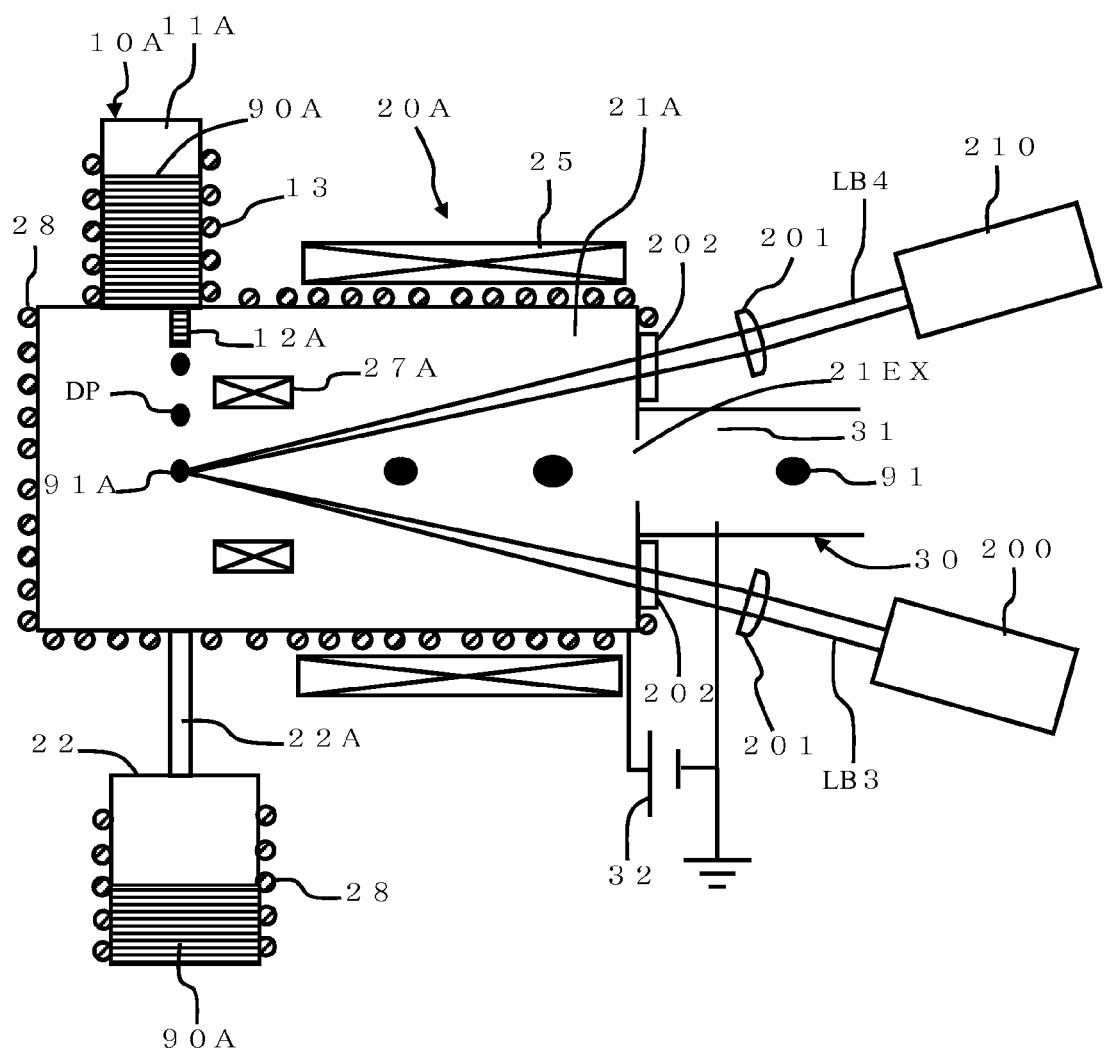
FIG. 9 is a diagram showing generation of an ionized target material according to a fifth embodiment.

A fifth embodiment will be described referring to FIG. 9. According to the embodiment, a target material of tin, stannane or the like is supplied as droplets into the ionizer 20. FIG. 9 is an explanatory diagram showing the essential portions of an EUV light source device according to the embodiment in enlargement.

A target supply device 10A retains a liquid target material 90A in a tank 11A. The target supply device 10A supplies a droplet target material into the ionizer 20 through a nozzle 12A by means of a piezoelectric element or the like. The vaporization and ionization of the droplet target material are almost simultaneously executed at a predetermined point 91A, and the resultant target material is extracted by the ion beam extractor 30. A magnetic field generator 27A suppresses the ionized target material 91 from spreading.

The embodiment with this configuration also has advantages similar to those of the first embodiment. Further, as the droplet target material is supplied into the ionizer 20, it is possible to supply the target material with a desired shape and in a desired mass according to the embodiment. Therefore, the ionized target material 91 appropriate for generation of EUV radiation can be generated in the ionizer 20 relatively easily.

[Sixth Embodiment]

Figure 10:
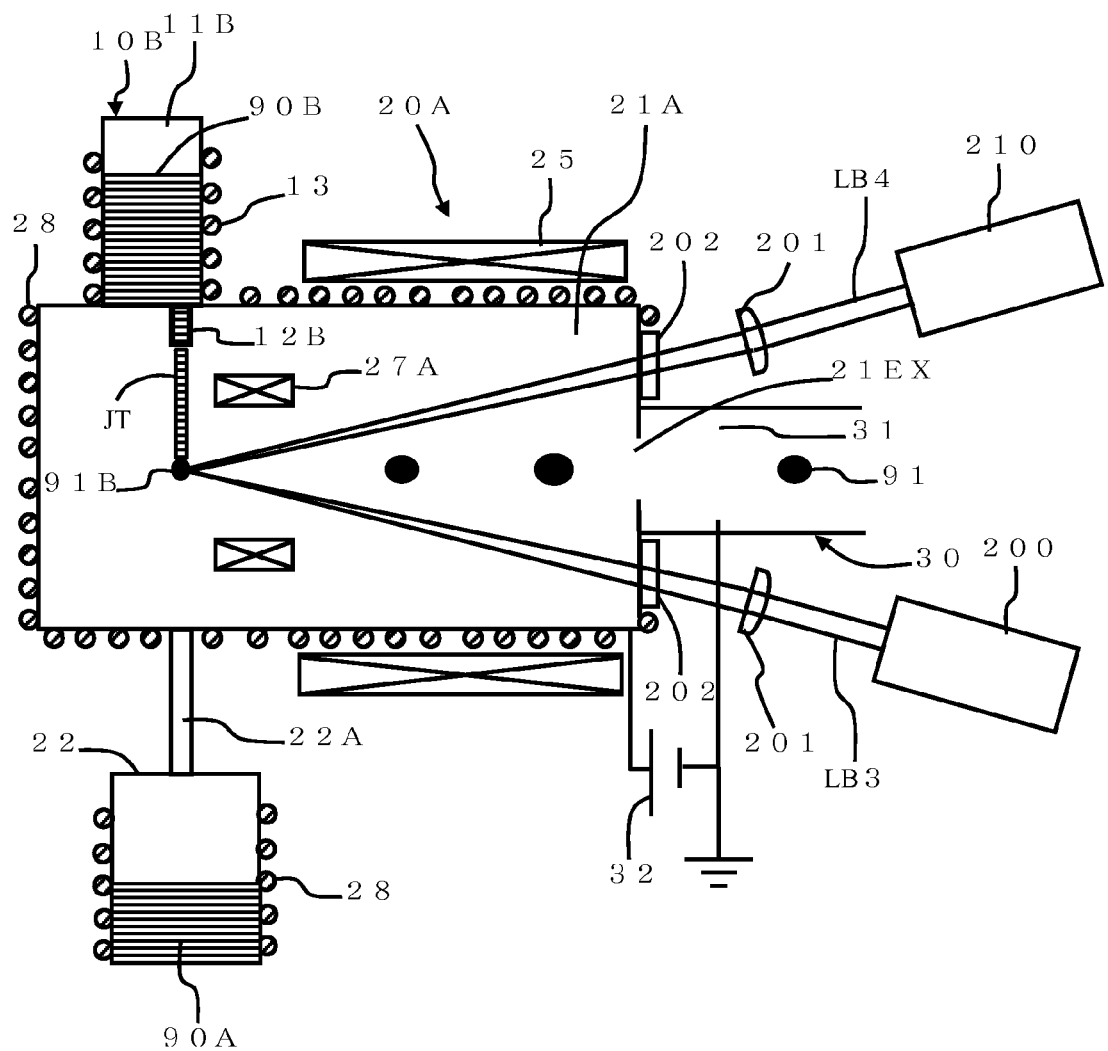
FIG. 10 is a diagram showing generation of an ionized target material according to a sixth embodiment.

A sixth embodiment will be described referring to FIG. 10. FIG. 10 is an explanatory diagram showing the essential portions of an EUV light source device according to the embodiment in enlargement. According to the embodiment, a target material 90B such as tin or stannane is supplied into the ionizer 20 in the form of a liquid jet.

A target supply device 10B retains the target material 90B in a tank 11B, and ejects the target material 90B as a fast gas stream through a nozzle 12B. Vaporization laser beam LB3 and ionization laser beam LB4 are irradiated on the liquid target material 90B at a predetermined point 91B. The embodiment with this configuration also has advantages similar to those of the first embodiment.

[Seventh Embodiment]

Figure 11:
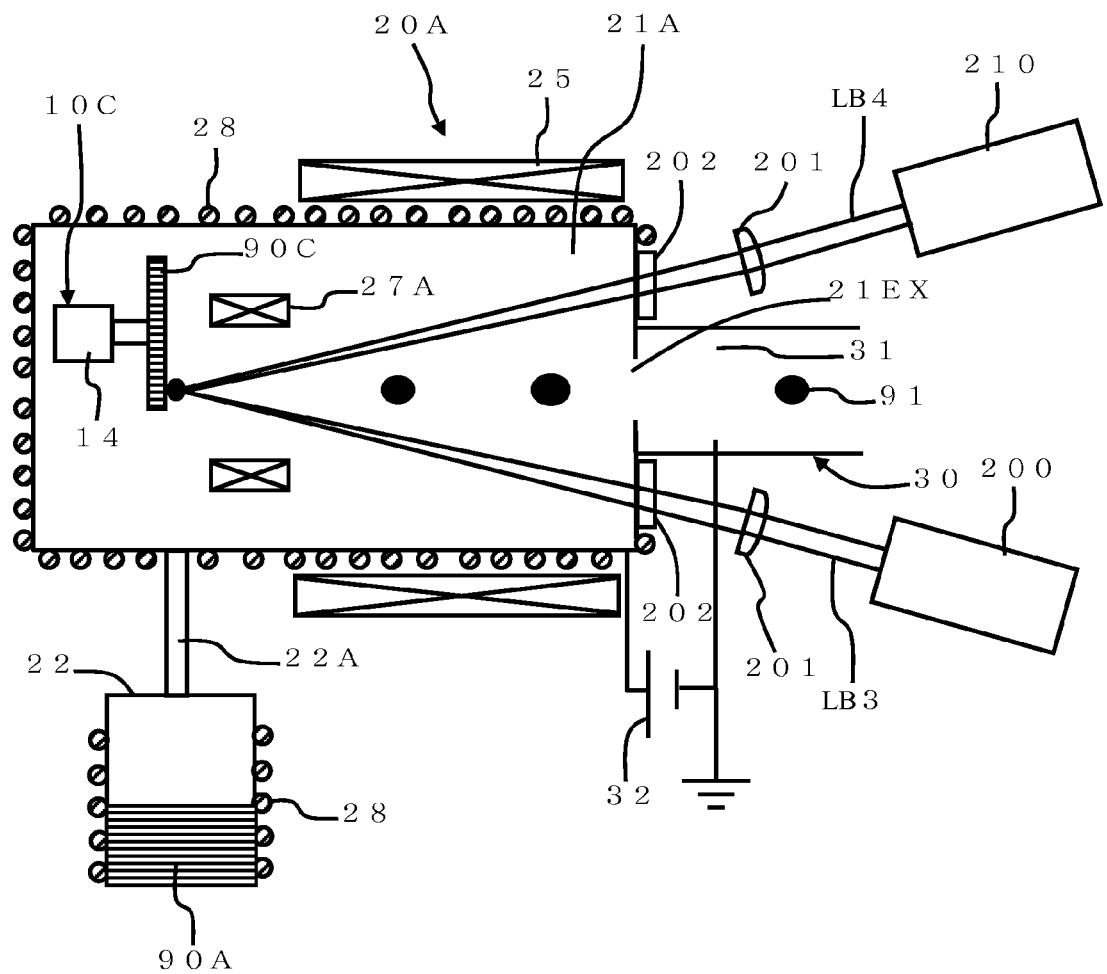
FIG. 11 is a diagram showing generation of an ionized target material according to a seventh embodiment.

A seventh embodiment will be described referring to FIG. 11. FIG. 11 is an explanatory diagram showing the essential portions of an EUV light source device according to the embodiment in enlargement. According to the embodiment, a disk-shaped material 90C is supplied to the ionizer 20.

A target supply device 10C rotates the disk-shaped material 90C by means of a rotary motor 14. According to the embodiment, vaporization laser beam LB3 and ionization laser beam LB4 are irradiated on the rotating disk-shaped material 90C, thus generating an ionized target material 91. The embodiment with this configuration also has advantages similar to those of the first embodiment. Note that the target material to be supplied can be formed on the top surface of a disk-shaped material.

[Eighth Embodiment]

Figure 12:
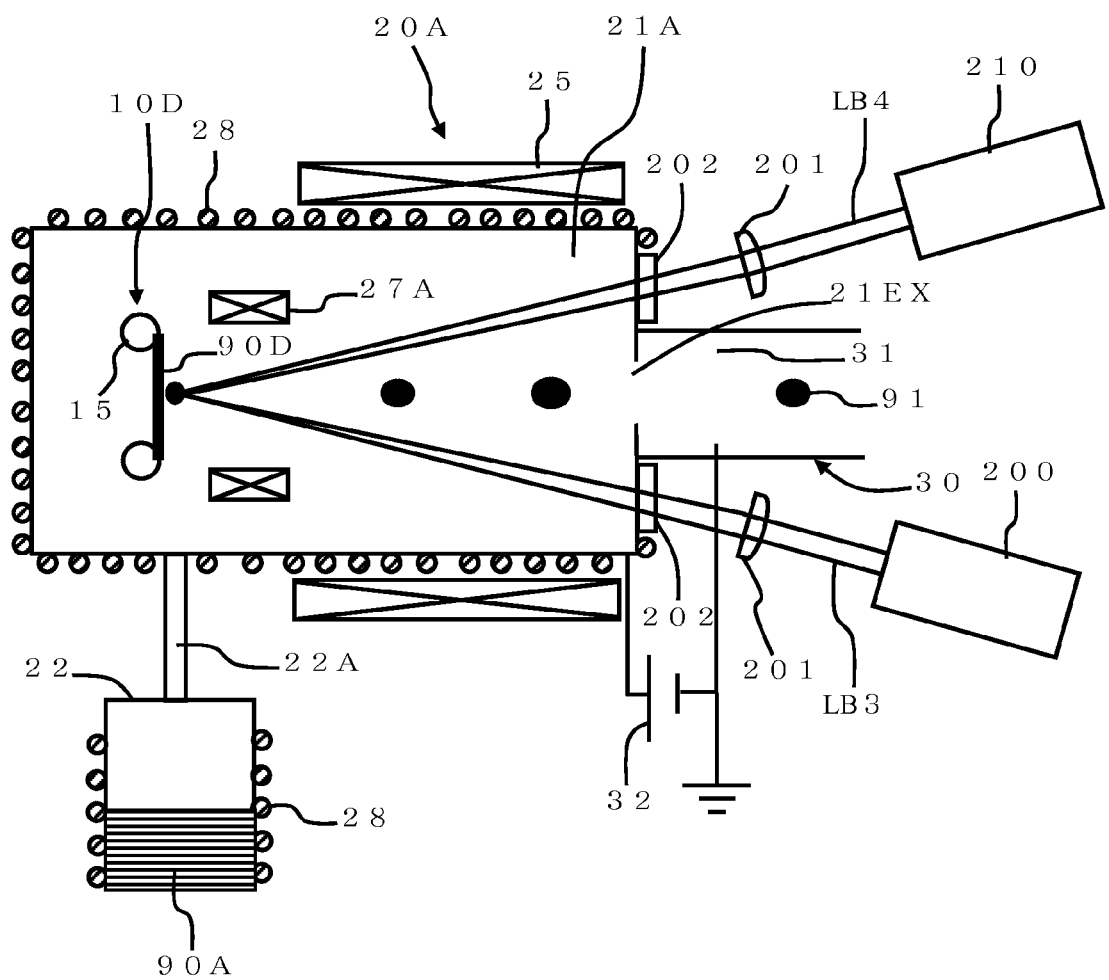
FIG. 12 is a diagram showing generation of an ionized target material according to an eighth embodiment.

An eighth embodiment will be described referring to FIG. 12. FIG. 12 is an explanatory diagram showing the essential portions of an EUV light source device according to the embodiment in enlargement. According to the embodiment, a target material is formed in a tape-like form or wire-like form, and then supplied to the ionizer 20. Note that the target material to be supplied can be formed on the top surface of a tape-like or wire-like material.

A target supply device 10D moves a target material 90D formed in a tape-like form or wire-like form by means of a feeding device 15. Vaporization laser beam LB3 and ionization laser beam LB4 are irradiated on the tape-like or wire-like target material 90D, thus generating an ionized target material 91. The embodiment with this configuration also has advantages similar to those of the first embodiment.

[Ninth Embodiment]

A ninth embodiment will be described referring to FIGS. 13 to 15. According to the embodiment, an electron beam 301 is used in place of the neutralizer 130 (see FIG. 6). The electron beam 301 serves to guide an ionized target material 91 to a predetermined position in the plasma generation chamber 60.

Figure 13:
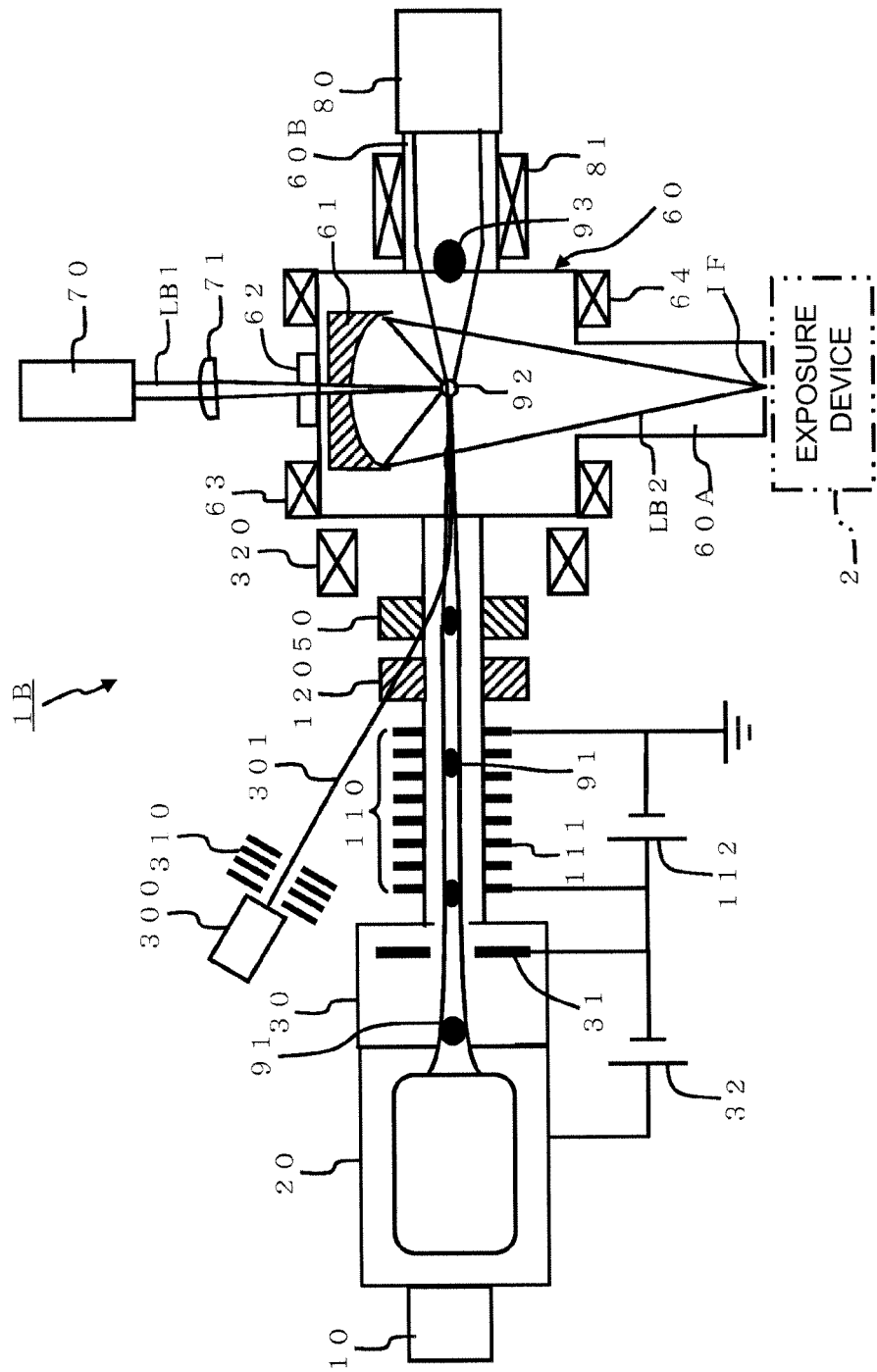
FIG. 13 is a diagram showing the general configuration of an EUV light source device according to a ninth embodiment.

FIG. 13 shows the general configuration of an EUV light source device 1B according to the embodiment. The EUV light source device 1B includes an electron gun 300 which outputs an electron beam in the traveling direction of an ionized target material 91 (ion beam), and an electromagnet 320 provided downstream of the convergence device 50 to generate a magnetic field.

An electron source which emits thermal electrons from a filament or the like, for example, can be used for electron gun 300 as the "electron beam output section". According to the embodiment, the ion current density (ion density) is set to be large. Accordingly, it is desirable to use the electron gun 300 where a large electron current can flow.

The electron gun 300 has a mechanism 310 which accelerates the electron beam output and converges the diameter of the electron beam. The electron-beam accelerating and converging mechanism 310 is configured as, for example, an electrostatic lens or the like.

The electromagnet 320 as the "fifth magnetic field generating section" generates a magnetic field for merging the ion beam 91 and the electron beam 301. The size of the electromagnet 320, if configured as a superconductive magnet, can be made smaller.

Figure 14:
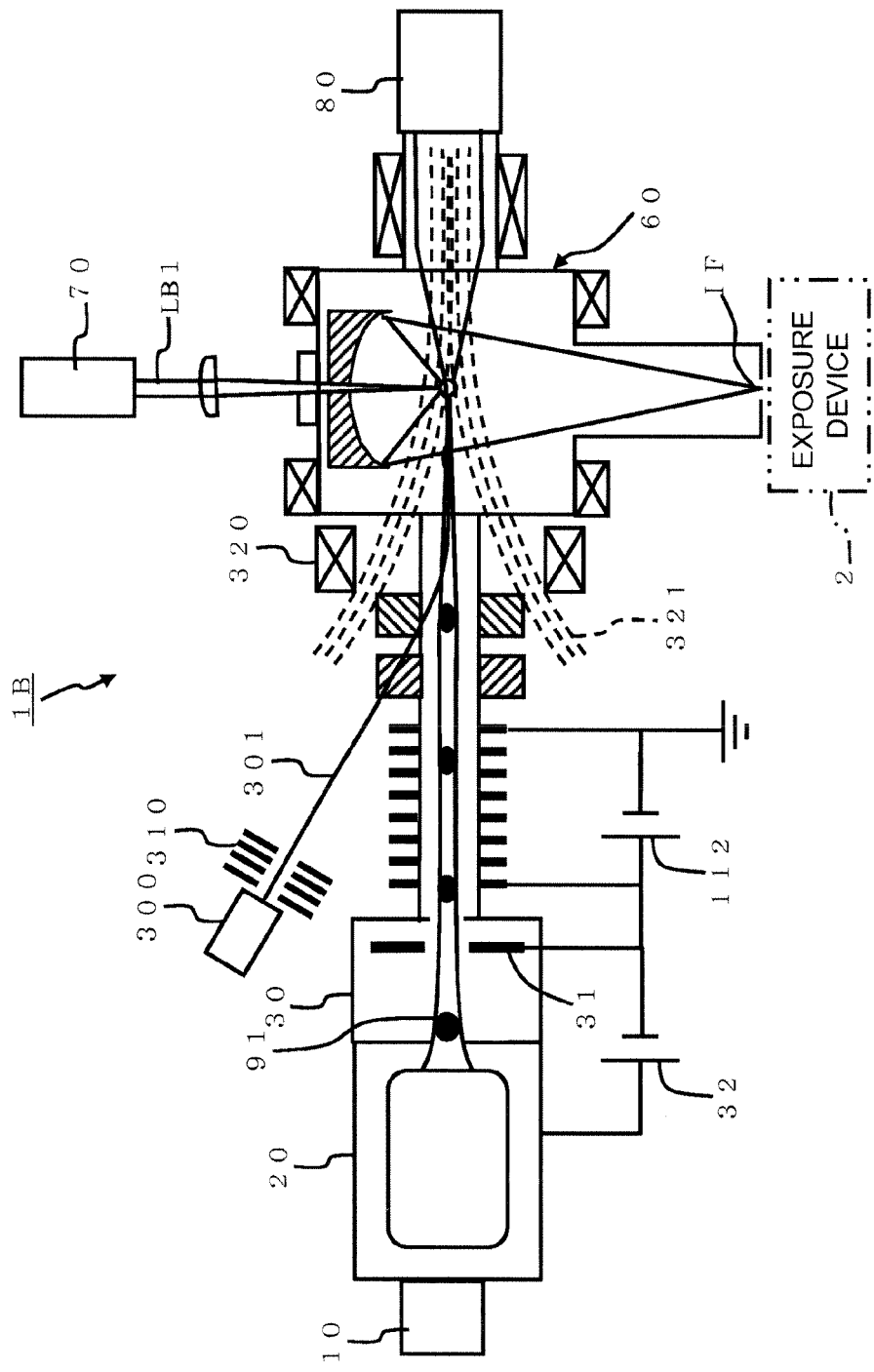
FIG. 14 is an explanatory diagram showing the relation between an electron beam and an ionized target material.

FIG. 14 is a general diagram showing the relation between the magnetic field generated by the electromagnet 320 and the ion beam 91. The electron beam 301 output from the electron gun 300 is accelerated and converged by the mechanism 310 to be output toward the ion beam 91. At this time, the locus of the electron beam 301 is bent in a direction parallel to the ion beam 91 by the magnetic field generated by the electromagnet 320, and travels toward the interior of the plasma generation chamber 60.

The electron beam 301 is set in such a way as to have an electron energy of, for example, several tens of electron volts (eV) or higher, and an electron density of several tens of amperes (A)/cm$^2$ for the following reasons.

First, the electron energy needs to be several tens of eV so as not to electrically neutralize the ion beam 91. Because the ion beam 91 has positive charges, the ion beam 91 tends to catch electrons in the electron beam 301 to be electrically neutralized. The strength of the action of the ion beam 91 to return to the electrically neutral state is expressed by the value of a recombination cross section.

The recombination cross section is a function of the speed of electrons (i.e., energy), and becomes maximum when the electron energy is several eV. That is, slow electrons travel indicates that the electrons are likely to be attracted by the positive charges and easily recombined.

According to the embodiment, the ion beam 91 is shaped using the property of the ions. Therefore, the electron beam 301 is used in the region where the electron energy becomes equal to or greater than several tens of eV so that ions and electrons are not recombined.

Next, the conditions for the current density will be described. According to the embodiment, as described above, the ion beam 91 is attracted by the spatial charges of the electrons, thereby converging the diameter of the ion beam 91. This requires that the current density of the electron beam 301 should be greater than the current density of the ion beam 91. Because the current density of the ion beam 91 is several amperes/cmm$^2$, the current density of the electron beam 301 should be set to several tens of amperes/cmm$^2$.

The electron beam 301 can be generated continuously or intermittently. In case of continuously generating the electron beam 301, the electron beam 301 need not be synchronized with the ion beam 91, thus ensuring a simpler control structure. However, the power consumption increases. In case of intermittently generating the electron beam 301, the power consumption can be reduced. However, it is necessary to synchronize the timing of generating the electron beam 301 with the timing of generating the ion beam 91, thus complicating the control structure.

According to the embodiment with the foregoing configuration, as the electron beam 301 is irradiated in parallel to the ion beam 91, the ion beam 91 can be supplied into the plasma generation chamber 60 while being converged.

[Tenth Embodiment]

A tenth embodiment will be described referring to FIGS. 15 and 16. A method of synchronizing the timing for generating an ionized target material 91 with the timing for generating will be described in the description of the embodiment.

In the embodiments shown in FIGS. 2, 10, 11 and 12 after a target material 90 is vaporized by vaporization laser beam, ionization laser beam is irradiated thereon to generate an ionized target material 91. The generated ionized target material 91 is accelerated by the accelerating tube 110. The conditions (voltage, current, time modulation, etc.) for the operations vary according to the conditions of generating a target material. Accordingly, the EUV generation time changes according to the target generation time.

The target material generating conditions include the type, temperature and state (solid or liquid) of the target material, and the energy, output, pulse width and wavelength of laser beam. Basically, if synchronization is taken based on the irradiation timing for vaporization laser beam, laser beam from the driver laser light source can be irradiated on the target material.

Figure 15:
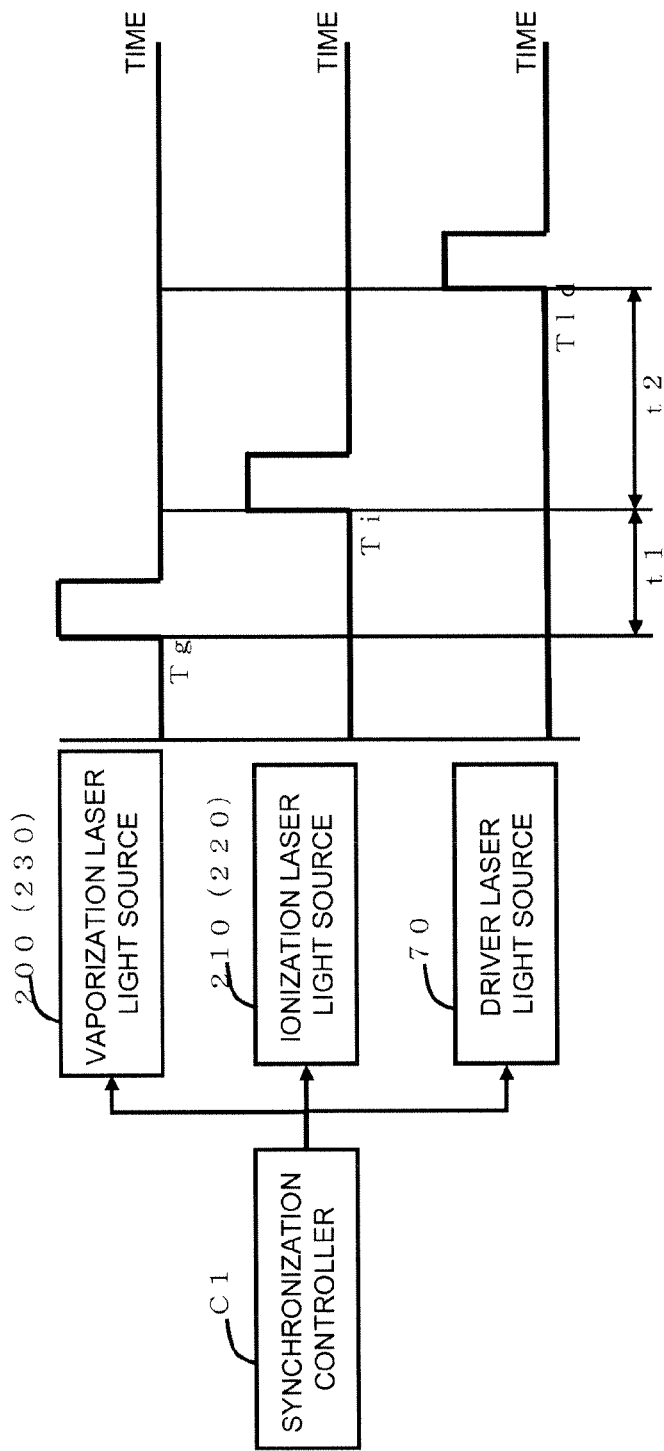
FIG. 15 is a time chart illustrating timings for laser light sources according to a tenth embodiment.
Figure 16:
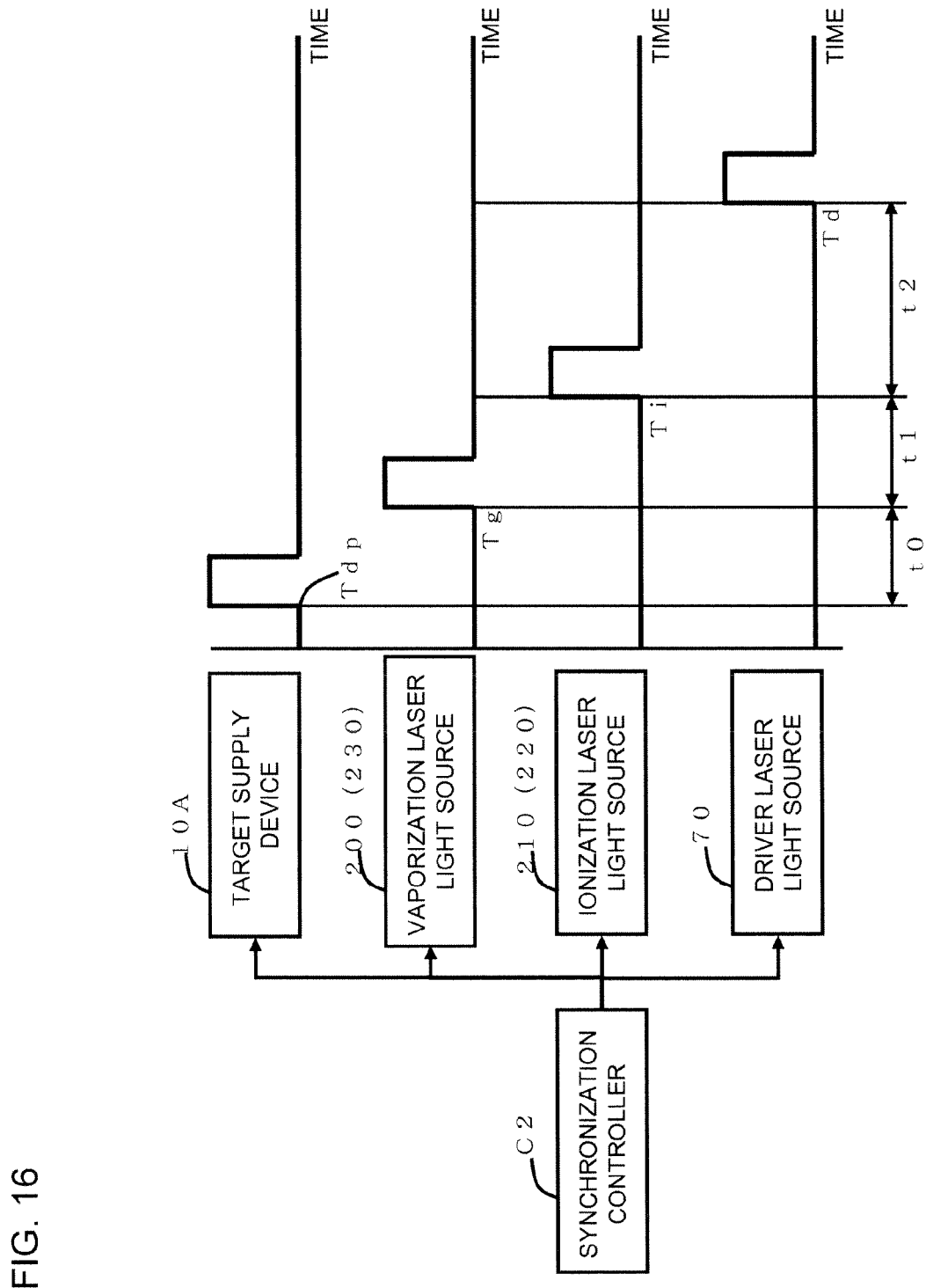
FIG. 16 is another time chart illustrating timings for laser light sources.

FIG. 15 shows one example of setting the irradiation timing for the driver laser beam with an irradiation timing Tg for vaporization laser beam being a reference. Let t1 be a delay time between the irradiation timing Tg for vaporization laser beam and irradiation timing Ti for ionization laser beam, and t2 be a delay time between the irradiation timing Ti for ionization laser beam and irradiation timing Tld for driver laser beam. The times t1 and t2 are controlled by a synchronization controller C1. t1 and t2 are set to optimal values for efficiently generating EUV radiation.

Because a vaporization laser light source is not used in the embodiment shown in FIG. 7, only t2 should be controlled. In the embodiment shown in FIG. 8, t1 and t2 are optimized with vaporization laser beam being replaced with an electron beam.

Because a target material is intermittently supplied as droplets in the embodiment shown in FIG. 9, the number of variables for synchronization is increased. Accordingly, let t0 be a delay time from generation of droplets to the operation of the vaporization laser light source. A synchronization controller C2 controls t0, t1, and t2.

According to the embodiment with this configuration, the delay times t1 and t2 (or t0, t1 and t2) can be controlled individually. For example, a process of dropping droplets, a process of vaporizing droplets, and a process of ionizing droplets can be controlled with different accuracies, respectively.

[Eleventh Embodiment]

Figure 17:
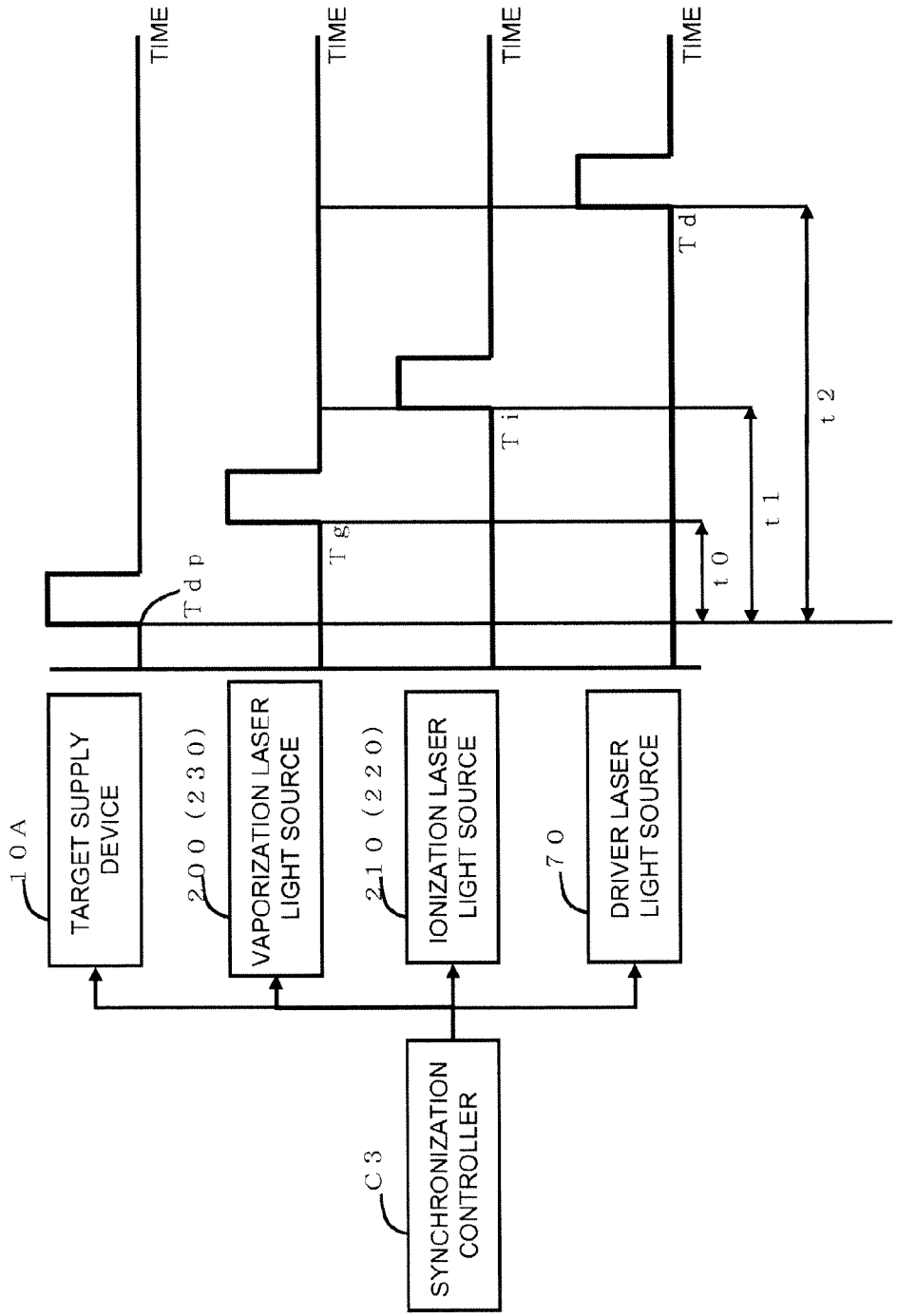
FIG. 17 is a time chart illustrating timings for laser light sources according to an eleventh embodiment.

An eleventh embodiment will be described referring to FIG. 17. According to the embodiment, the reference time for synchronization is matched with the process that is executed at the earliest timing. A synchronization controller C3 according to the embodiment sets the timing of generating droplets as the reference timing for synchronization. This configuration can ensure synchronization with a simpler structure.

[Twelfth Embodiment]

Figure 18:
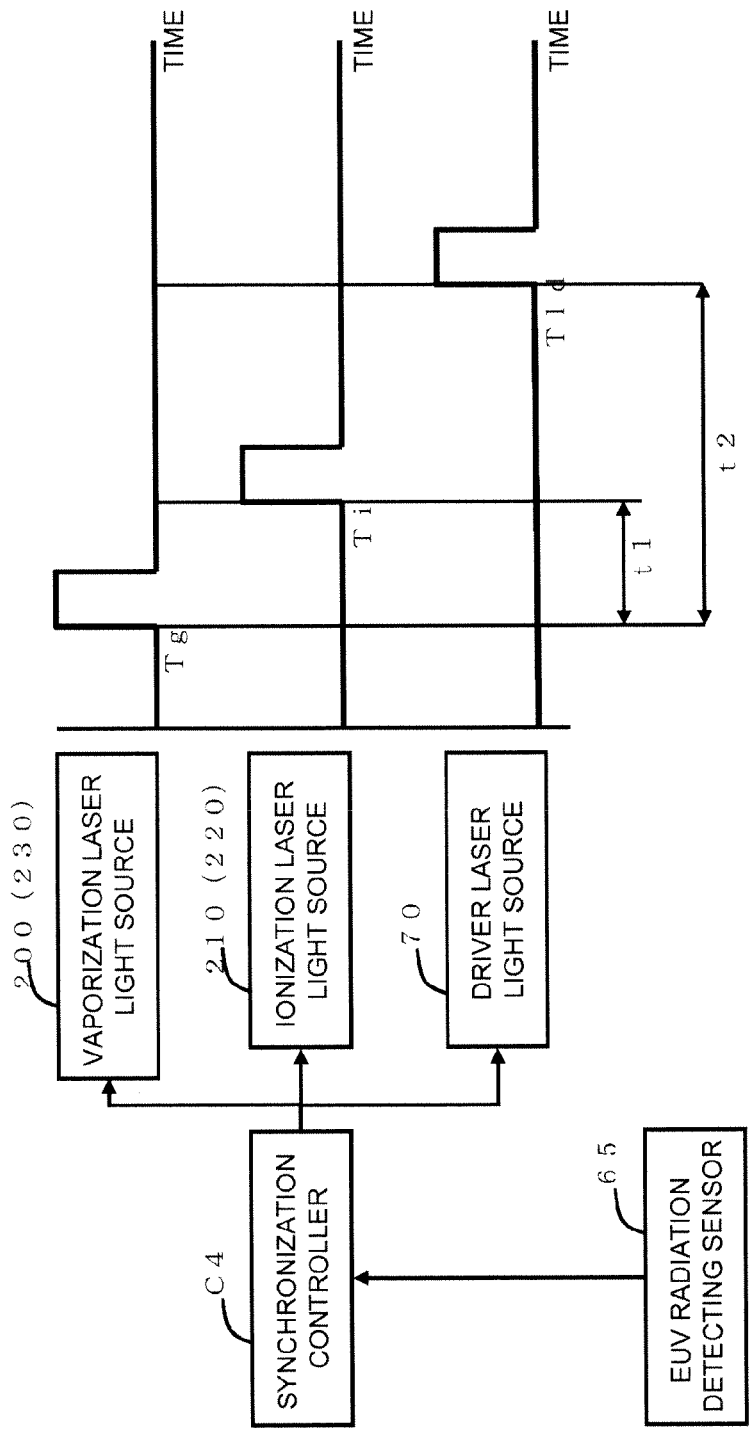
FIG. 18 is a time chart illustrating timings for laser light sources according to a twelfth embodiment.

A twelfth embodiment will be described referring to FIG. 18. According to the embodiment, an EUV radiation detecting sensor 65 detects the output of EUV radiation, and feeds back the detection signal to a synchronization controller C4 to adjust t1 and t2 to optimal values. The embodiment may be combined with the embodiment shown in FIG. 17.

For example, before operation of the exposure device, EUV radiation is repeatedly generated with times t1 and t2 being changed gradually, and the output of the EUV radiation is detected by the sensor 65. This makes it possible to acquire t1 and t2 that provide the optimal EUV radiation. t1 and t2 are set to, for example, times that can provide the maximum EUV radiation. Alternatively, t1 and t2 can also be set in such a way as to provide a demanded EUV radiation output from the exposure device 2. That is, t1 and t2 may be set to values that reduce the generation efficiency of EUV radiation.

[Thirteenth Embodiment]

A thirteenth embodiment will be described referring to FIGS. 19 to 21. According to the embodiment, a groove portion 910 is formed in a disk-shaped target material 90E, and a replenishment section 920 is provided to restore the top surface of the disk-shaped target material 90E.

Figure 19:
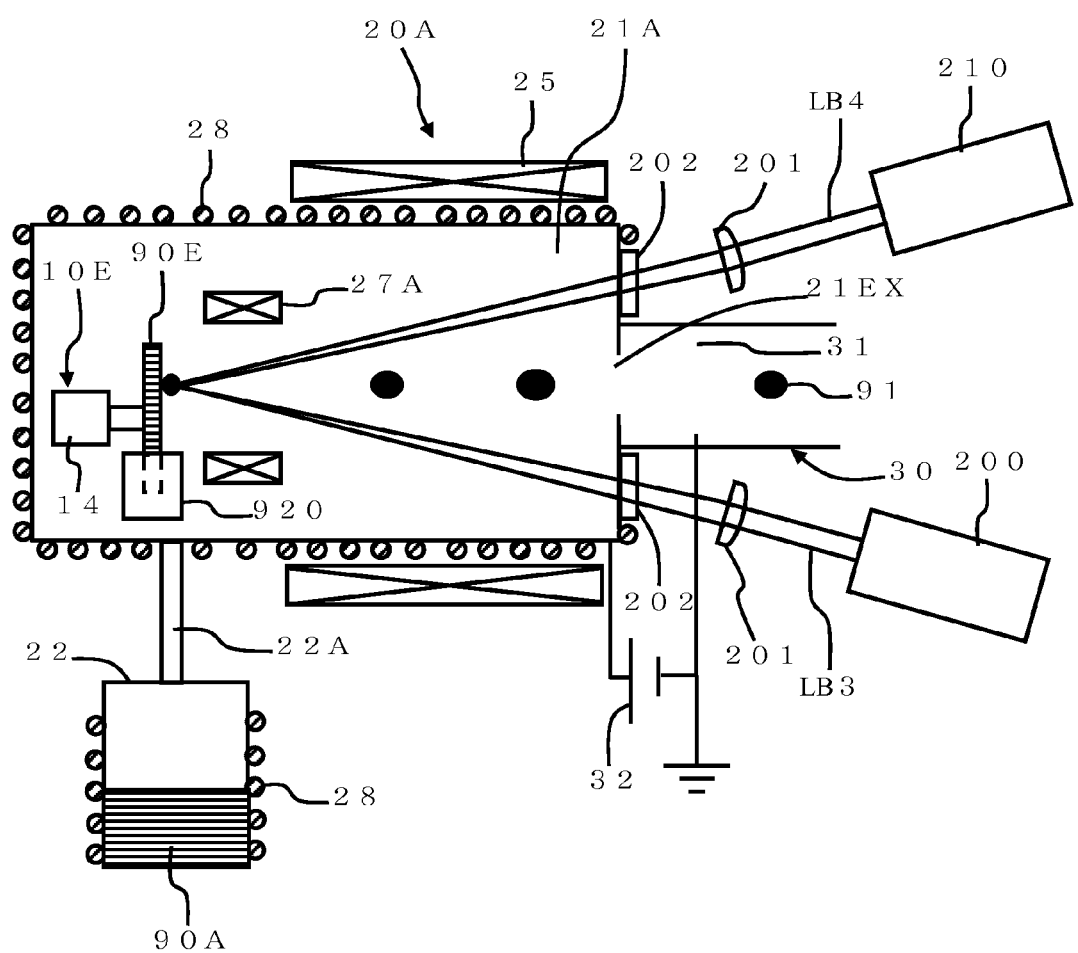
FIG. 19 is a diagram showing generation of an ionized target material according to a thirteenth embodiment.
Figure 20:
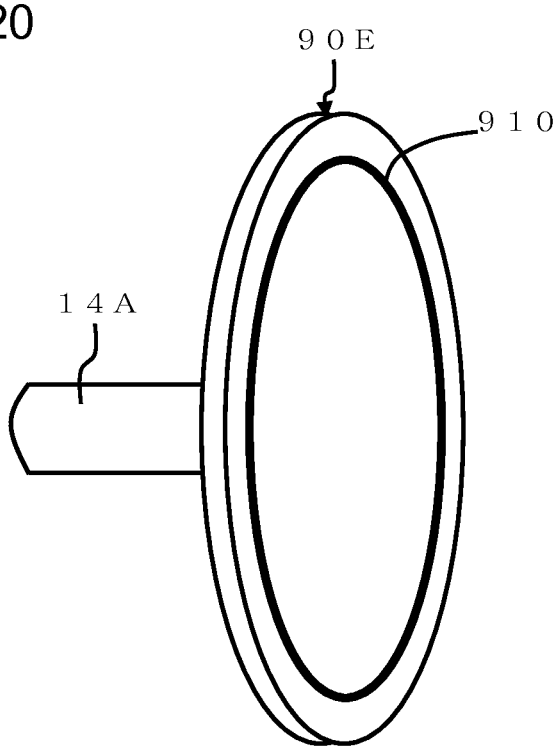
FIG. 20 is a perspective view of a disk-shaped target material having a groove.

FIG. 19 is an explanatory diagram showing the disk-shaped target material 90E embodiment generation of a target material supply section 10E. According to the embodiment, the disk-shaped target material 90E is used. As shown in FIG. 20, the groove portion 910 is formed in a ring shape in one side of the disk-shaped target material 90E (side where laser beam is irradiated).

The other side of the disk-shaped target material 90E is rotatably supported by a rotary shaft 14A of a rotary section 14. The replenishment section 920 is provided in such a way as to retain the lower side of the disk-shaped target material 90E. More specifically, the replenishment section 920 is arranged so that the lower portion of the groove portion 910 is soaked with the liquid target material.

When the disk-shaped target material 90E rotates, the liquid target material is deposited in and around the groove portion 910, thereby restoring the radiation surface of the disk-shaped target material 90E. Even if the disk-shaped target material 90E is damaged by irradiation of the laser beam, therefore, the liquid target material can be immediately applied thereto to restore the disk-shaped target material 90E.

For example, the liquid target material can be obtained by dissolving the target material into a solvent. In case where the target material is a metal, the liquid target material can be obtained by setting the temperature of the replenishment section 920 equal to or higher than the melting point.

Figure 21:
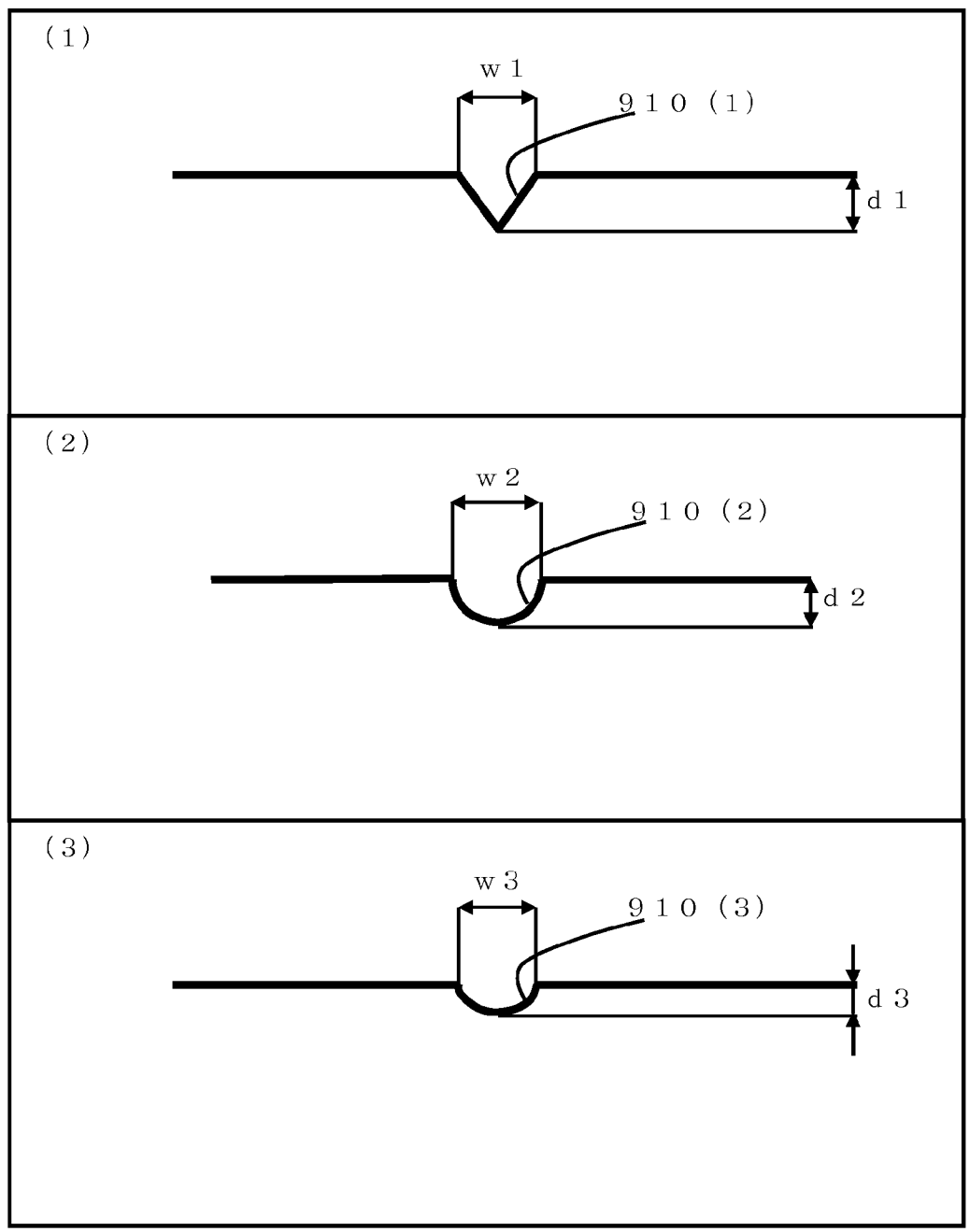
FIG. 21 is a diagram showing the cross-sectional shapes of grooves.

FIG. 21 shows the cross-sectional shapes of the groove portions 910. As shown in FIG. 21(1), the cross section of the groove portion 910 can be formed into an inverted triangular shape. As shown in FIG. 21(2), the cross section of the groove portion 910 can be formed into a semicircular shape. As shown in FIG. 21(3), the cross section of the groove portion 910 can also be formed into a semielliptic shape.

The width w1, w2, w3 of the groove portion 910 can be set to a desired value according to the irradiation area or the like of laser beam. The depth d1, d2, d3 of the groove portion 910 can likewise be set to a desired value. As one example, w1, w2, w3 and d1, d2, d3 can be set to about 0.5 mm. Note that the groove portion 910 may have a cross-sectional shape other than the one shown in FIG. 21.

The target material can be efficiently turned into plasma by irradiating laser beam toward the groove portion 910. This is because the groove portion 910 increases the irradiation area of laser beam, makes it difficult for the generated plasma to be diffused from the groove portion 910.

Because the liquid target material in the replenishment section 920 is applied to the laser beam irradiating surface of the disk-shaped target material 90E, the disk-shaped target material 90E need not be formed by the target material. In consideration of heat capacity, thermal conductivity, rigidity, and the like, for example, a rotary body having groove portion 910 may be formed of another material like diamond. The rotary body corresponds to the target material supply body.

The embodiment with the above configuration can stabilize the state of the surface where laser beam is irradiated, thus suppressing a variation in the intensity of EUV radiation. Further, vaporization and ionization of the target material can be carried out efficiently by the groove portion 910.

[Fourteenth Embodiment]

Figure 22:
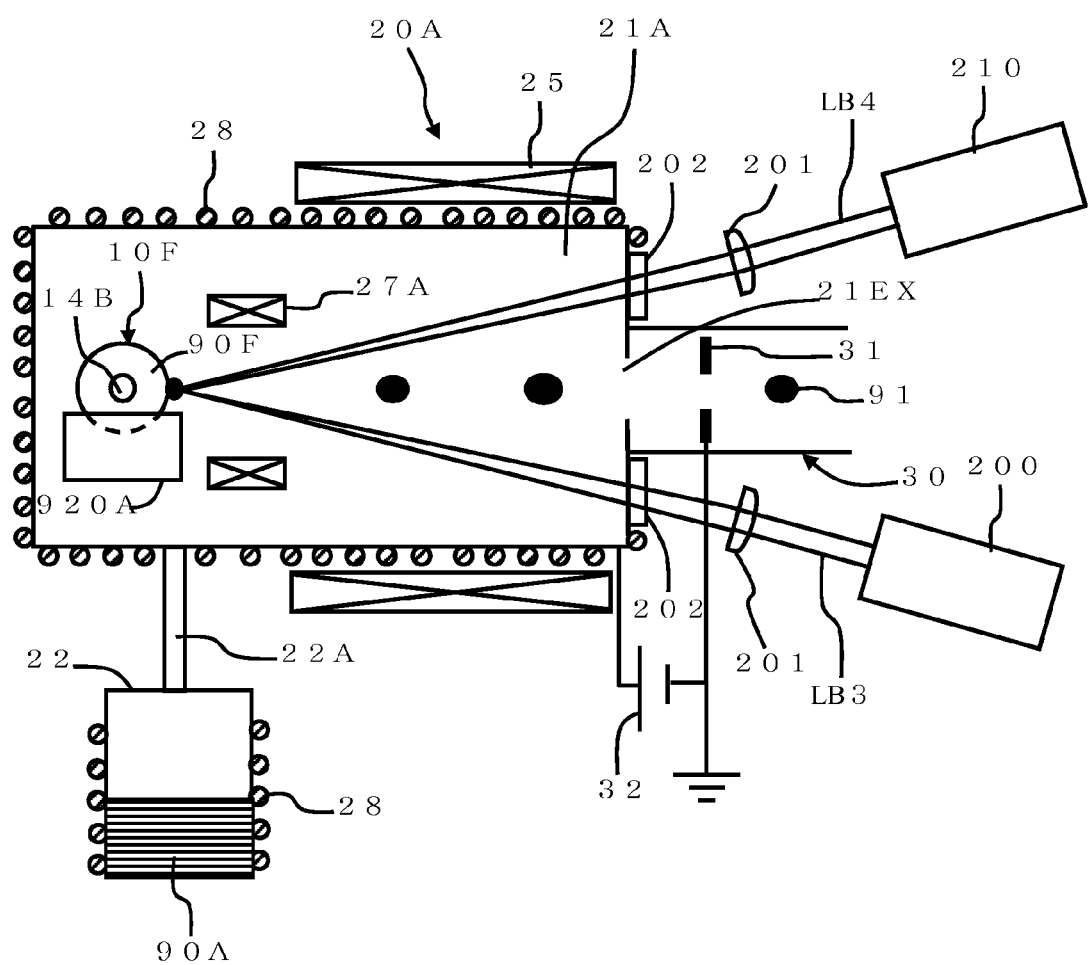
FIG. 22 is a diagram showing generation of an ionized target material according to a fourteenth embodiment.
Figure 23:
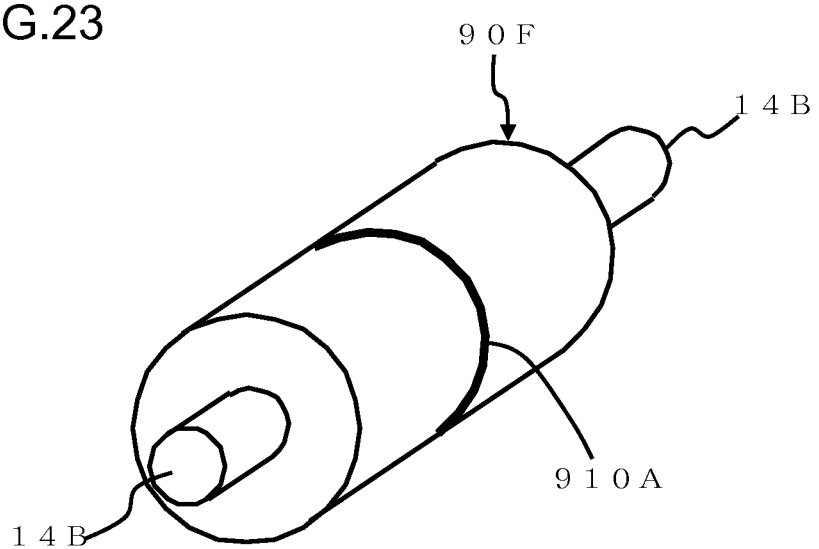
FIG. 23 is a perspective view of a drum type target material having a groove.

A fourteenth embodiment will be described referring to FIGS. 22 and 23. A target material supply section 10F according to the embodiment uses a cylindrical target material 90F. As shown in a perspective view of FIG. 23, the cylindrical target material 90F has a groove portion 910A formed in such a way as to go around the center portion of the peripheral surface.

Both axial end portions of the cylindrical target material 90F are rotatably supported by a rotary shaft 14B of the rotary section 14. Further, a repairing section 920A is provided in such a way that at least a part of the lower portion of the cylindrical target material 90F is soaked with the liquid target material.

Note that the cylindrical target material 90F can be formed of a material different from the target material as per the thirteenth embodiment. The groove portion 910A can be formed into various shapes as shown in FIG. 21.

The embodiment with this configuration also has advantages similar to those of the thirteenth embodiment. Further, according to the embodiment, the use of the cylindrical target material 90F can make the volume larger to increase the heat capacity. When laser beam is irradiated on the groove portion 910A, therefore, the influence of the irradiation of the laser beam on a thermal change can be made smaller. It is therefore possible to stabilize the density or the like of ions generated by laser beam, so that the ionized target material 91 can be generated stably.

In addition, both rotary-axial ends of the cylindrical target material 90F are supported according to the embodiment, the rotation can be made more stable as compared with the case where only one end is supported. Therefore, the combination of the action to stabilize the rotation and prevention of a thermal change originated from the aforementioned increase in heat capacity can case the ionized target material 91 to be generated more stably.

[Fifteenth Embodiment]

Figure 24:
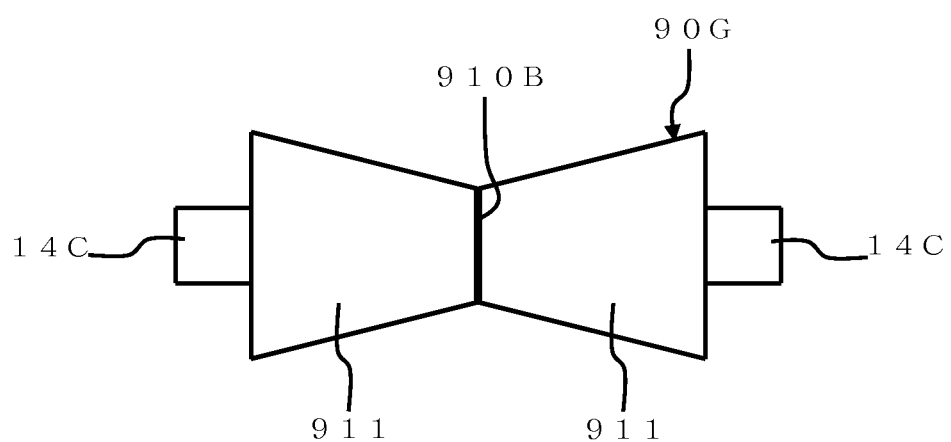
FIG. 24 is a diagram showing generation of an ionized target material according to a fifteenth embodiment.

A fifteenth embodiment will be described referring to FIG. 24. According to the embodiment, a taper 911 tilting downward toward the axial center portion is provided on the peripheral surface of a cylindrical target material 90G. That is, the cylindrical target material 90G is constricted in the center portion of the cylinder, and has a groove portion 910B provided in such a way as to go around the center portion.

Note that the cylindrical target material 90G can be formed of a material different from the target material as per the fourteenth embodiment. Further, the groove portion 910B can be formed into various shapes as shown in FIG. 21.

[Sixteenth Embodiment]

Figure 25:
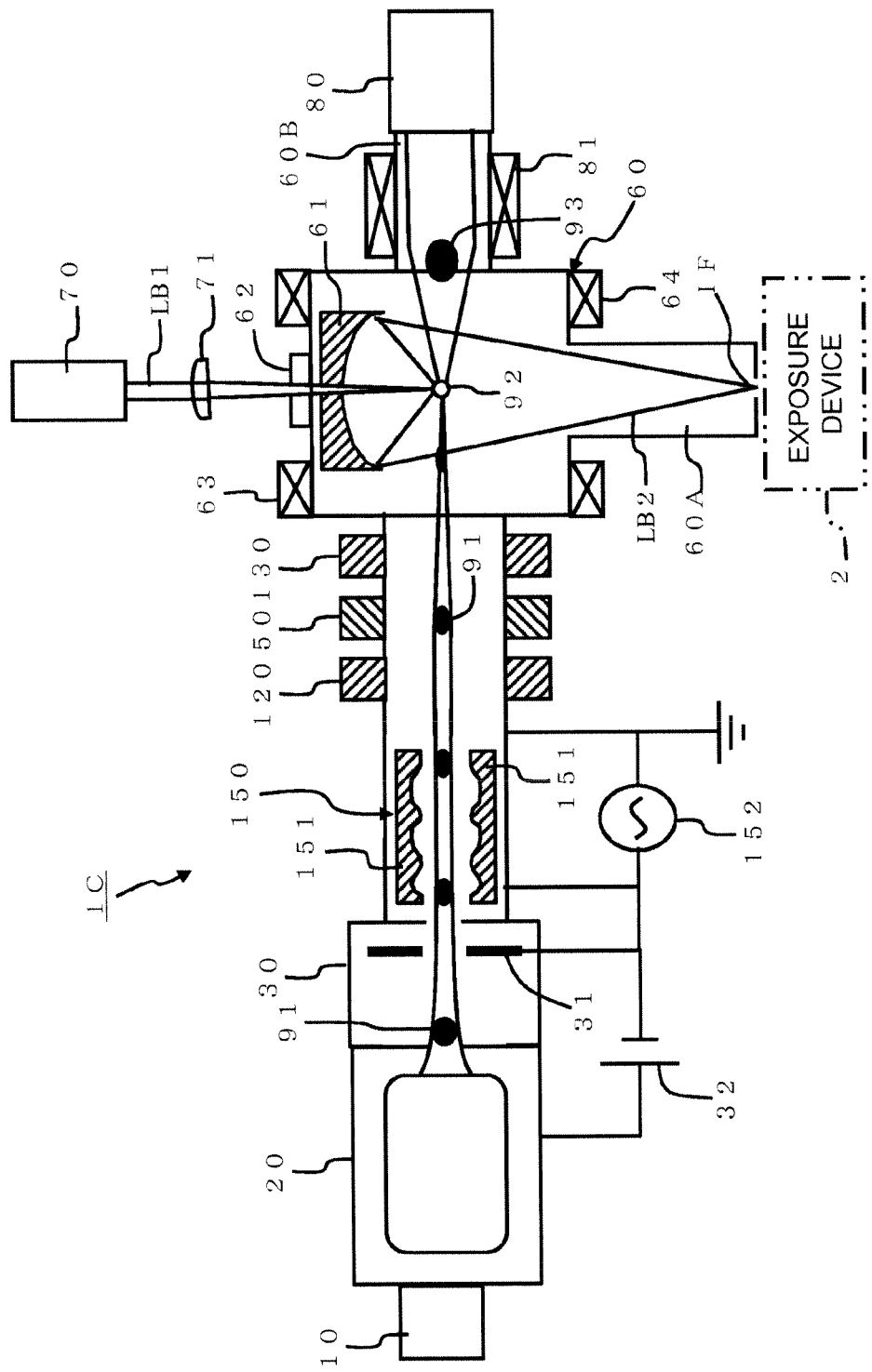
FIG. 25 is a diagram showing the general configuration of an EUV light source device according to a sixteenth embodiment.

A sixteenth embodiment will be described referring to FIGS. 25 to 27. A specific example of the accelerating tube 110 (see FIG. 6) will be described in the descriptions of this embodiment and several embodiments to be discussed below. According to the embodiment, a radio-frequency quadrupole linear accelerator (RFQ: Radio-Frequency Quadrupole Linac) 150 is used as a specific example of the accelerating tube 110. Hereinafter, this accelerator 150 will be called RFQ 150.

Figure 26:
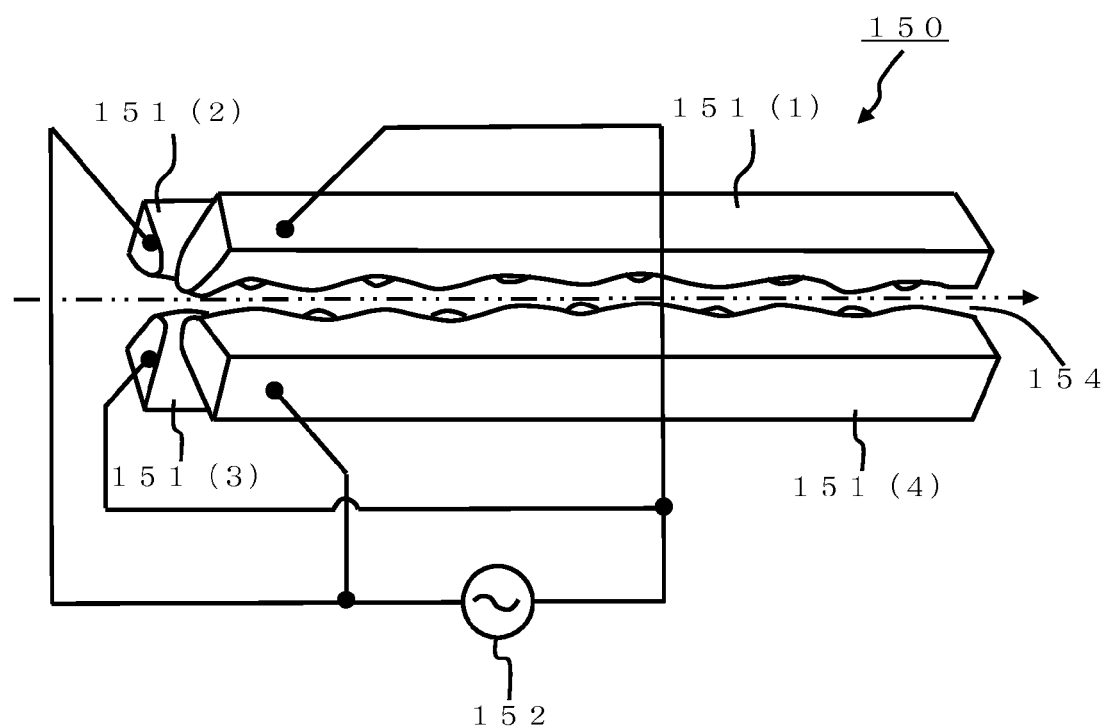
FIG. 26 is a perspective view showing a quadrupole electrode as an accelerating tube.

FIG. 26 is a perspective view showing electrodes 151 of the RFQ 150. Four electrodes 151(1) to 151(4) in total are each formed as a rod-like electrode which has an approximately wedge-like cross section. The opposing two electrodes make a set, and the angle defined by the two set of electrodes is set to 90 degrees. A high-frequency voltage is applied to each of the electrodes 151(1) to 151(4) from a high-frequency voltage source 152. Each of those electrodes will be called "electrode 151" unless they should be distinguished.

A cavity 154 is formed at the center portion the individual electrodes face. As indicated by a two-dot chain line arrow in FIG. 26, an ionized target material 91 enters the cavity 154 from one side of the lengthwise direction of the electrodes 151, passes through the cavity 154, and goes out from the other side of the lengthwise direction of the electrodes 151.

Figure 27:
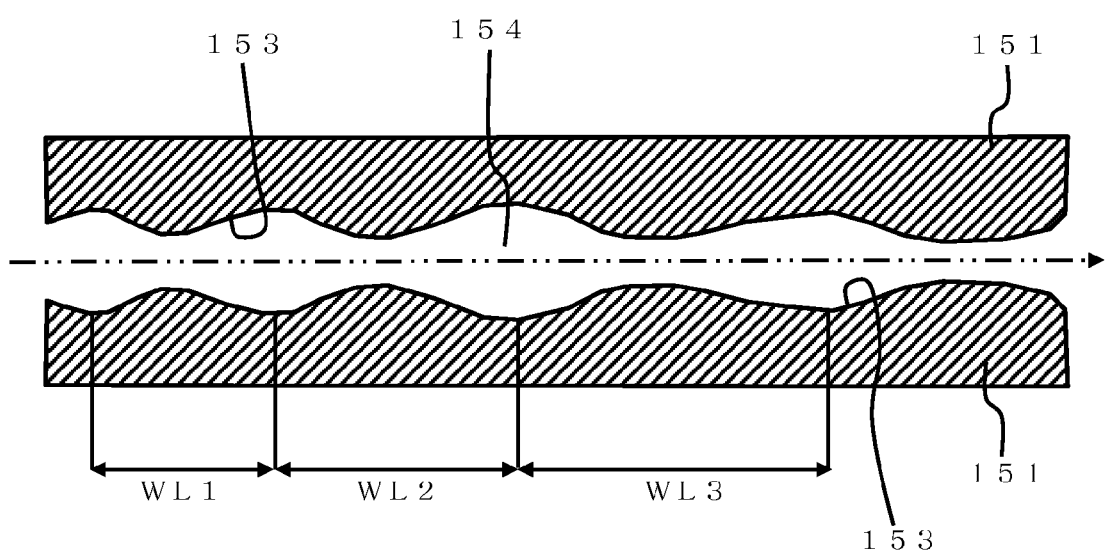
FIG. 27 is a cross-sectional view of the quadrupole electrode.

FIG. 27 is a cross-sectional view of a pair of electrodes 151. A surface 153 of the electrode 151 which faces the other electrode 151 is formed into an approximately sinusoidal shape. The wavelength of the sinusoidal surface 153 is so set as to gradually become longer in the traveling direction of the ionized target material 91.

In the example in FIG. 27, the inlet-side sinusoidal surface where the ionized target material 91 enters has a wavelength WL1. The wavelength of the middle portion continual to the inlet-side sinusoidal surface is WL2 longer than WL1 (WL2>WL1). The wavelength of the outlet-side sinusoidal surface continual to the middle portion is WL3 longer than WL2 (WL3>WL2).

The convergence, compression and acceleration of the ionized target material 91 can be carried out simultaneously by applying a high-frequency voltage to the individual electrodes 151 configured in the above manner. See p 492-493 in "Principles of Charged Particle Acceleration written by Stanley Humphries, Jr. (published by John Wiley & Sons, Inc.) for the detailed operational principle of the RFQ 150.

According to the embodiment, the use of the RFQ 150 as an accelerating tube can allow the convergence, compression and acceleration of the ionized target material 91 to be carried out simultaneously. Therefore, the RFQ 150 can serve as the convergence device 50 or the compressor 120.

[Seventeenth Embodiment]

Figure 28:
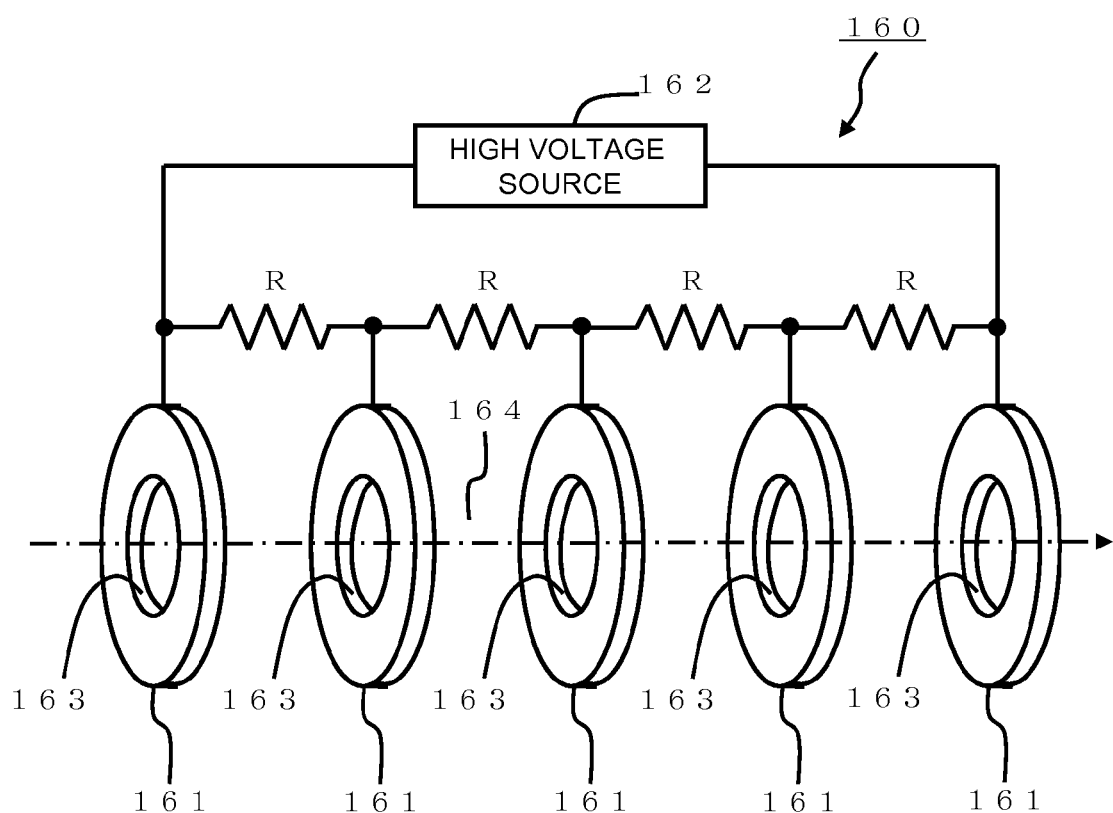
FIG. 28 is an explanatory diagram of an electrostatic accelerating tube having ring-like electrodes according to a seventeenth embodiment.
Figure 29:
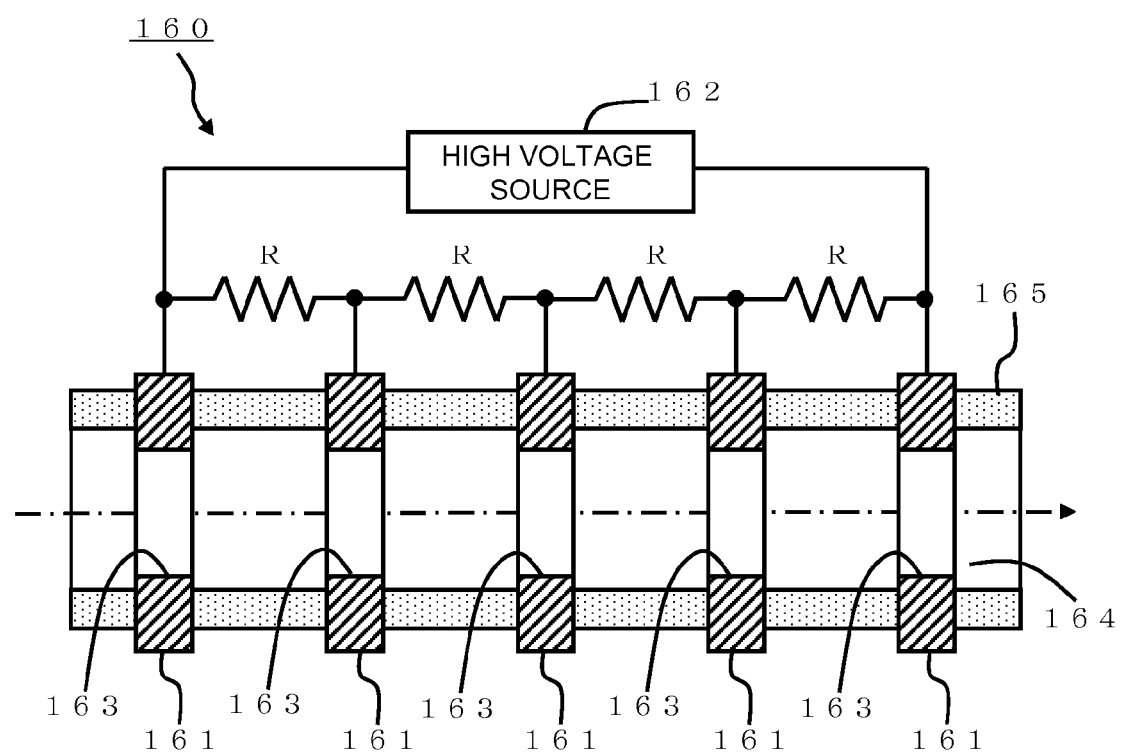
FIG. 29 is a cross-sectional view of the electrostatic accelerating tube.

A seventeenth embodiment will be described referring to FIGS. 28 and 29. According to the embodiment, an electrostatic accelerating tube 160 is used as another specific example of the accelerating tube 110. FIG. 28 is a diagram showing the schematic configuration of the electrostatic accelerating tube 160, and FIG. 29 is a cross-sectional view of the electrostatic accelerating tube 160.

The electrostatic accelerating tube 160 is configured by arranging a plurality of disk-shaped electrodes 161 at equal intervals in the coaxial direction. A hole 163 through which an ionized target material 91 passes is formed in the center of each disk-shaped electrode 161.

The disk-shaped electrodes 161 are connected to a high voltage source 162. An equal voltage is applied between the electrodes.

The individual disk-shaped electrodes 161 are attached to a cylindrical support 165. The cylindrical support 165 is formed of a material having an electrical insulating property. A passage 164 including the individual holes 163 is formed in the cylindrical support 165. The interior of the passage 164 is held in a vacuum state.

As indicated by a one-dot chain line arrow in the diagrams, the ionized target material 91 passes through the passage 164 rightward from the left side in the diagrams. Every time the ionized target material 91 passes through the hole 163 of each disk-shaped electrode 161, the ionized target material 91 is accelerated.

[Eighteenth Embodiment]

Figure 30:
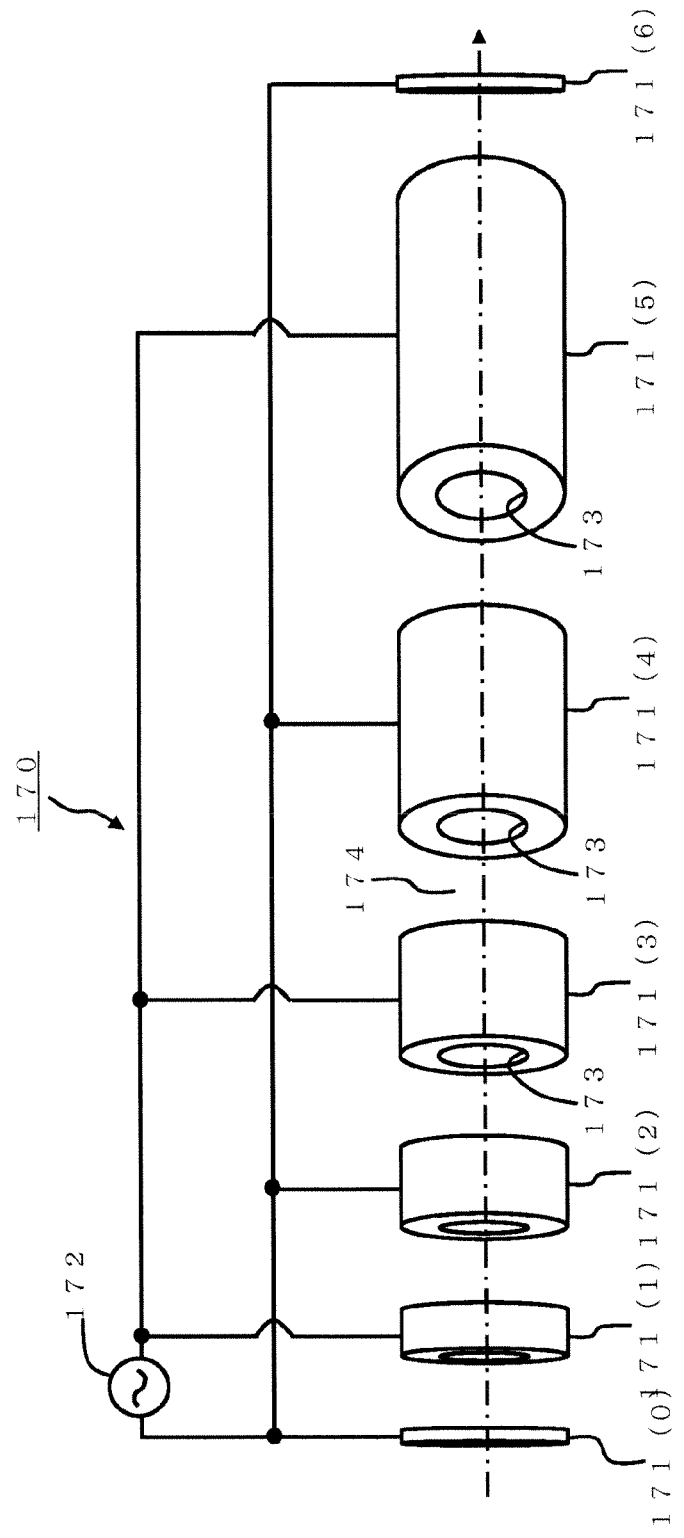
FIG. 30 is an explanatory diagram of a linear accelerating tube having cylindrical electrodes according to an eighteenth embodiment.

An eighteenth embodiment will be described referring to FIGS. 30 and 31. According to the embodiment, a liner accelerating tube 170 is used as a mimic example of the accelerating tube 110. FIG. 30 is a diagram showing the schematic configuration of the liner accelerating tube 170, and FIG. 31 is a cross-sectional view of the liner accelerating tube 170.

The liner accelerating tube 170 is configured by arranging a plurality of cylindrical electrodes 171(1) to 171(5) coaxially at equal intervals. A thin annular electrode 171(0) is provided on the inlet side (left side in FIG. 30) where an ionized target material 91 enters, and another thin annular electrode 171(6) is provided on the outlet side (right side in FIG. 30) from which the ionized target material 91 leaves.

A hole 173 through which the ionized target material 91 passes is formed in the center of each of the cylindrical electrodes 171(1) to 171(5). The axial lengths of the cylindrical electrodes 171(1) to 171(5) are so set as to become longer in order in the traveling direction of the ionized target material 91.

Figure 31:
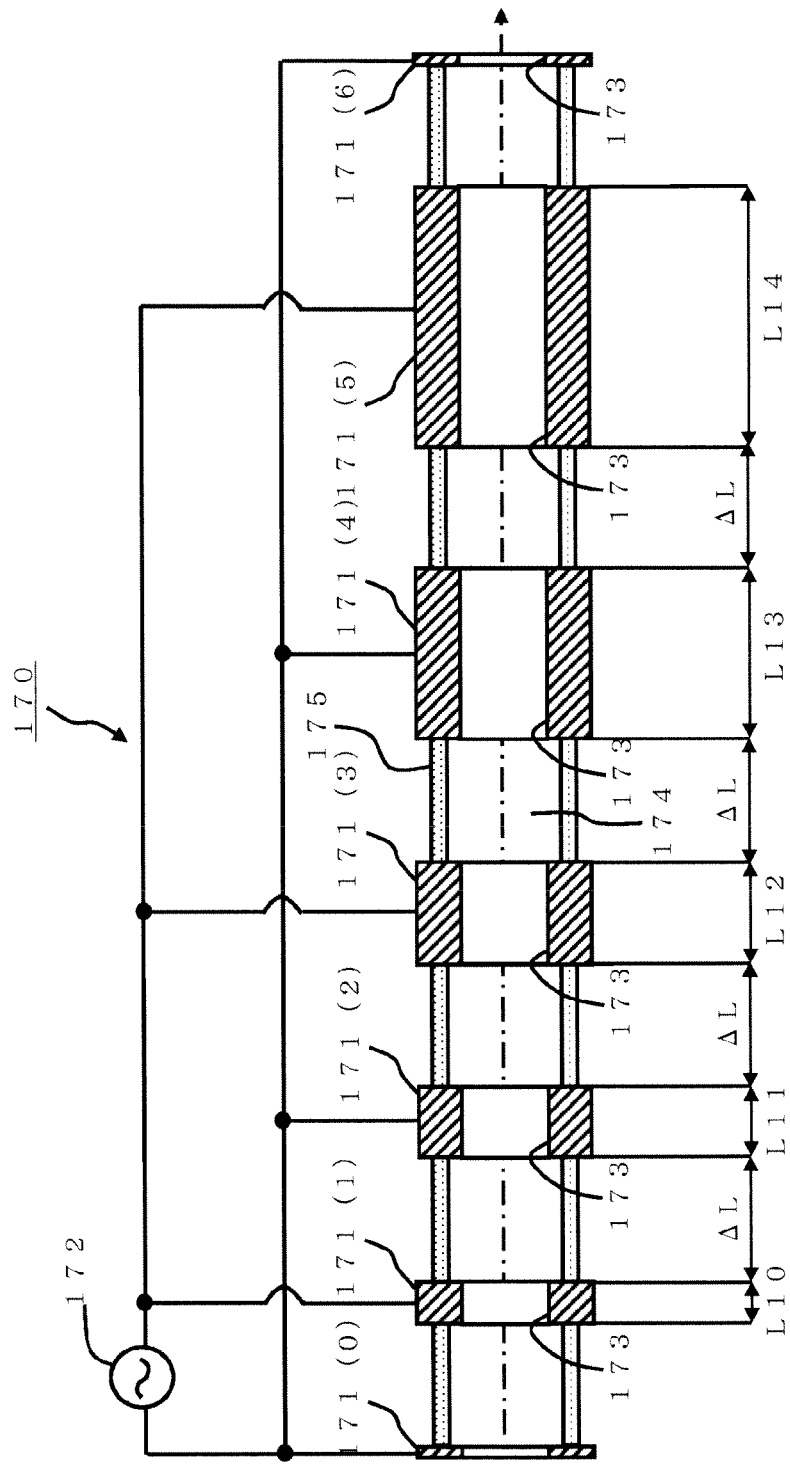
FIG. 31 is a cross-sectional view of the linear accelerating tube.

As shown in FIG. 31, the length, L10, of the first cylindrical electrode 171(1) disposed on the inlet side is set shortest. The length, L11, of the second cylindrical electrode 171(2) disposed adjacent to, and downstream of, the first cylindrical electrode 171(1) is set longer than L10 (L11>l10). The length, L12, of the third cylindrical electrode 171(3) disposed adjacent to, and downstream of, the second cylindrical electrode 171(2) is set longer than L11 (L12>l11).

Likewise, each of the length, L13, of the fourth cylindrical electrode 171(4) and the length, L14, of the fifth cylindrical electrode 171(5) is set longer than the length of another cylindrical electrode disposed adjacent thereto and upstream thereof.

The individual cylindrical electrodes 171(1) to 171(5) and the individual annular electrodes 171(0) and 171(6) are supported by a cylindrical support 175 having an electrical insulating property. A passage 174 including the individual holes 173 is formed in the support 175.

Every other electrodes of the electrodes 171(1) to 171(5), 171(0) and 171(6) are electrically connected together. The ionized target material 91 passing through the passage 174 can be accelerated by applying a high-frequency voltage to the electrodes 171(1) to 171(5), 171(0) and 171(6) from a high voltage source 172. See p 452-459 in the aforementioned publication for the detailed operational principle of the linear accelerating tube.

[Nineteenth Embodiment]

Figure 32:
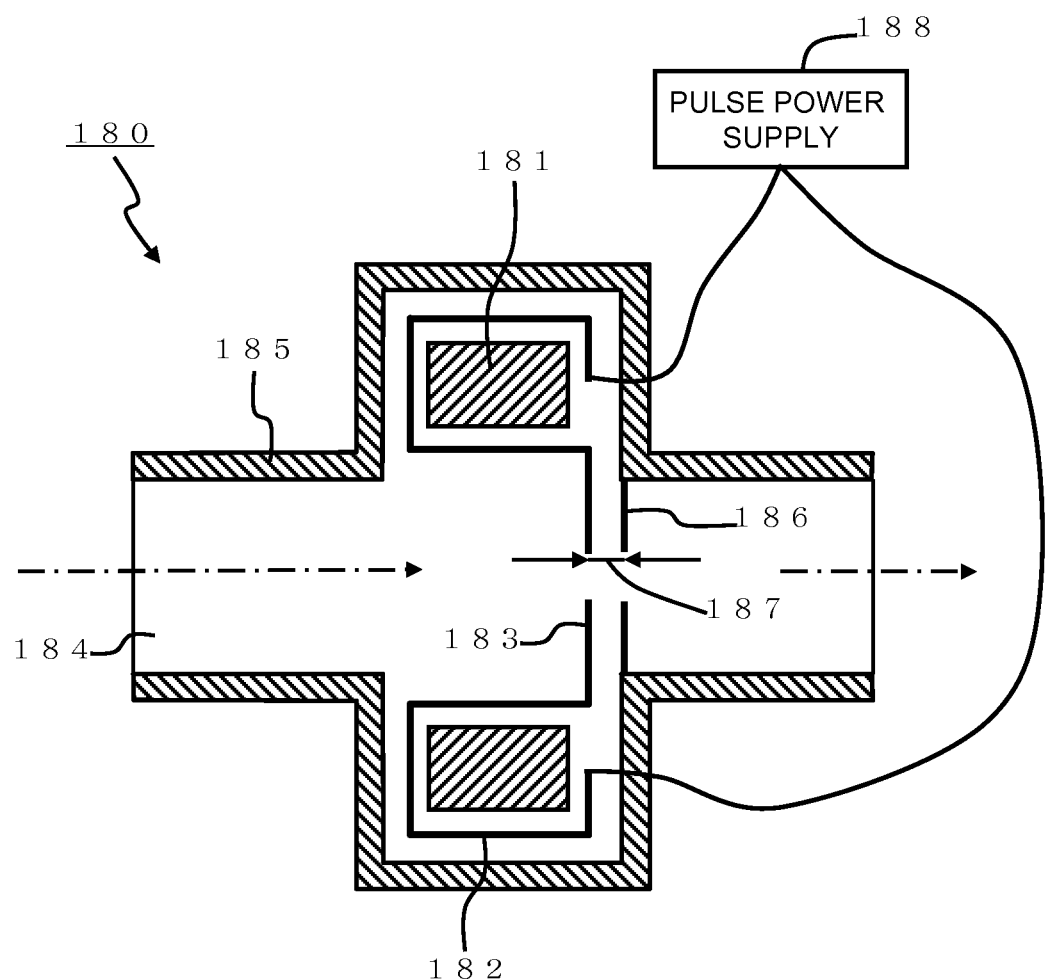
FIG. 32 is an explanatory diagram of an induction accelerating tube according to a nineteenth embodiment.

A nineteenth embodiment will be described referring to FIG. 32. According to the embodiment, an induction accelerating tube 180 is used as another specific example of the accelerating tube 110. FIG. 32 is a cross-sectional view of the induction accelerating tube 180.

The induction accelerating tube 180 includes a ferromagnetic core 181, a coil 182 wound around the core 181, a cylindrical support 185, a projection 186 projecting from the inner surface of the support 185, an end portion 183 of the coil 182, a passage 184 through which an ionized target material 91 passes, a gap 187 and a pulse power supply 188.

As a pulse current from the pulse power supply 188 is let to flow through the ferromagnetic core 181, a magnetic field is generated. A time-dependent change in the magnetic field induces an induction electric field in the gap 187 between the coil end portion 183 and the projection 186. When the ionized target material 91 passes through the induction electric field generated in the gap 187, the ionized target material 91 is accelerated. See p 283-313 in the aforementioned publication for the detailed operational principle of the induction accelerating tube 180.

[Twentieth Embodiment]

Figure 33:
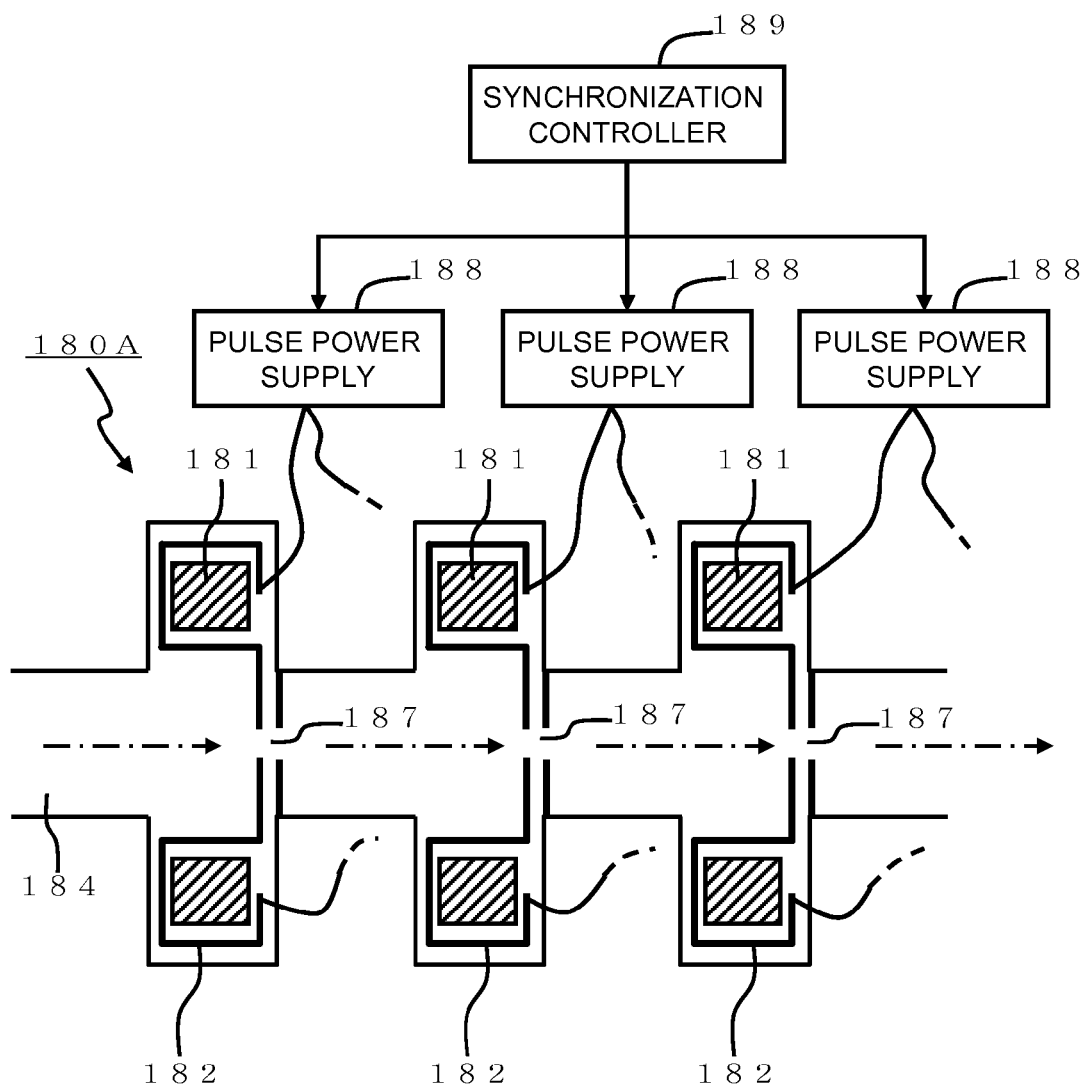
FIG. 33 is an explanatory diagram showing multiple stages of induction accelerating tubes according to a twentieth embodiment.

A twentieth embodiment will be described referring to FIG. 33. An induction accelerating tube 180A according to the embodiment has a plurality of acceleration gaps 187 disposed coaxially. According to the embodiment, a plurality of units each including the ferromagnetic core 181, the coil 182 and the gap 187 are disposed in a direction in which an ionized target material 91 passes. This can allow the ionized target material 91 to be accelerated by each gap 187, so that a faster ionized target material 91 can be obtained.

[Twenty-First Embodiment]

Figure 34:
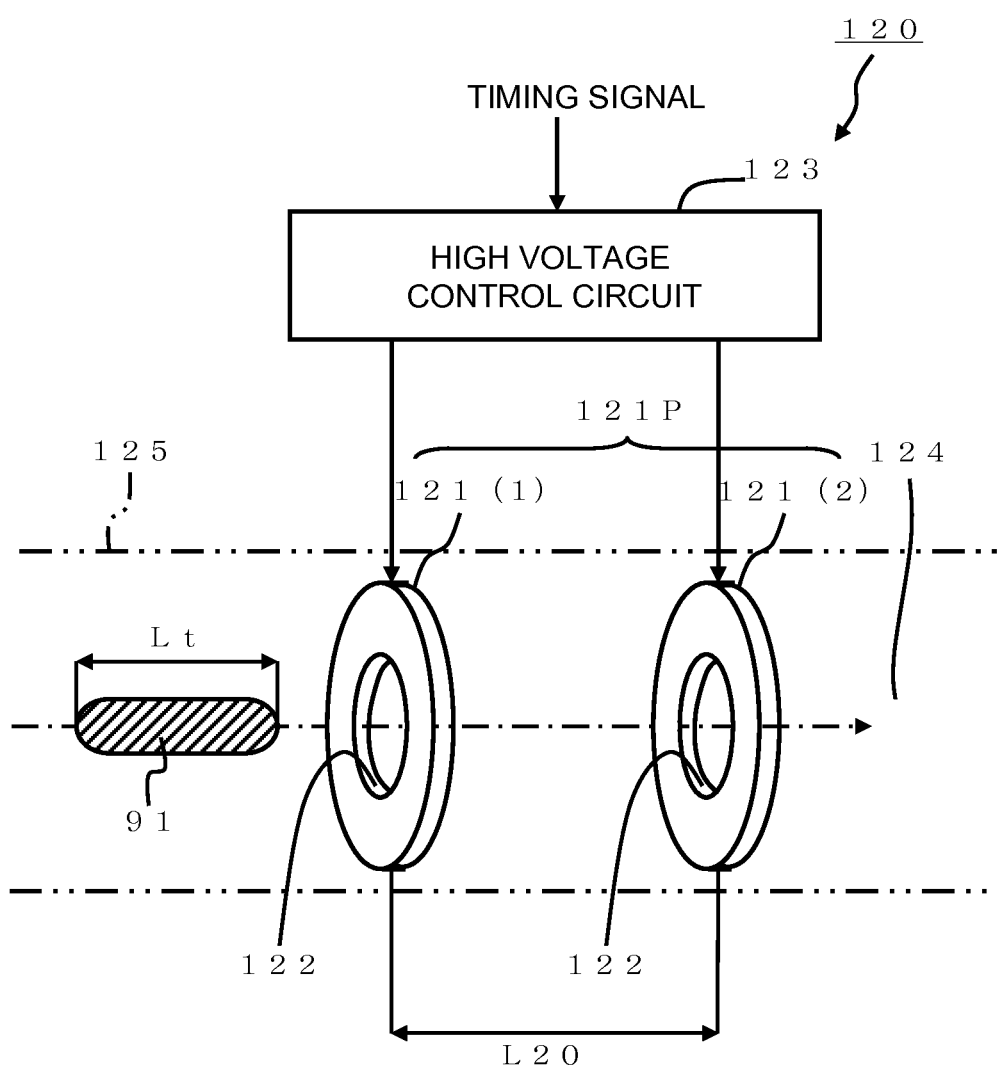
FIG. 34 is an explanatory diagram showing the configuration of a compression section according to a twenty-first embodiment.

A twenty-first embodiment will be described referring to FIGS. 34 to 36. A specific example of the compressor 120 (see FIG. 6) will be described in the descriptions of this embodiment and several embodiments to be discussed below. The compressor 120 according to the embodiment has two disk-shaped electrodes 121(1), 121(2), a high voltage control circuit 123, and a cylindrical support 125. The two disk-shaped electrodes 121(1), 121(2) form an electrode pair 121P.

A hole 122 through which an ionized target material 91 passes is formed in the center of each electrode 121(1), 121(2). A passage 124 including the individual holes 122 is formed in the support 125.

The high voltage control circuit 123 applies a pulsed voltage to the electrode pair 121P in synchronism with the passing of the ionized target material 91 through the electrode pair 121P. That is, the high voltage control circuit 123 applies the pulsed voltage, which changes in such a way that the potential of the electrode pair 121P is modulated to a desired value, to the electrode pair 121P at a predetermined timing. The timing of applying the pulsed voltage is determined by a timing signal.

A pulsed high voltage circuit having a fast switch can be used as the high voltage control circuit 123. Alternatively, the circuit which has the ferromagnetic core 181 and pulse power supply 188 as shown in FIG. 32 can be used as the high voltage control circuit 123. As a pulse current is let to flow through the ferromagnetic core 181, a magnetic field is generated, and a desired induction electric field induced by a time-dependent change in the magnetic field is generated at the electrode pair 121P.

In the following description, let Lt be the length of an uncompressed ionized target material 91 which enters the compressor 120, and the ionized target material 91 is assumed to be charged positively.

Figure 35:
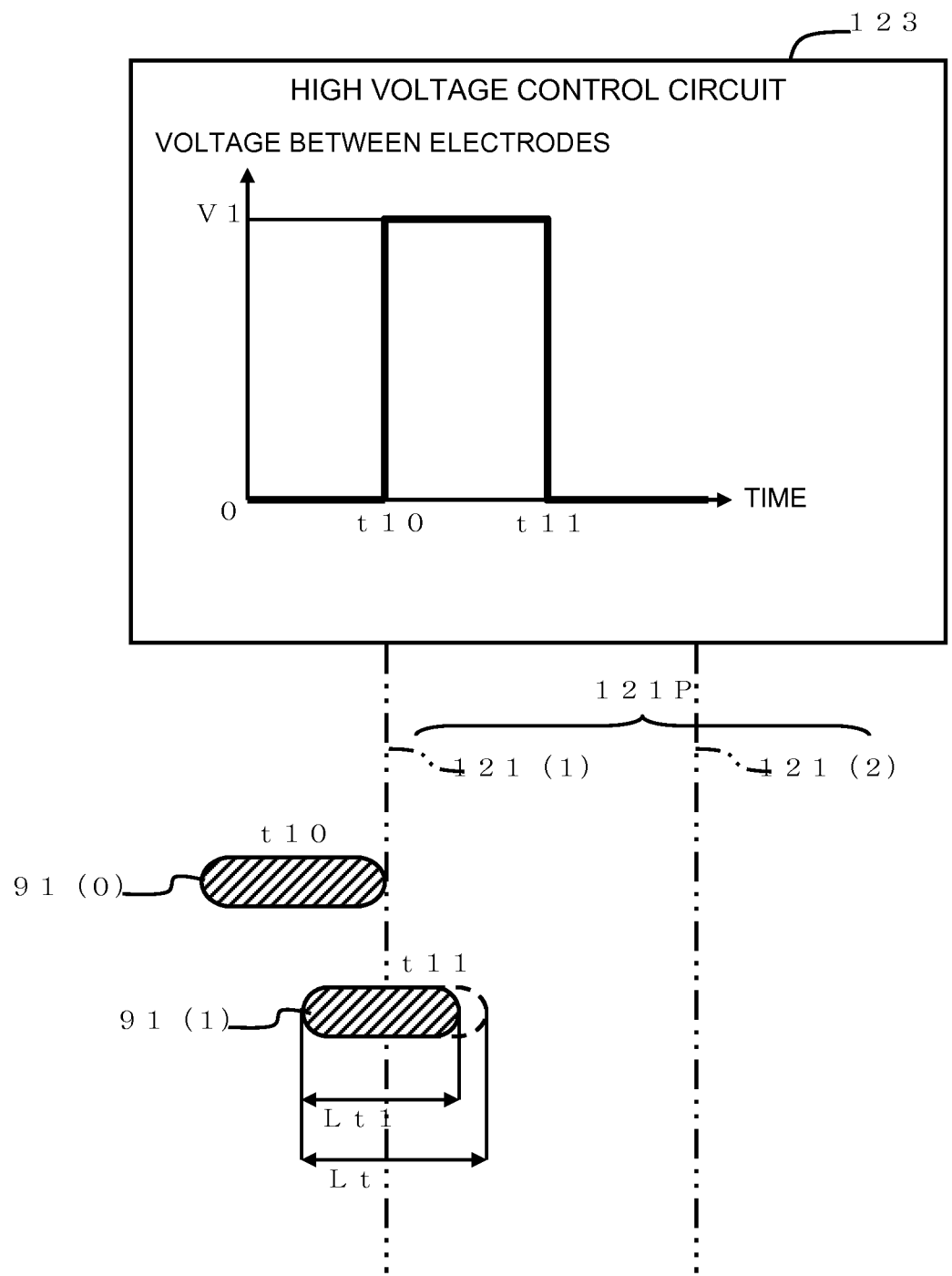
FIG. 35 is a diagram illustrating a timing of applying a voltage to a pair of electrodes.

FIG. 35 shows an example of a pulsed voltage to be applied to the electrode pair 121P. Here, let t10 be a time at which an uncompressed ionized target material 91(0) has reached the inlet side of the electrode pair 121P (inlet-side electrode 121(1)), and let t11 be a time at which the center portion of the ionized target material 91 will reach the inlet-side electrode 121(1). Reference numeral "91(1)" is given to a compressed ionized target material whose center portion has reached the inlet-side electrode 121(1).

The high voltage control circuit 123 operates in such a way that a rectangular wave as shown in FIG. 35. That is, the high voltage control circuit 123 applies the rectangular wave which rises at time t10 and falls at time t11 to the electrode pair 121P. This can allow the forward side of the ionized target material 91 in the traveling direction thereof to be compressed. Therefore, the length Lt in the traveling direction of the ionized target material 91 becomes a shorter Lt1 (Lt1<Lt).

Although one electrode pair 121P is illustrated in the embodiment, which is not restrictive, a plurality of electrode pairs 121P may be disposed linearly in the traveling direction of the ionized target material 91. In the case of the configuration, the high voltage control circuit 123 applies a predetermined high voltage pulse to each electrode pair 121P at the timing at which the ionized target material 91 reaches each electrode pair 121P.

Figure 36:
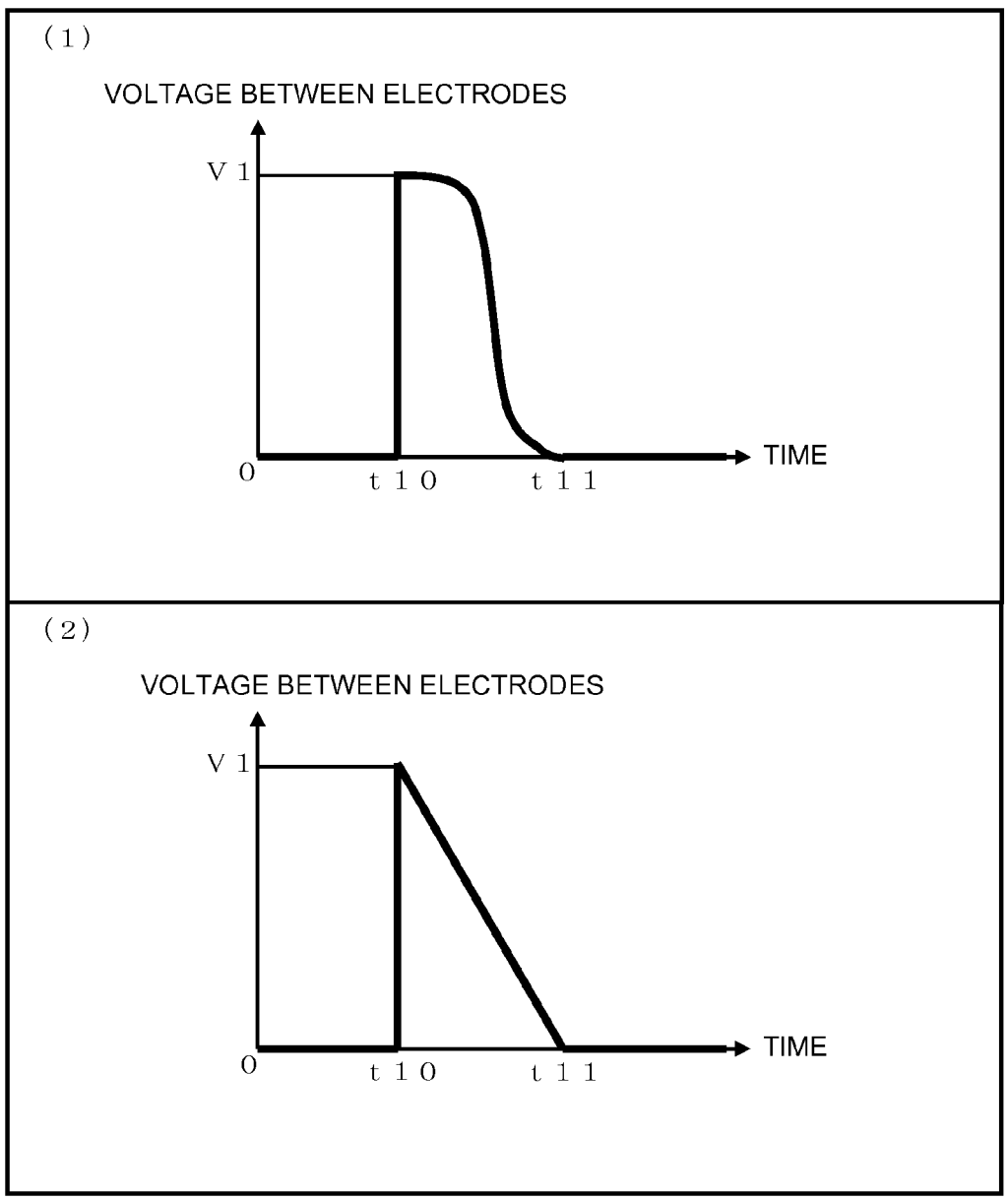
FIG. 36 is a diagram illustrating other timings of applying a voltage to a pair of electrodes.

FIG. 36 shows other examples of the high voltage pulse. A sinusoidal high voltage pulse may be used as shown in FIG. 36(1), or a triangular high voltage pulse may be used as shown in FIG. 36(2).

[Twenty-Second Embodiment]

Figure 37:
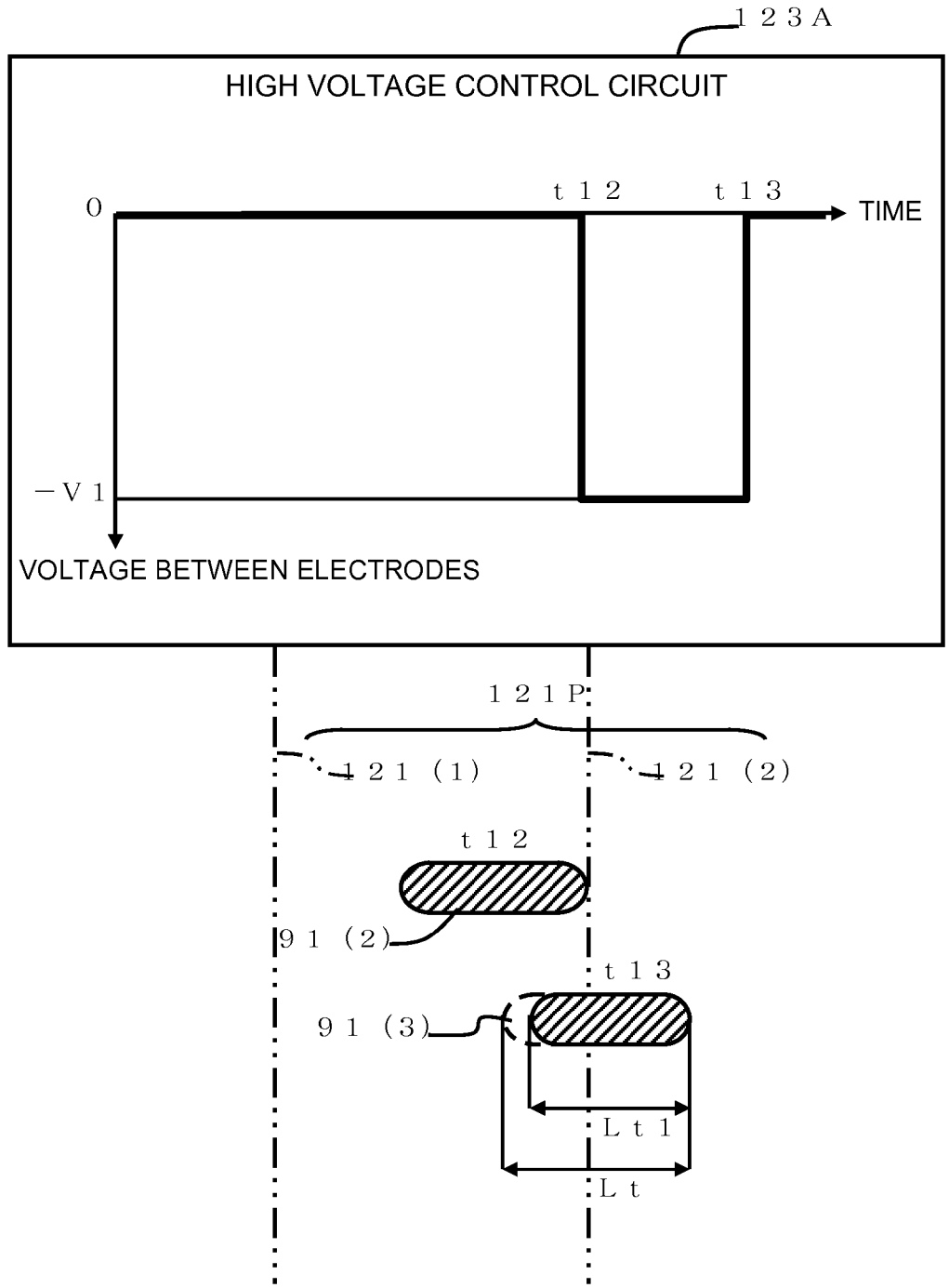
FIG. 37 is a diagram exemplarily showing the configuration of a compression section according to a twenty-second embodiment.

A twenty-second embodiment will be described referring to FIGS. 37 and 38. According to the embodiment, the backward side of an ionized target material 91 in the traveling direction thereof is compressed on the outlet side of the electrode pair 121P. FIG. 37 shows the general outline of a compression section according to the embodiment.

Let t12 be a time at which an uncompressed ionized target material 91(2) has reached the outlet side of the electrode pair 121P (outlet-side electrode 121(2)), and let t13 be a time at which the center portion of the ionized target material 91 will reach the outlet-side electrode 121(2). Reference numeral "91(3)" is given to a compressed ionized target material whose center portion has reached the outlet-side electrode 121(2).

A high voltage control circuit 123A applies a negative rectangular high voltage pulse to the electrode pair 121P according to the movement of the ionized target material 91. The rectangular wave rises at time t12 and falls at time t13. Accordingly, the backward side of the ionized target material 91 in the traveling direction thereof is compressed, thus shortening the length of the ionized target material 91.

Figure 38:
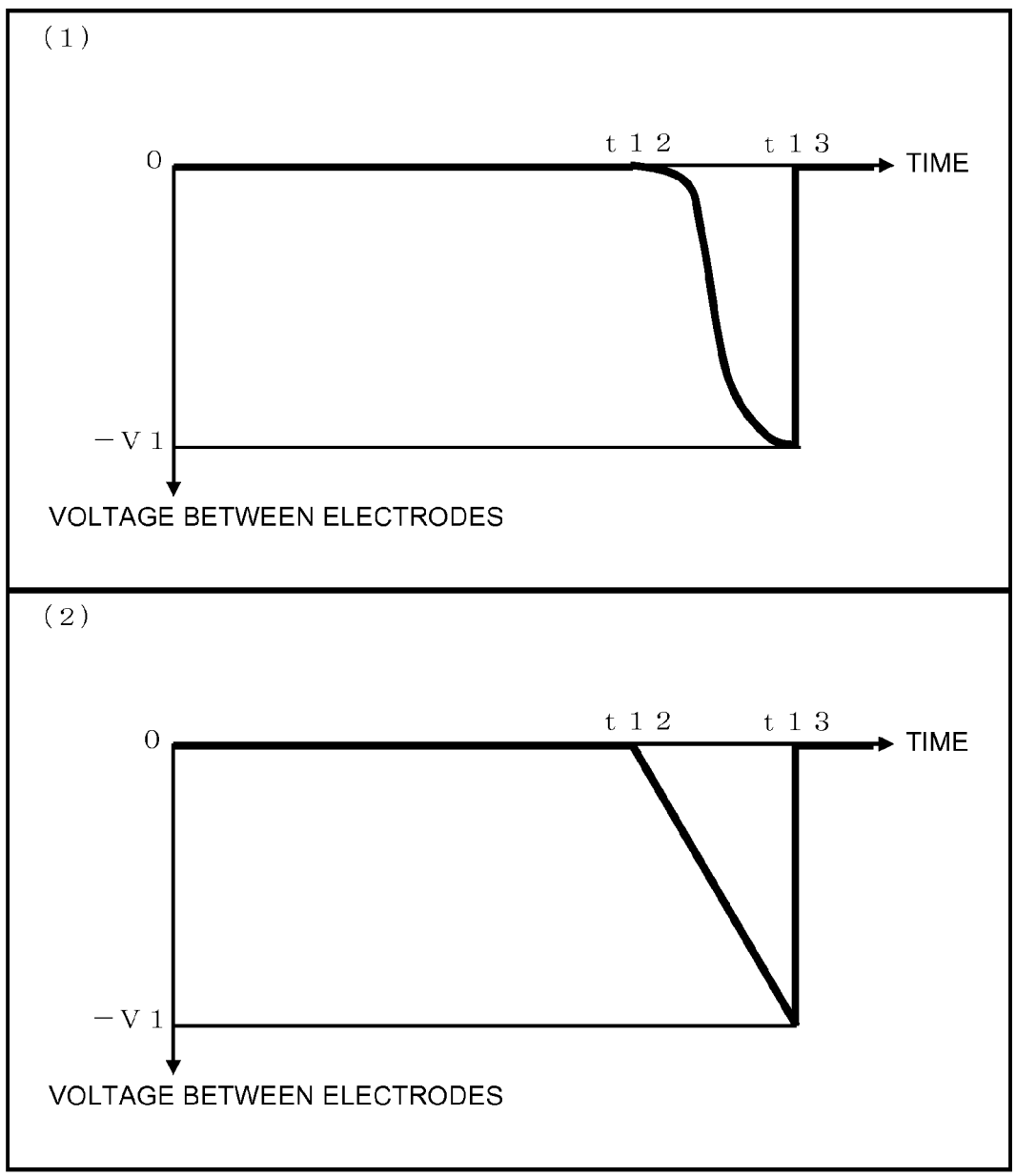
FIG. 38 is a diagram illustrating timings of applying a voltage to a pair of electrodes.

FIG. 38 shows other examples of the high voltage pulse to be applied to the electrode pair 121P. A sinusoidal high voltage pulse may be used as shown in FIG. 38(1), or a triangular high voltage pulse may be used as shown in FIG. 38(2).

A plurality of electrode pairs 121P may be disposed in the traveling direction of the ionized target material 91 to compress the ionized target material 91 multiple times as per the twenty-first embodiment.

[Twenty-Third Embodiment]

Figure 39:
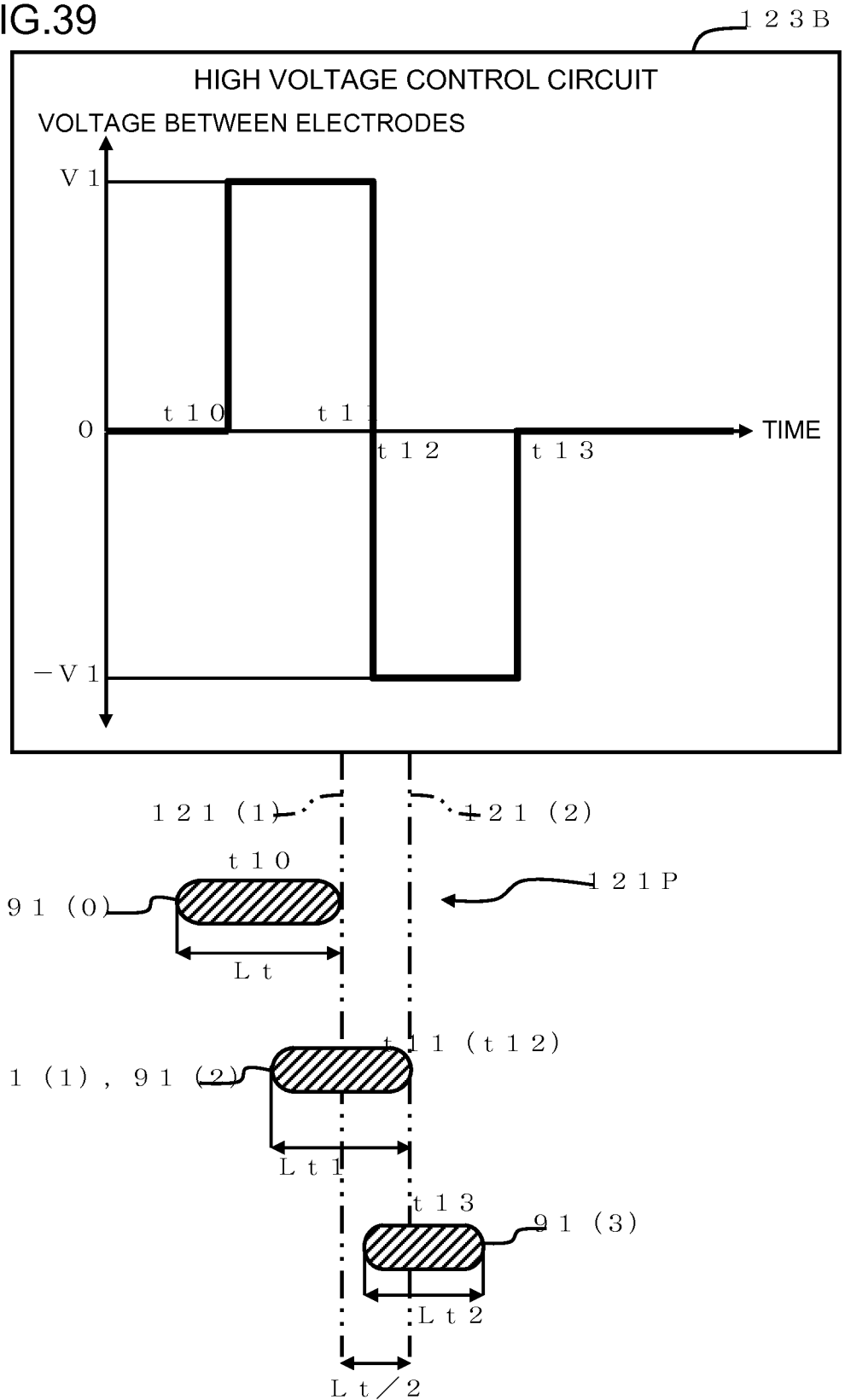
FIG. 39 is a diagram exemplarily showing the configuration of a compression section according to a twenty-third embodiment.

A twenty-third embodiment will be described referring to FIGS. 39 and 40. FIG. 39 shows the general outline of a compression section according to the embodiment. According to the embodiment, an ionized target material 91 is compressed on both the inlet side and the outlet side of the electrode pair 121P.

According to the embodiment, the distance between the inlet-side electrode 121(1) and the outlet-side electrode 121(2) is set to, for example, a half of a length Lt in the traveling direction of the uncompressed ionized target material 91 (distance between electrodes=Lt/2).

A high voltage control circuit 123B consecutively applies a positive rectangular high voltage pulse and a negative rectangular high voltage pulse to the electrode pair 121P according to the movement of the ionized target material 91. The high voltage control circuit 123B consecutively generates a first high voltage pulse of a positive potential and a second rectangular of a negative potential.

The first high voltage pulse rises at time t10 at which an ionized target material 91(0) reaches the inlet-side electrode 121(1), and falls at time t11 at which the center portion of an ionized target material 91(1) reaches the inlet-side electrode 121(1), as mentioned in the foregoing description of the twenty-first embodiment.

The second high voltage pulse rises at time t12 at which an ionized target material 91(2) reaches the outlet-side electrode 121(2), and falls at time t13 at which the center portion of an ionized target material 91(3) reaches the outlet-side electrode 121(2), as mentioned in the foregoing description of the twenty-second embodiment.

Because the distance between the electrodes is set to a half of the length Lt of the ionized target material 91, the time t11 at which the center portion of the ionized target material 91 reaches the inlet-side electrode 121(1) is substantially equal to the time t12 at which the leading portion of the ionized target material 91 reaches the outlet-side electrode 121(2).

The length of the uncompressed ionized target material 91(0) in the traveling direction is Lt first. When a half of the ionized target material 91(1) passes the inlet-side electrode 121(1), the ionized target material 91(1) is compressed, so that the length becomes Lt1 (Lt1<Lt).

At this time, the leading portion of the ionized target material 91(2) (which is also the ionized target material 91(1)) has reached the outlet-side electrode 121(2). When an ionized target material 91(3) passes the outlet-side electrode 121(2), its length is shorted to Lt2 from Lt1 (Lt2<Lt1).

Figure 40:
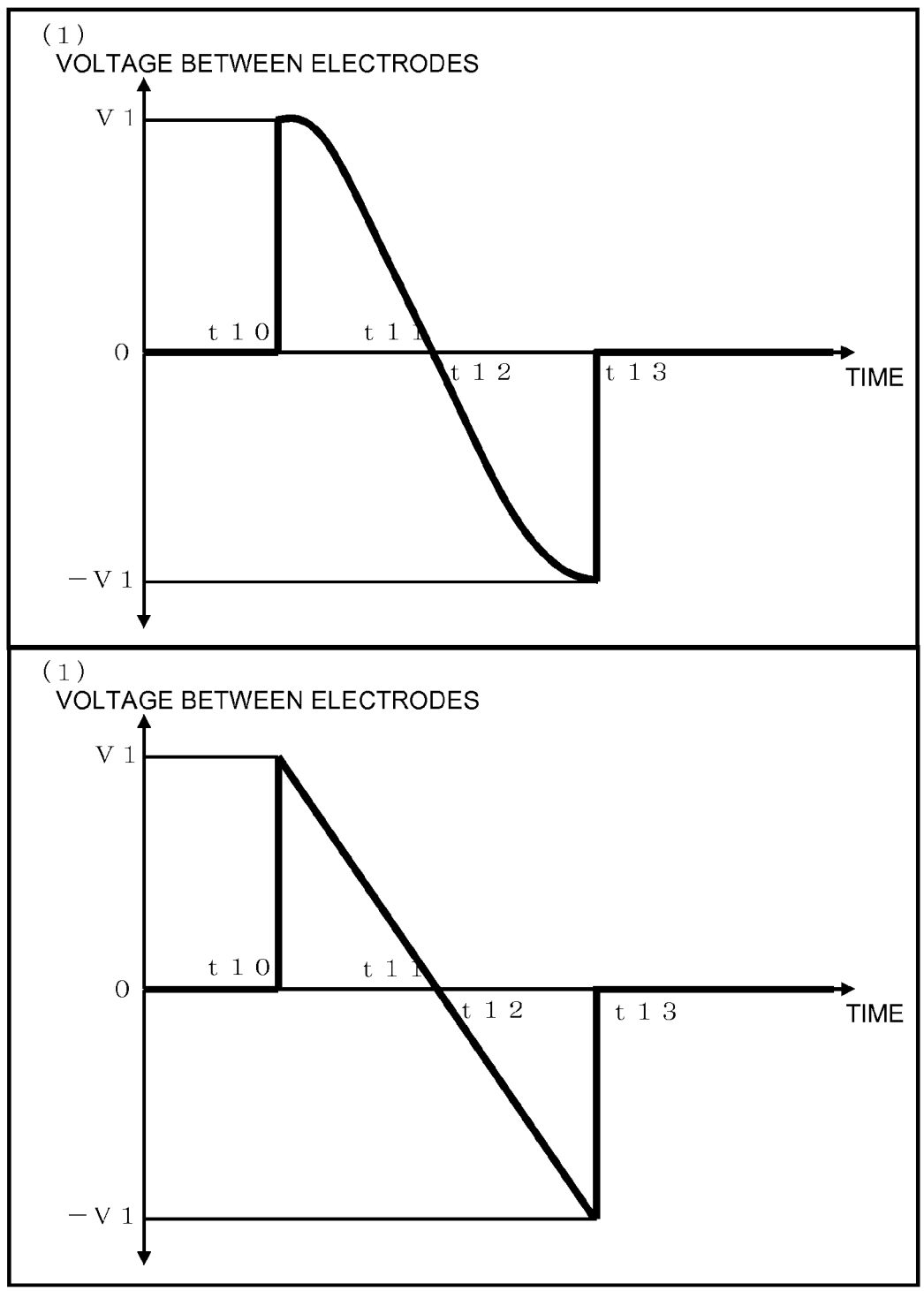
FIG. 40 is a diagram illustrating timings of applying a voltage to a pair of electrodes.

FIG. 40 shows other examples of the high voltage pulse. Two sinusoidal high voltage pulses of different polarities may be consecutively applied to the electrode pair 121P as shown in FIG. 40(1). Two triangular high voltage pulses of different polarities may be consecutively applied to the electrode pair 121P as shown in FIG. 40(2).

According to the embodiment with this configuration, the forward side and backward side of the ionized target material 91 can be consecutively compressed by a single electrode pair. Further, because the distance between the electrodes is set short, the compression section can be made compact.

[Twenty-Fourth Embodiment]

Figure 41:
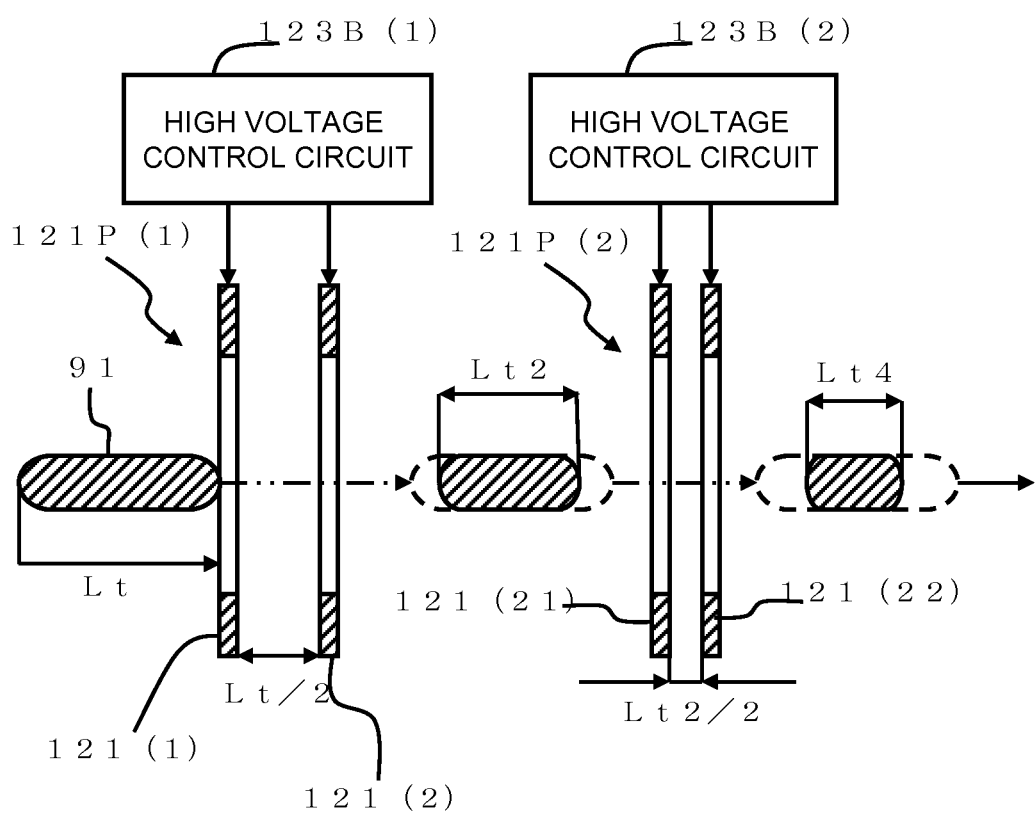
FIG. 41 is a diagram exemplarily showing a compression section having plural pairs of electrodes according to a twenty-fourth embodiment.

A twenty-fourth embodiment will be described referring to FIG. 41. According to the embodiment, a plurality of electrode pairs 121P each discussed in the foregoing description of the twenty-third embodiment are disposed in the traveling direction of an ionized target material 91. According to the embodiment, a first electrode pair 121P(1) and a second electrode pair 121P(2) are used.

The first electrode pair 121P(1) has an inlet-side electrode 121(1) and an outlet-side electrode 121(2). The distance between the electrode 121(1) and the electrode 121(2) is set to Lt/2.

A first high voltage control circuit 123B applies a plurality of consecutive high voltage pulses of different polarities as shown in FIG. 39 or FIG. 40 to the first electrode pair 121P(1). As mentioned above, the length of the ionized target material 91 in the traveling direction is compressed to Lt1 from Lt by the inlet-side electrode 121(1), and the length of the ionized target material 91 is further compressed to Lt2 from Lt1 by the outlet-side electrode 121(2).

The second electrode pair 121P(1), which is provided downstream of the first electrode pair 121P(1), has an inlet-side electrode 121(21) and an outlet-side electrode 121(22). The distance between the electrode 121(21) and the electrode 121(22) is set to a half (=Lt2/2) of the length of the ionized target material 91 after passing the first electrode pair 121P(1).

A second high voltage control circuit 123C likewise applies a plurality of consecutive high voltage pulses of different polarities as shown in FIG. 39 or FIG. 40 to the second electrode pair 121P(2). The length of the ionized target material 91 in the traveling direction is compressed to Lt3 (not shown) from Lt2 by the inlet-side electrode 121(21). Following the compression, the length of the ionized target material 91 is compressed to Lt4 from Lt3 by the outlet-side electrode 121(22).

According to the embodiment, as apparent from the above, a plurality of electrode pairs 121P(1) and 121P(2) to which high voltage pulses of different polarities are to be applied are disposed along the traveling direction of the ionized target material 91, and further the distance between the electrodes of each electrode pair 121P(1), 121P(2) is set to the half (or equal to or less than the half) of the length of the ionized target material 91 to be input to each electrode pair 121P(1), 121P(2). Therefore, the ionized target material 91 can be compressed further.

[Twenty-Fifth Embodiment]

Figure 42:
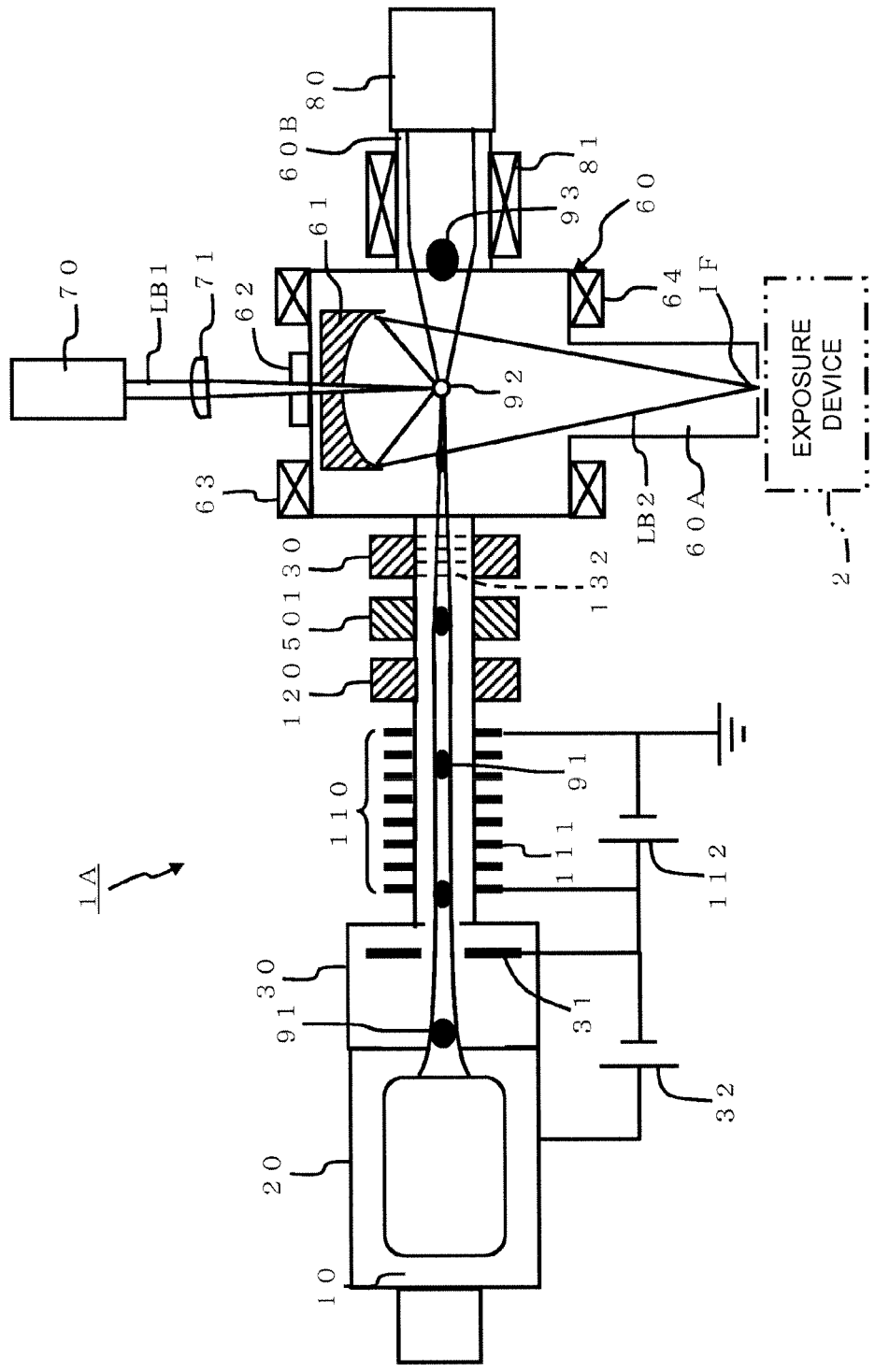
FIG. 42 is a diagram showing the general configuration of an EUV light source device according to a twenty-fifth embodiment.
Figure 43:
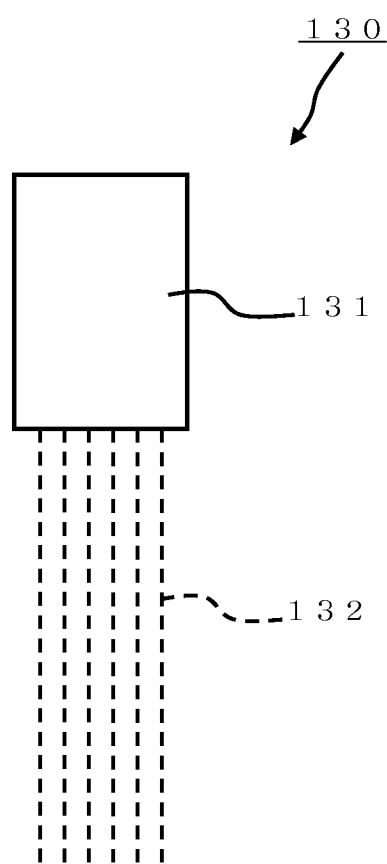
FIG. 43 is a diagram exemplarily showing an neutralizer.
Figure 44:
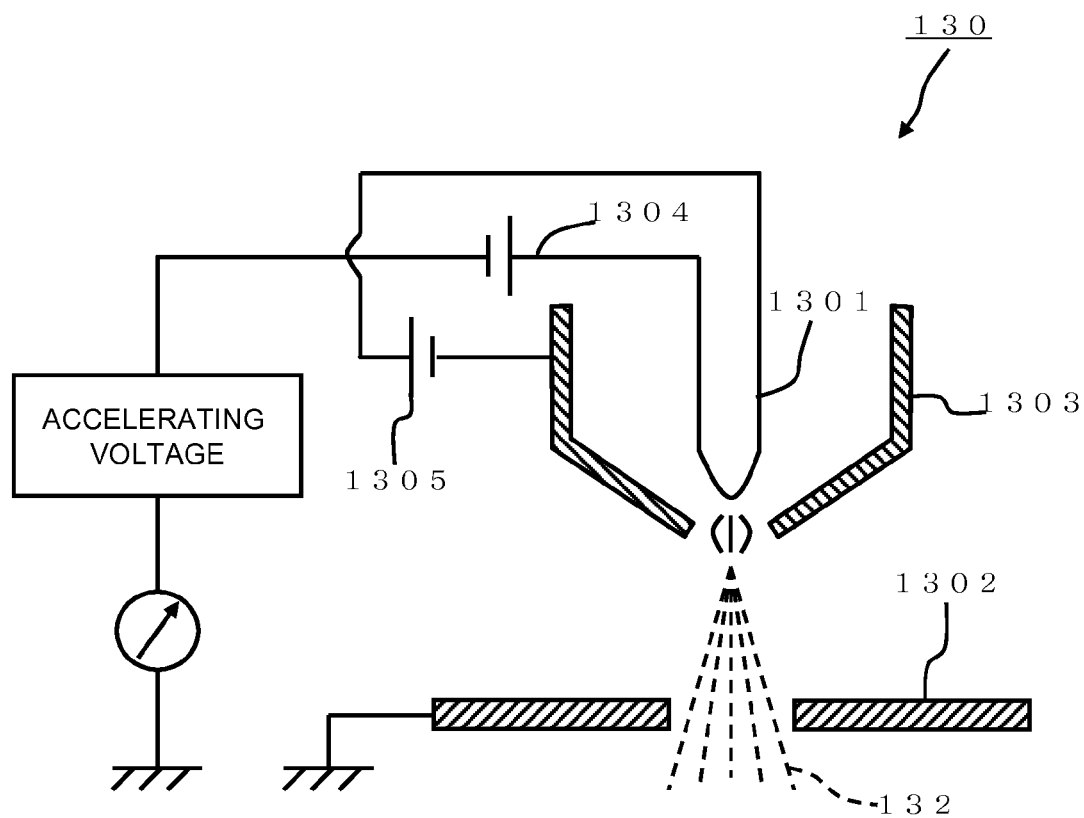
FIG. 44 is a circuit diagram showing a specific example of the neutralizer.

A twenty-fifth embodiment will be described referring to FIGS. 42 to 44. In the description of the embodiment, a specific example of the neutralizer 130 will be described. FIG. 42 is a general configurational diagram showing how an electron beam 132 is irradiated on an ionized target material 91 by the neutralizer 130. FIG. 43 is an exemplary diagram of an electron gun 131, and FIG. 44 is a circuit diagram of a thermal emission electron gun.

As shown in FIG. 43, the neutralizer 130 has the electron gun 131 which emits the electron beam 132. As shown in FIG. 44, the neutralizer 130 can be configured as a thermal emission electron gun.

The thermal emission electron gun 130 has a cathode 1301 configured as a tungsten filament or the like, an anode 1302, a Wehnelt electrode 1303, a filament circuit 1304, and a bias circuit 1305.

A predetermined negative voltage (filament voltage) is applied to the cathode 1301 by the filament circuit 1304. A negative voltage (bias voltage) lower than the filament voltage is applied to the Wehnelt electrode 1303 by the bias circuit 1305.

As the cathode 1301 is heated, electrons are emitted. The emitted electrons are converged to a predetermined point by an electric field generated by the Wehnelt electrode 1303, and are accelerated toward the anode 1302. As a result, the electron beam 132 is generated.

[Twenty-Sixth Embodiment]

Figure 45:
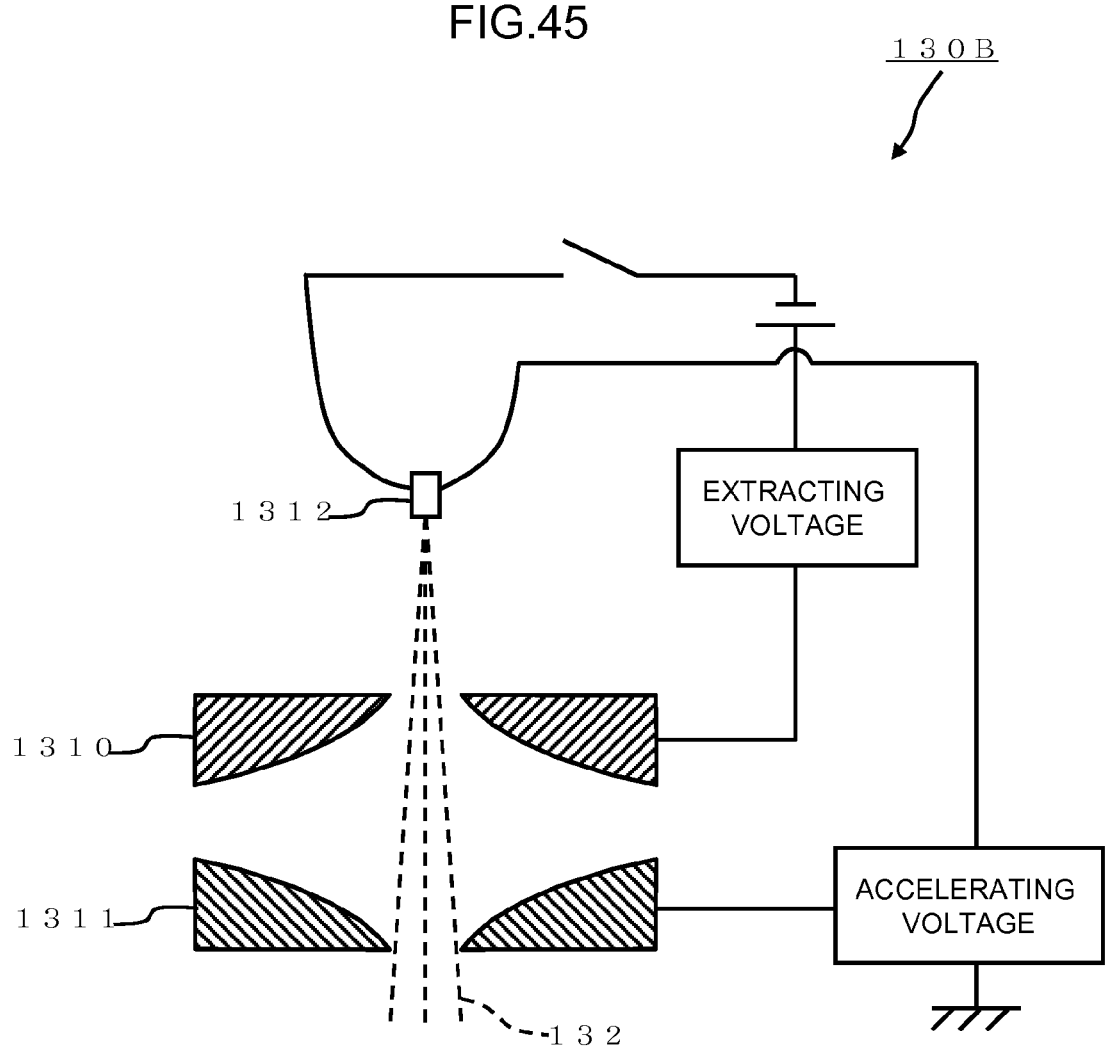
FIG. 45 is a circuit diagram showing another specific example of the neutralizer according to a twenty-sixth embodiment.

A twenty-sixth embodiment will be described referring to FIG. 45. According to the embodiment, a field emission electron gun 130B is used as the neutralizer 130. The field emission electron gun 130A includes, for example, a first anode 1310, a second anode 1311, and an emitter 1312.

An extracting voltage is applied between the first anode 1310 and the emitter 1312. The extracting voltage is the voltage to extract electrons from the emitter 1312. This extracting voltage forms a strong electric field at the distal end of the emitter 1312, so that electrons are emitted from the emitter 1312.

An accelerating voltage is applied between the second anode 1311 and the emitter 1312. The accelerating voltage is the voltage to accelerate the electrons emitted from the emitter 1312. As the electrons are accelerated, they become the electron beam 132.

The invention is not limited to the foregoing embodiments. It should be apparent to those skilled in the art that various additions, modifications and the like can be implemented within the spirit or scope of the invention. In addition, configurations which are realized by combining the foregoing embodiments as needed are also encompassed within the scope of the invention.

What is claimed is:

1. An extreme ultraviolet light (EUV) source device for generating EUV light, comprising:
   a chamber;
   a target material supply configured to supply a target material to the chamber;
   a first laser configured to irradiate the target material in the chamber with a first laser beam to ionize the target material;
   a second laser configured to irradiate the ionized target material, which moves in the chamber after the ionization, with a second laser beam to turn the ionized target material into plasma from which the EUV light is emitted;
   a first collecting device configured to collect an unionized target material in the chamber, and
   a first heater configured to heat the unionized target material deposited on the first collecting device.

2. The EUV light source device according to claim 1, wherein the second laser is a carbon dioxide gas laser.

3. The EUV light source device according to claim 1, further comprising a magnetic field generator configured to generate a magnetic field in the chamber to trap a target material left in the chamber after the plasma is generated.

4. The EUV light source device according to claim 3, further comprising:
   a second collecting device configured to collect the trapped target material; and
   a second heater configured to heat the trapped target material deposited on the second collecting device.

5. The EUV light source device according to claim 1, further comprising a electron beam device configured to irradiate the target material with an electron beam before the target material is irradiated with the first laser beam.

6. An extreme ultraviolet light (EUV) source device for generating EUV light, comprising:
   a chamber;
   a target material supply configured to supply a target material to the chamber;
   a first laser configured to irradiate the target material in the chamber with a first laser beam;
   a second laser configured to irradiate the target material, which moves after the irradiation with the first laser beam, with a second laser beam to turn the target material into plasma from which the EUV light is emitted;
   a magnetic field generator configured to generate a magnetic field in the chamber to trap a target material left in the chamber after the plasma is generated;
   a first collecting device configured to collect the trapped target material; and
   a first heater configured to heat the trapped target material deposited on the first collecting device.

7. The EUV light source device according to claim 6, wherein the second laser is a carbon dioxide gas laser.

8. The EUV light source device according to claim 6, further comprising:
   a second collecting device configured to collect an unionized target material in the chamber before the irradiation with the second laser beam; and
   a second heater configured to heat the unionized target material deposited on the second collecting device.

9. The EUV light source device according to claim 6, further comprising a electron beam device configured to irradiate the target material with an electron beam before the target material is irradiated with the first laser beam.

* * * * *